United States Patent
Esaka et al.

(10) Patent No.: US 10,746,821 B2
(45) Date of Patent: Aug. 18, 2020

(54) CURRENT SENSOR

(71) Applicant: DENSO CORPORATION, Kariya, Aichi-pref. (JP)

(72) Inventors: Takuma Esaka, Kariya (JP); Kohsuke Nomura, Kariya (JP); Ryosuke Sakai, Kariya (JP); Tatsuaki Sugito, Kariya (JP)

(73) Assignee: DENSO CORPORATION, Kariya (JP)

( * ) Notice: Subject to any disclaimer, the term of this patent is extended or adjusted under 35 U.S.C. 154(b) by 142 days.

(21) Appl. No.: 16/088,470

(22) PCT Filed: Jun. 5, 2017

(86) PCT No.: PCT/JP2017/020740
§ 371 (c)(1),
(2) Date: Sep. 26, 2018

(87) PCT Pub. No.: WO2017/217267
PCT Pub. Date: Dec. 21, 2017

(65) Prior Publication Data
US 2019/0293733 A1    Sep. 26, 2019

(30) Foreign Application Priority Data

Jun. 15, 2016 (JP) .................... 2016-119135
Nov. 21, 2016 (JP) .................... 2016-226096
Dec. 12, 2016 (JP) .................... 2016-240590

(51) Int. Cl.
*G01R 33/09* (2006.01)
*G01R 19/25* (2006.01)

(52) U.S. Cl.
CPC ............ *G01R 33/091* (2013.01); *G01R 19/25* (2013.01)

(58) Field of Classification Search
CPC ..... G01R 19/25; G01R 33/098; G01R 33/096
See application file for complete search history.

(56) References Cited

U.S. PATENT DOCUMENTS

2013/0200982 A1*  8/2013  Adachi ................ H01F 27/365
                                                    336/84 R
2013/0335076 A1* 12/2013  Sakamoto ............. G01R 19/00
                                                    324/244

(Continued)

FOREIGN PATENT DOCUMENTS

JP      H05-327263 A    12/1993
JP      2004-221463 A    8/2004

(Continued)

*Primary Examiner* — Alvaro E Fortich
(74) *Attorney, Agent, or Firm* — Posz Law Group, PLC

(57) ABSTRACT

A current sensor includes a magnetic detection element that senses a magnetic flux generated from a current path to perform electromagnetic conversion, and at least two magnetic shields that are arranged around the magnetic detection element and shield an external magnetic flux affecting the magnetic detection element. The at least two magnetic shields include a first magnetic shield and a second magnetic shield facing each other across the magnetic detection element and the current path. At least one of the first magnetic shield and the second magnetic shield includes at least two base portions and a coupling portion coupling the at least two base portions. The at least one of the first magnetic shield and the second magnetic field has a recess recessed from a periphery in a surface facing the other of the first magnetic shield and the second magnetic shield.

30 Claims, 31 Drawing Sheets

(56) References Cited

U.S. PATENT DOCUMENTS

| | | | |
|---|---|---|---|
| 2014/0111196 A1* | 4/2014 | Sakai | G01R 15/205 324/252 |
| 2016/0258985 A1 | 9/2016 | Nomura et al. | |
| 2017/0082659 A1 | 3/2017 | Harada | |
| 2018/0031613 A1 | 2/2018 | Nakayama | |

FOREIGN PATENT DOCUMENTS

| | | | |
|---|---|---|---|
| JP | 2010-002277 A | 1/2010 |
| JP | 2011-080970 A | 4/2011 |
| JP | 2013-117447 A | 6/2013 |
| JP | 2014-134458 A | 7/2014 |
| JP | 2017-072467 A | 4/2017 |

* cited by examiner

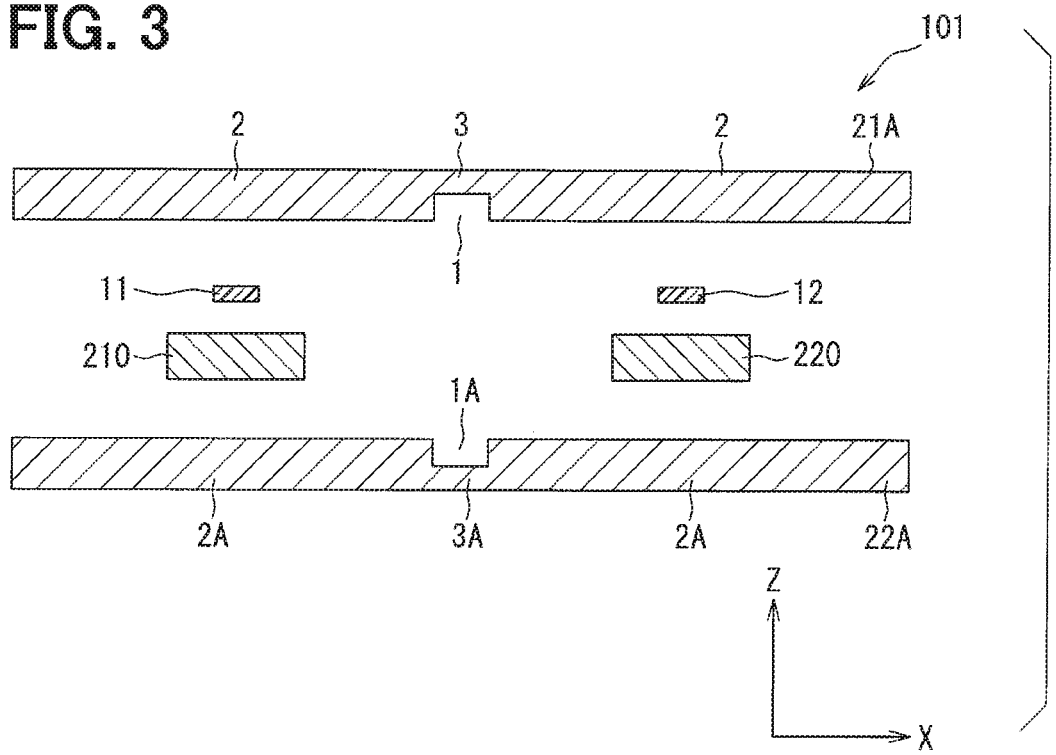
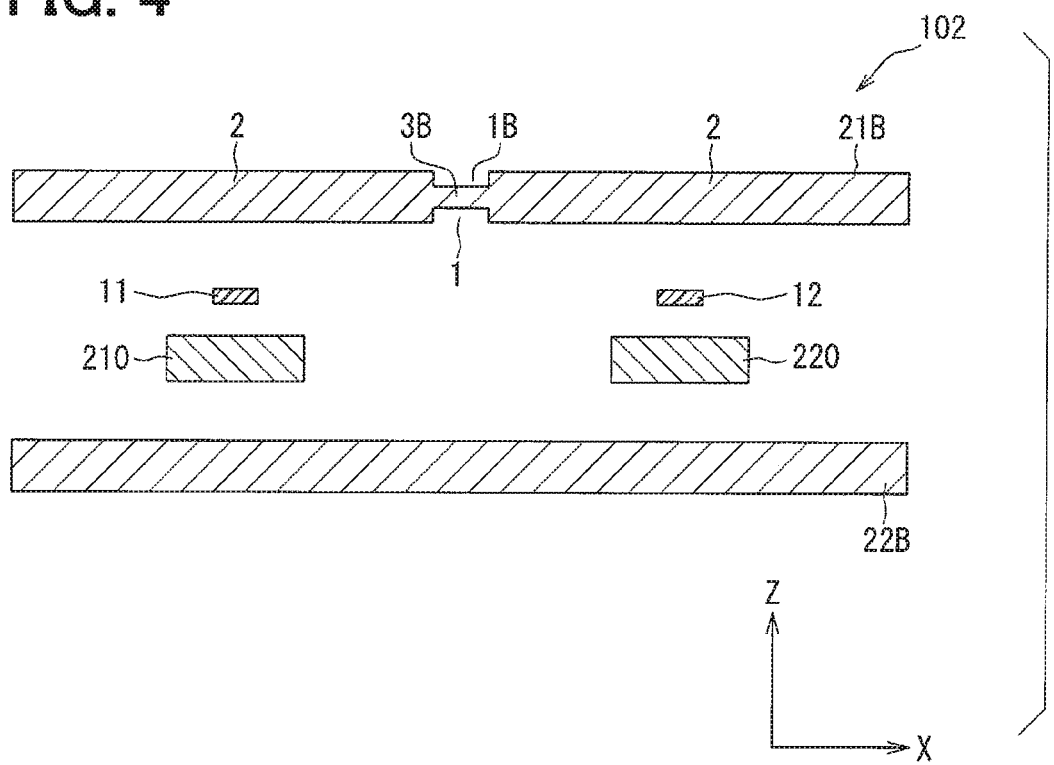

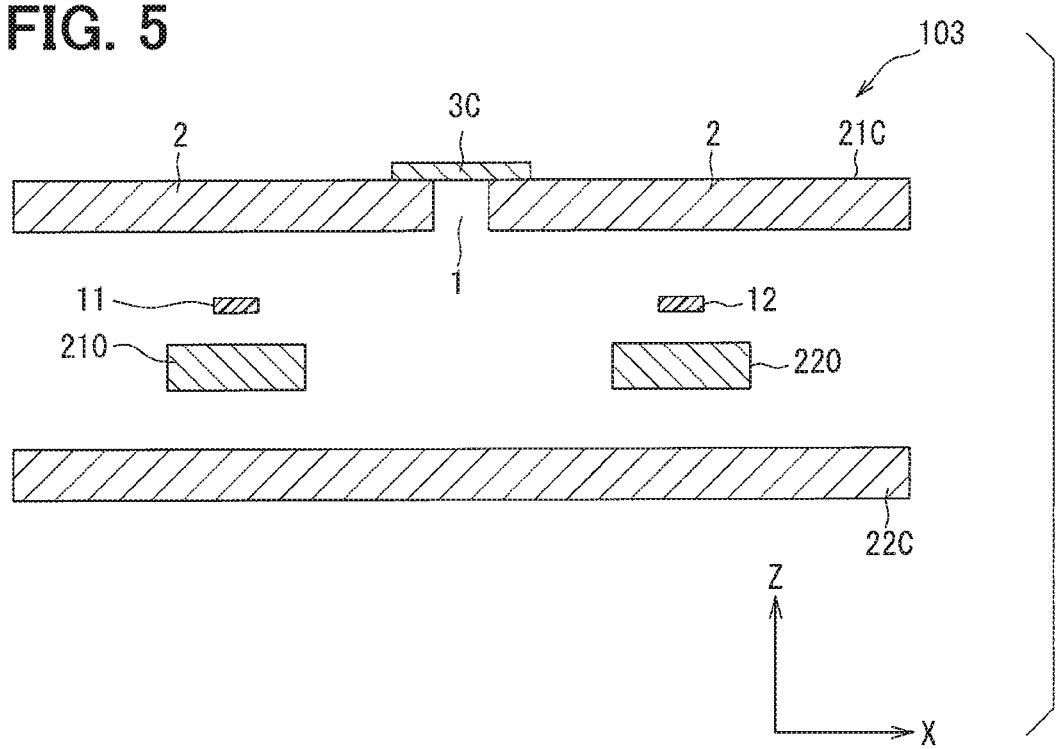
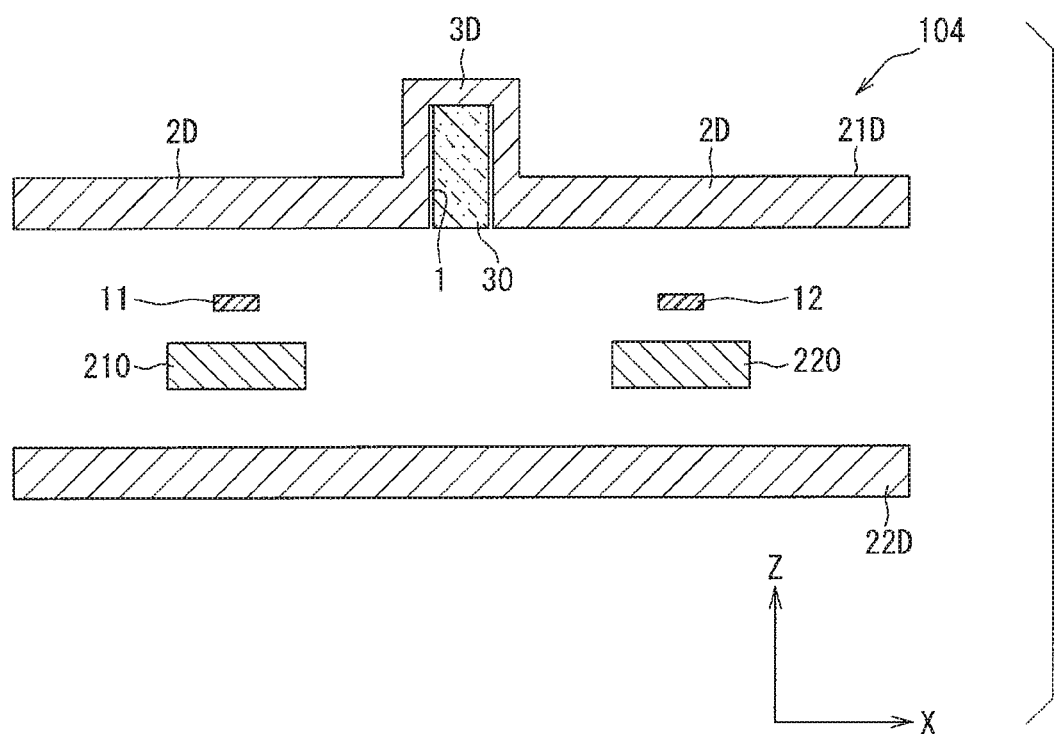

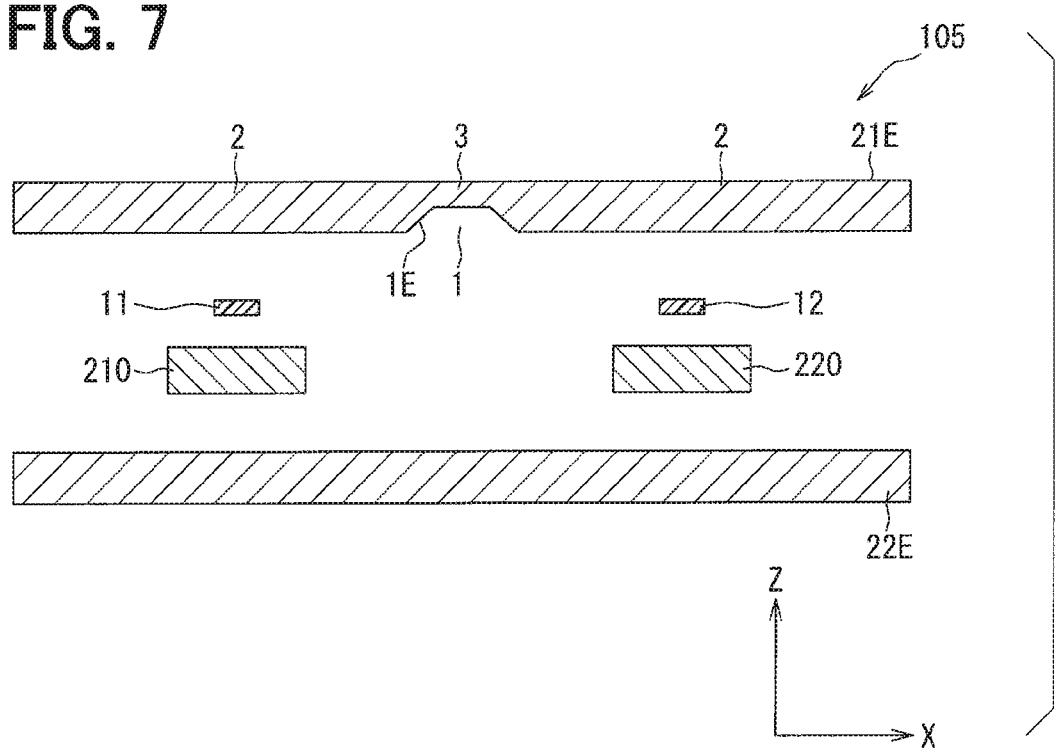
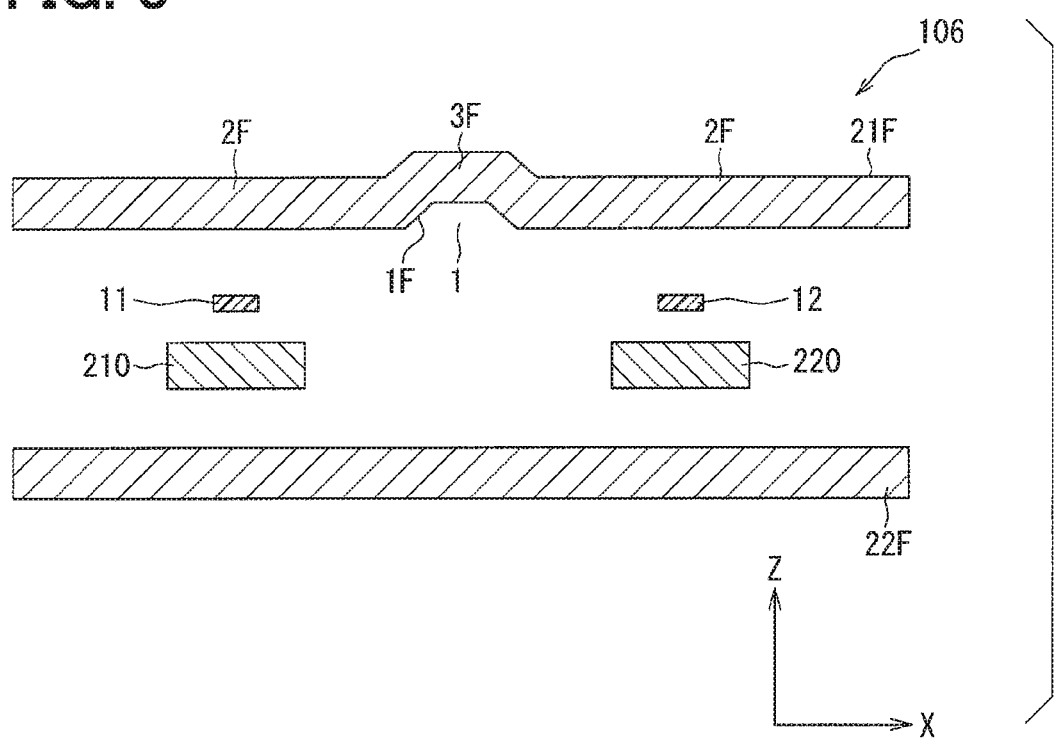

FIG. 17
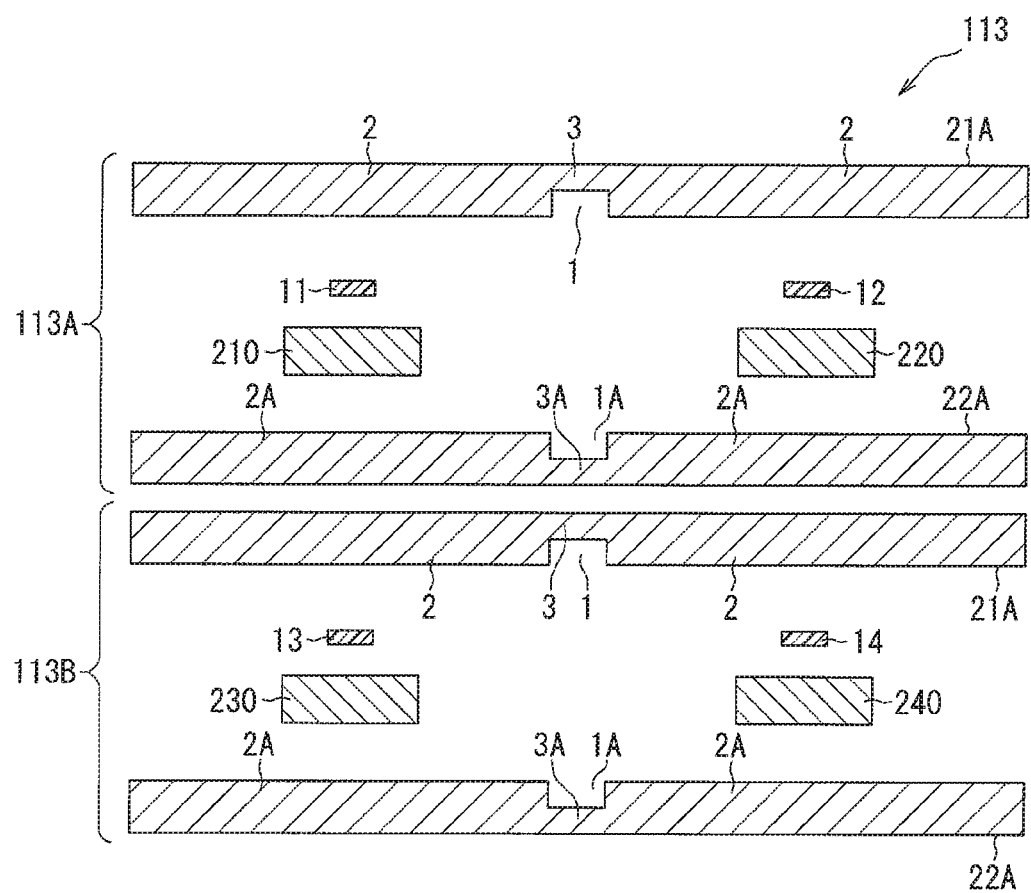
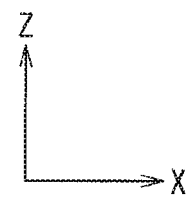

FIG. 18
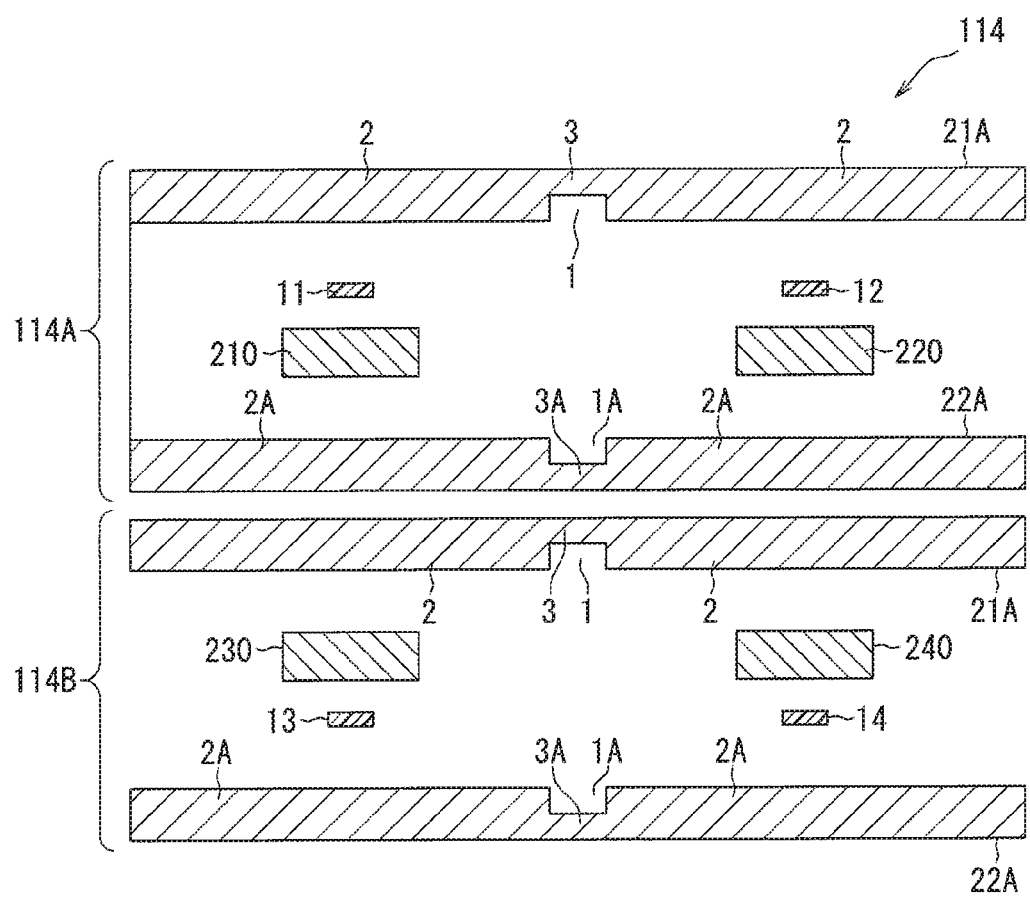
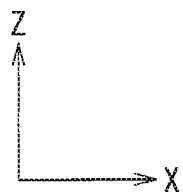

FIG. 20
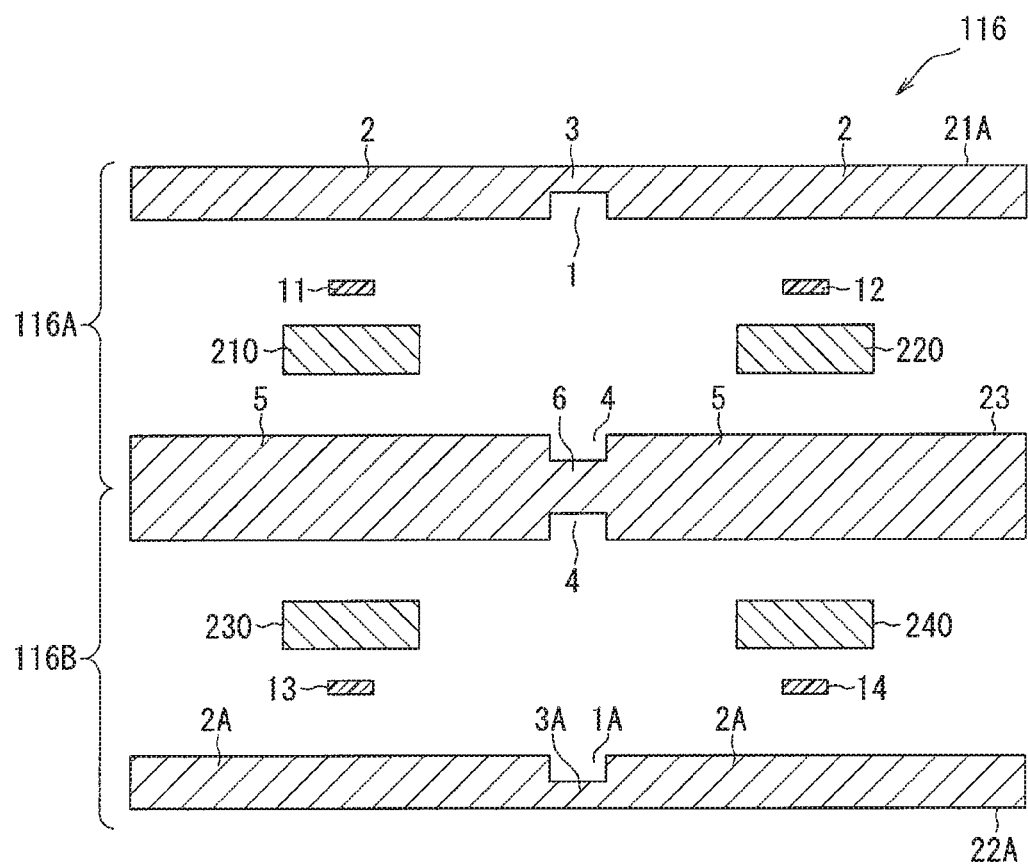
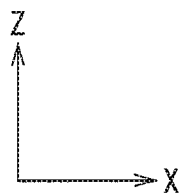

CURRENT SENSOR

CROSS REFERENCE TO RELATED APPLICATIONS

This application is a U.S. national phase of International Application No. PCT/JP2017/020740 filed on Jun. 5, 2017 and is based on Japanese Patent Application No. 2016-119135 filed on Jun. 15, 2016, Japanese Patent Application No. 2016-226096 filed on Nov. 21, 2016, and Japanese Patent Application No. 2016-240590 filed on Dec. 12, 2016, the disclosures of which are incorporated herein by reference.

TECHNICAL FIELD

The present disclosure relates to a current sensor that senses a magnetic flux generated from a current path to perform electromagnetic conversion, and a current sensor that senses a magnetic field generated from the current path and converts the magnetic field into an electric signal to detect a current flowing in the current path.

BACKGROUND ART

As a current sensor, there has been a current detection system disclosed in Patent Literature 1. The current detection system has magnetic plates, and a bus bar and a semiconductor substrate corresponding to the magnetic plates. On the semiconductor substrate, an electromagnetic conversion element for converting a magnetic flux into an electric signal is formed.

PRIOR ART LITERATURE

Patent Literature

Patent Literature 1: JP 2015-194472 A

SUMMARY OF INVENTION

According to an example of the current detection system disclosed in Patent Literature 1, two pairs of magnetic plates are arranged to be adjacent to each other in the current detection system. A bus bar and a semiconductor substrate are disposed between the magnetic plates facing each other in each pair. Therefore, in the current detection system, the magnetic plates facing one bus bar and semiconductor substrate and the magnetic plates facing the other bus bar and semiconductor substrate are separated from each other. For this reason, in the current detection system, there is the possibility that a leakage magnetic field is generated from the end of the magnetic plate.

Further, in a case where each of the magnetic plates of the current detection system is magnetically saturated, the magnetic plate is magnetically saturated from the surface on the side facing the semiconductor substrate. Therefore, in the current detection system, a leakage magnetic field from the magnetic plate due to magnetic saturation tends to affect the electromagnetic conversion element.

According to another example of the current detection system disclosed in Patent Literature 1, three pairs of magnetic plates (hereinafter referred to as magnetic shields) are arranged so as to be adjacent to each other in the current detection system. A bus bar and a semiconductor substrate are disposed between the magnetic shields facing each other in each pair. Therefore, in the current detection system, the adjacent magnetic shields are separated from each other.

In the following description, a pair of magnetic shields, and a bus bar and a semiconductor substrate between the pair of magnetic shields, are also referred to as a phase. Therefore, the above current detection system can be said to have three phases arranged adjacent to each other. Further, one of the magnetic shields facing each other is also referred to as an upper shield, and the other is also referred to as a lower shield.

In the current detection system configured as above, when a relatively large current such as 1200 A is supplied to the bus bar in a certain phase, a magnetic field is generated from the bus bar. The magnetic field concentrates inside the magnetic shield facing the bus bar and propagates to the magnetic shield in the adjacent phase. In the magnetic shield disposed at the end, the magnetic field is exchanged between the upper shield and the lower shield. For this reason, in the current detection system, the electromagnetic conversion element disposed at the end may sense a part of the magnetic field exchange to cause occurrence of a current detection error.

It is a first object of the present disclosure to provide a current sensor capable of reducing a leakage magnetic field and preventing the influence of the leakage magnetic field due to magnetic saturation. It is a second object of the present disclosure to provide a current sensor capable of detecting a current with high accuracy.

According to a first aspect of the present disclosure, a current sensor includes: a magnetic detection element that senses a magnetic flux generated from a current path to perform electromagnetic conversion; and at least two magnetic shields that are arranged around the magnetic detection element and shield an external magnetic flux affecting the magnetic detection element.

The at least two magnetic shields include a first magnetic shield and a second magnetic shield facing each other across the magnetic detection element and the current path. At least one of the first magnetic shield and the second magnetic shield includes at least two base portions and a coupling portion coupling the at least two base portions. The at least one of the first magnetic shield and the second magnetic field has a recess recessed from a periphery in a surface facing the other of the first magnetic shield and the second magnetic shield.

As thus described, the current sensor is formed by the two base portions in the magnetic shield being coupled to each other by the coupling portion, so that it is possible to reduce the leakage magnetic field from the end of the base portion. That is, in the current sensor, the leakage magnetic field from the end of the base portion can be reduced as compared to the case where two base portions are not coupled by the coupling portion and are divided.

In addition, with the recess being formed in the magnetic shield, the current sensor causes the magnetic flux generated from the current path to flow on the surface of the magnetic shield opposite to the facing region of the magnetic shield. For this reason, in the current sensor, the side opposite to the facing region of the magnetic shield, namely, the side of the magnetic shield farther from the magnetic detection element tends to be saturated magnetically. Therefore, the current sensor can prevent the leakage magnetic field due to magnetic saturation of the magnetic shield from affecting the magnetic detection element.

According to a second aspect of the present disclosure, a current sensor is for individually detecting a current flowing in each of a plurality of current paths, and includes a plurality of phases respectively corresponding to the plurality of current paths. Each of the phases includes: a magnetic detection element facing one of the current paths, sensing a magnetic field generated from the current path, and converting the magnetic field into an electric signal; and a magnetic shield portion shielding an external magnetic field affecting the magnetic detection element and including a pair of first shield and a second shield facing each other across the current path and the magnetic detection element. In each of the phases, the first shied, the current path, the magnetic detection element, and the second shield are stacked in this order in a stacking direction and the phases are arranged in an arrangement direction orthogonal to the stacking direction.

Herein, a phase at an end in the arrangement direction among the plurality of phases is defined as an end phase. The first shield in the end phase is defined as a first end phase shield. The second shield in the end phase is defined as a second end phase shield. The magnetic detection element in the end phase is defined as an end phase detection element.

At least one of the first end phase shield and the second end phase shield includes a magnetic field exchanger configured to perform magnetic field exchange between the first end phase shield and the second end phase shield such that a leakage magnetic field from an extreme end of one of the first end phase shield and the second end phase shield in the arrangement direction reaches the other of the first end phase shield and the second end phase shield more easily than the end phase detection element.

As thus described, according to the second aspect of the present disclosure, at least one of the first end phase shield and the second end phase shield includes the magnetic field exchanger. Thus, in the present disclosure, the leakage magnetic field from the extreme end in the arrangement direction of each of the first end phase shield and the second end phase shield more easily reaches each of the first end phase shield and the second end phase shield on the other facing side, than the end phase detection element. Therefore, in the present disclosure, the leakage magnetic field can be prevented from reaching the end phase detection element, and the current can be detected with high accuracy.

According to a third aspect of the present disclosure, a current sensor is for individually detecting a current flowing in each of a plurality of current paths, and includes a plurality of phases corresponding to the plurality of current paths. Each of the phases includes: a magnetic detection element facing one of the current paths, sensing a magnetic field generated from the current path, and converting the magnetic field into an electric signal; and a magnetic shield portion shielding an external magnetic field affecting the magnetic detection element and including a pair of first shield and a second shield facing each other across the current path and the magnetic detection element. In each of the phases, the first shied, the current path, the magnetic detection element, and the second shield are stacked in this order in a stacking direction, and the phases are arranged in an arrangement direction orthogonal to the stacking direction.

Herein, a phase at an end in the arrangement direction among the plurality of phases is defined as an end phase. The first shield in the end phase is defined as a first end phase shield. The second shield in the end phase is defined as a second end phase shield. The magnetic detection element in the end phase is defined as an end phase detection element.

The magnetic shield portion includes a magnetic field exchanger that is provided continuously with ends of the first end phase shield and the second end phase shield in the arrangement direction to integrate the first end phase shield and the second end phase shield. The magnetic field exchanger is configured to perform magnetic field exchange between the first end phase shield and the second end phase shield.

As thus described, according to the third aspect of the present disclosure, the current sensor includes the magnetic field exchanger that is provided continuously with the ends of the first end phase shield and the second end phase shield in the arrangement direction to integrate the first end phase shield and the second end phase shield. Thus, the present disclosure can reduce generation of the leakage magnetic field from the end in the arrangement direction of the first end phase shield and the second end phase shield. Therefore, in the present disclosure, the leakage magnetic field can be prevented from reaching the end phase detection element, and the current can be detected with high accuracy.

BRIEF DESCRIPTION OF DRAWINGS

The above and other objects, features and advantages of the present disclosure will become more apparent from the following detailed description made with reference to the accompanying drawings, in which:

FIG. 3 is a sectional view showing a schematic configuration of a current sensor in a first modification of the first embodiment;

FIG. 4 is a sectional view showing a schematic configuration of a current sensor in a second modification;

FIG. 5 is a sectional view showing a schematic configuration of a current sensor in a third modification;

FIG. 6 is a sectional view showing a schematic configuration of a current sensor in a fourth modification;

FIG. 7 is a sectional view showing a schematic configuration of a current sensor in a fifth modification;

FIG. 8 is a sectional view showing a schematic configuration of a current sensor in a sixth modification;

FIG. 17 is a sectional view showing a schematic configuration of a current sensor in a thirteenth modification;

FIG. 18 is a sectional view showing a schematic configuration of a current sensor in a fourteenth modification;

FIG. 20 is a sectional view showing a schematic configuration of a current sensor in a sixteenth modification;

DESCRIPTION OF EMBODIMENTS

Figure 1:
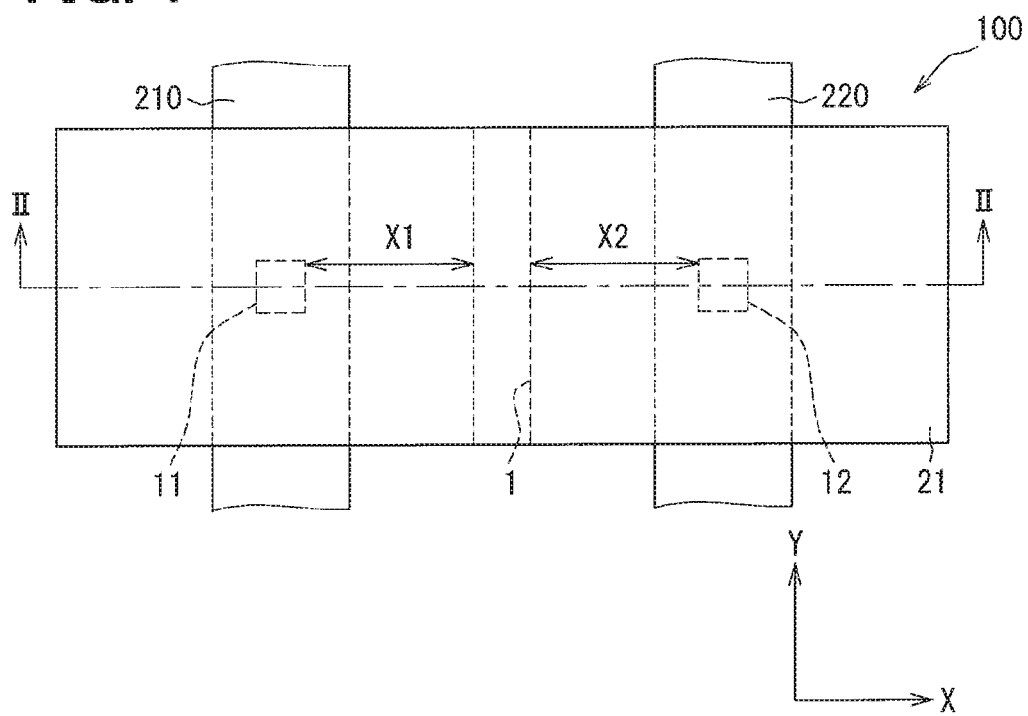
FIG. 1 is a plan view showing a schematic configuration of a current sensor in a first embodiment.

Hereinafter, a plurality of embodiments of the present disclosure will be described with reference to the drawings. In each embodiment, portions corresponding to an item described in a preceding embodiment are denoted by the same reference numerals, and redundant explanation may be omitted. In each embodiment, when only a part of a configuration is described, the other parts of the configuration can be applied with reference to other embodiments described above.

In the following description, three mutually orthogonal directions are referred to as an X direction, a Y direction, and a Z direction. Further, a plane defined by the X direction and the Y direction is referred to as an XY plane, a plane defined by the X direction and the Z direction is as an XZ plane, and a plane defined by the Y direction and the Z direction is as a YZ plane.

First Embodiment

Figure 2:
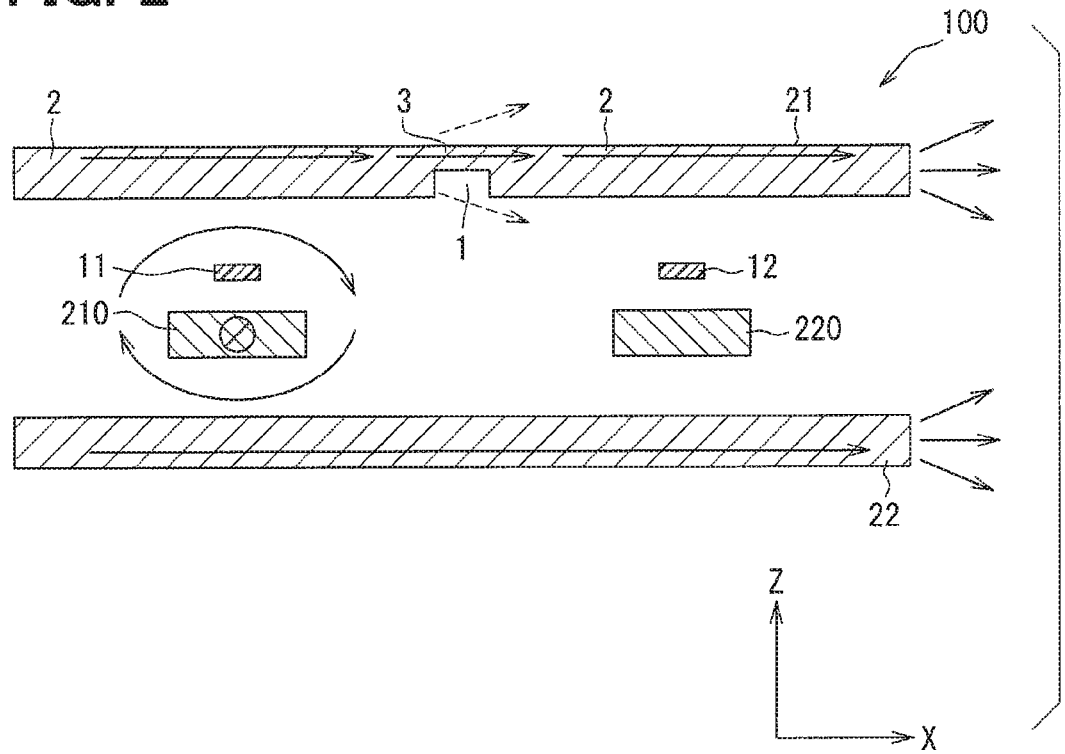
FIG. 2 is a sectional view taken along a line II-II in FIG. 1.

With reference to FIGS. 1 and 2, a current sensor 100 of a first embodiment will be described. The current sensor 100 is used, for example, for controlling an inverter of an in-vehicle motor. The current sensor 100 detects a current to be detected that flows in bus bars 210, 220 connected to an in-vehicle battery which supplies power to the in-vehicle motor, so as to control the inverter. The bus bars 210, 220 correspond to the current paths.

The current sensor 100 is used, for example, in an electric vehicle or a hybrid vehicle. As the current sensor 100, for example, it is possible to employ a careless current sensor that does not require a magnetism collecting core.

The current sensor 100 includes a first magnetic detection element 11, a second magnetic detection element 12, a first magnetic shield 21, and a second magnetic shield 22.

For example, it is possible to employ a configuration for each of the first magnetic detection element 11 and the second magnetic detection element 12 where a sensor chip, a bias magnet, and a circuit chip are mounted on a substrate, these are sealed with a sealing resin body, and leads connected to the circuit chip are exposed to the outside of the sealing resin body. As the sensor chip, for example, a giant magneto resistance element (GMR), an anisotropic magneto resistance element (AMR), a tunnel magneto resistance element (TMR), a Hall element, or the like can be employed.

As shown in FIGS. 1 and 2, the first magnetic detection element 11 and the second magnetic detection element 12 are arranged side by side in the X direction. As shown in FIG. 2, the first magnetic detection element 11 is disposed facing the first bus bar 210 in the Z direction. Meanwhile, the second magnetic detection element 12 is disposed facing the second bus bar 220 in the Z direction. The Z direction can also be referred to as the thickness direction of the magnetic shields 21, 22.

Each of the first magnetic shield 21 and the second magnetic shield 22 is made of a magnetic material and serves to prevent transmission of an external magnetic field through each of the magnetic detection elements 11, 12. The first magnetic shield 21 and the second magnetic shield 22 are provided in common to the magnetic detection elements 11, 12.

As shown in FIGS. 1 and 2, the first magnetic shield 21 and the second magnetic shield 22 are platy members. The first magnetic shield 21 and the second magnetic shield 22 are arranged facing each other with an interval therebetween in the Z direction. In addition, the first magnetic shield 21 and the second magnetic shield 22 are arranged so as to sandwich the magnetic detection elements 11, 12 and the bus bars 210, 220 in the Z direction. Hence, the magnetic detection elements 11, 12 can be said to be arranged in a region where the first magnetic shield 21 and the second magnetic shield 22 face each other.

As shown in FIGS. 1 and 2, the first magnetic shield 21 and the second magnetic shield 22 have different shapes. The second magnetic shield 22 is a platy member in a tabular shape. The second magnetic shield 22 has a surface facing the first magnetic shield 21 and a surface opposite from the facing surface. The facing surface and the opposite surface of the second magnetic shield 22 are flat surfaces. Further, the thickness of the second magnetic shield 22 in the Z direction is uniform over the entire region. The opposite surface of the second magnetic shield 22 can be called the outer surface of the second magnetic shield 22.

In the present embodiment, the second magnetic shield 22 is employed which has a rectangular shape as the outer shape of the facing surface and the outer surface of the opposite surface. However, the present disclosure is not limited thereto.

In contrast, as shown in FIG. 2, the first magnetic shield 21 is a platy member having a recess 1. That is, the first magnetic shield 21 has the recess 1 recessed from the periphery. As shown in FIG. 1, the recess 1 is provided from one end to the other end in the Y direction of the first magnetic shield 21 and can also be called a groove. Further, the recess 1 can be said to be formed from one end toward the other end of the first magnetic shield 21 along a current flow direction in the bus bars 210, 220. Note that the recess 1 is a bottomed hole and is not a hole penetrating the first magnetic shield 21 in the Z direction.

This recess 1 is provided so as to be orthogonal to a magnetic flux flowing in each of the magnetic shields 21, 22 as a current to be detected flows in each of the bus bars 210, 220. The flow of the magnetic flux in the magnetic shield such as the first magnetic shield 21 can be referred to as a magnetic flow path.

The first magnetic shield 21 has a surface facing the second magnetic shield 22 and a surface opposite from the facing surface. The opposite surface of the first magnetic shield 21 is a flat surface. However, the facing surface of the first magnetic shield 21 is a flat surface in a part of which a recessed section is formed. That is, this recessed section corresponds to the recess 1. Therefore, the first magnetic shield 21 has the recess 1 formed to be opened on the side facing the second magnetic shield 22. The opposite surface of the first magnetic shield 21 can be called the outer surface of the first magnetic shield 21.

Further, the first magnetic shield 21 can be said to have a thick portion 2 and a thin portion 3. The thick portion 2 corresponds to a base portion. Meanwhile, the thin portion 3 corresponds to a coupling portion.

The thick portion 2 is a section with a thickness in the Z direction being thicker than that of the thin portion 3. The thin portion 3 is sandwiched between the two thick portions 2 and is provided continuously with the two thick portions 2. That is, the first magnetic shield 21 includes the thick portion 2 facing the first magnetic detection element 11 and the thick portion 2 facing the second magnetic detection element 12, and the two thick portions 2 are linked by the thin portion 3.

The opposite surface of the first magnetic shield 21 is flush with the thick portion 2 and the thin portion 3. In contrast, the position of the facing surface of the first magnetic shield 21 in the Z direction is different between the thick portion 2 and the thin portion 3. Therefore, the recess 1 can be said to be a region facing the thin portion 3 and a region sandwiched between the two thick portions 2. Further, the first magnetic shield 21 can be said to have the recess 1 formed in the position facing the thin portion 3, the recess 1 being recessed from the peripheral thick portion 2 and opened in the facing region.

Moreover, as shown in FIG. 1, when viewed from the Z direction, the first magnetic shield 21 is preferably provided with the recess 1 in a section facing the middle between the first magnetic detection element 11 and the second magnetic detection element 12. That is, the recess 1 is provided in a section facing an intermediate position between the two magnetic detection elements 11, 12. A distance X1 from the first magnetic detection element 11 to the recess 1 is substantially the same as a distance X2 from the second magnetic detection element 12 to the recess 1. Even when a leakage magnetic field is generated from the recess 1 in the current sensor 100, it is possible to prevent the leakage magnetic field from affecting the magnetic detection elements 11, 12. However, the position of the recess 1 is not limited thereto.

In the present embodiment, the first magnetic shield 21 is employed which has the rectangular shape as the outer shape of the facing surface and the outer shape of the opposite surface. However, the present disclosure is not limited thereto.

The current sensor 100 is configured by assembling the magnetic detection elements 11, 12 and the magnetic shields 21, 22. A description will be given of the assembling structure of each constituent element of a current sensor 100, the first bus bar 210, and the second bus bar 220. In the present embodiment, the first bus bar 210 and the second bus bar 220 having the tabular shape are employed. FIG. 1 shows sections of the first bus bar 210 and the second bus bar 220 which extend in the Y direction. In addition, the first bus bar 210 and the second bus bar 220 have sections arranged in parallel with an interval therebetween in the X direction. The current to be detected flows in the first bus bar 210 and the second bus bar 220 in the Y direction shown in FIG. 1.

The current sensor 100 is assembled with the first bus bar 210 and the second bus bar 220 in order to detect the current to be detected flowing in the first bus bar 210 and the second bus bar 220. As shown in FIG. 2, the first magnetic shield 21 and the second magnetic shield 22 are arranged facing each other in the Z direction. The magnetic detection elements 11, 12 and the bus bars 210, 220 are arranged in regions facing the first magnetic shield 21 and the second magnetic shield 22.

As shown in FIG. 2, the first magnetic detection element 11 is disposed between the first bus bar 210 and the first magnetic shield 21 in the Z direction. More specifically, the first magnetic detection element 11 is disposed between the first bus bar 210 and one thick portion 2 in the first magnetic shield 21. The first magnetic detection element 11 is disposed with an interval from the first bus bar 210 and with an interval from the first magnetic shield 21.

As shown in FIG. 2, the second magnetic detection element 12 is disposed between the second bus bar 220 and the first magnetic shield 21 in the Z direction. More specifically, the second magnetic detection element 12 is disposed between the second bus bar 220 and the other thick portion 2 in the first magnetic shield 21. Further, the second magnetic detection element 12 is disposed with an interval from the second bus bar 220 and an interval from the first magnetic shield 21. The second magnetic shield 22 and each of the first bus bar 210 and the second bus bar 220 are arranged with an interval in the Z direction.

The first bus bar 210 is disposed in a region facing the one thick portion 2, together with the first magnetic detection element 11. The second bus bar 220 is disposed in a region facing the other thick portion 2, together with the second magnetic detection element 12. Therefore, the first magnetic detection element 11 and the second magnetic detection element 12 are arranged side by side in the X direction across a region facing the recess 1. Similarly, the first bus bar 210 and the second bus bar 220 are arranged side by side in the X direction across the region facing the recess 1.

Each constituent element of the current sensor 100 and the bus bars 210, 220 are arranged and assembled in this manner. For example, each constituent element of the current sensor 100 and the bus bars 210, 220 have an assembled structure fixed to a housing or the like. A structural body in which the bus bars 210, 220, the magnetic detection elements 11, 12, and the magnetic shields 21, 22 are assembled can be referred to as a terminal block of the current sensor 100.

The current to be detected flows in the extending direction of the bus bars 210, 220, namely, in the Y direction in FIG. 1. Therefore, as shown in FIG. 2, due to the flow of the current to be detected in the Y direction, a magnetic field is generated according to the right-handed screw rule on a plane orthogonal to the Y direction. This magnetic field can also be referred to as a magnetic flux to be detected. In the current sensor 100, each of the first magnetic detection element 11 and the second magnetic detection element 12 converts the magnetic flux to be detected into an electric signal. That is, the first magnetic detection element 11 converts the magnetic flux to be detected flowing in the first bus bar 210 into an electric signal. Meanwhile, the second magnetic detection element 12 converts the magnetic flux to be detected flowing in the second bus bar 220 into an electric signal. In this manner, the current sensor 100 detects the current to be detected.

In the present embodiment, as shown in FIG. 2, a case where the first bus bar 210 is an energization phase and the second bus bar 220 is a detection phase is employed as an example. Thus, by a current flowing in the first bus bar 210, a magnetic flux flows in each of the magnetic shields 21, 22 as indicated by solid arrows in FIG. 2. Further, in the present embodiment, the first bus bar 210 which is the energization phase serves as a noise generation source.

The effect of the current sensor 100 will be described here in comparison with a current sensor of a comparative example. The current sensor of the comparative example employed here differs from the current sensor 100 in that the thin portion 3 is not provided and that the thick portion 2 facing the first magnetic detection element 11 and the thick portion 2 facing the second magnetic detection element 12 are separated from each other. Therefore, for constituent elements of the current sensor of the comparative example, the same reference numerals for the constituent elements of the current sensor 100 are used.

In the current sensor of the comparative example, when a current flows in the first bus bar 210 as in the case shown in FIG. 2, a leakage magnetic field is generated from the end of the thick portion 2 facing the first magnetic detection element 11 as indicated by dotted arrows shown in FIG. 2. This end is the end of the thick portion 2 facing the first magnetic detection element 11 on the side of the thick portion 2 facing the second magnetic detection element 12.

When the leakage magnetic field is thus generated, the second magnetic detection element 12 on the detection phase side is affected by the leakage magnetic field. Hence, in the current sensor 100 of the comparative example, an error may occur in a detection result of the second magnetic detection element 12.

In contrast, in the current sensor 100, since the thick portion 2 facing the first magnetic detection element 11 and the thick portion 2 facing the second magnetic detection element 12 are linked to each other via the thin portion 3, a leakage magnetic field can be reduced more than the current sensor of the comparative example. Hence, the second magnetic detection element 12 is hardly affected by the leakage magnetic field at the time of detecting the current to be detected. Accordingly, the current sensor 100 can prevent an error from occurring in a detection result of the second magnetic detection element 12. That is, the current sensor 100 can improve the detection accuracy of the second magnetic detection element 12 as compared to the current sensor of the comparative example.

Further, with the recess 1 being provided in the first magnetic shield 21, the current sensor 100 can cause the magnetic flux to flow on the outer surface of the first magnetic shield 21. That is, by providing the recess 1 in the first magnetic shield 21, the current sensor 100 controls the magnetic flow path such that the magnetic flux flows on the outer surface of the first magnetic shield 21.

Hence, in the current sensor 100, the opposite side of the first magnetic shield 21 from the facing region side, namely, the farther side of the first magnetic shield 21 from the magnetic detection elements 11, 12 tends to be saturated magnetically. That is, the current sensor 100 can prevent the magnetic saturation of the side of the first magnetic shield 21 which is closer to the magnetic detection elements 11, 12. Therefore, the current sensor 100 can prevent the leakage magnetic field due to magnetic saturation of the first magnetic shield 21 from affecting the magnetic detection elements 11, 12.

As thus described, the recess 1 is provided to control the magnetic flow path in the first magnetic shield 21. Thus, the recess 1 can also be referred to as a magnetic path control portion.

In the present embodiment, the current sensor 100 provided with the two magnetic detection elements 11, 12, the first magnetic shield 21, and the second magnetic shield 22 has been employed corresponding to the two-phase bus bars 210, 220. However, the present disclosure is not limited thereto, and the current sensor 100 may be provided with three magnetic detection elements, the first magnetic shield 21, and the second magnetic shield 22 corresponding to three-phase bus bars. In this case, the first magnetic shield 21 includes three thick portions respectively facing the three magnetic detection elements, and two thin portions provided between the adjacent thick portions.

Hereinafter, first to twenty-sixth modifications of the first embodiment will be described. Each of the first embodiment and the first to twenty-sixth modifications can be implemented independently and can also be implemented in appropriate combination. The present disclosure is not limited to combinations shown in the embodiments but can be implemented in various combinations.

First Modification

With reference to FIG. 3, a current sensor 101 of the first modification will be described. The current sensor 101 differs from the current sensor 100 in a structure of a second magnetic shield 22A. FIG. 3 is a sectional view corresponding to FIG. 2.

The current sensor 101 includes a first magnetic shield 21A and a second magnetic shield 22A. The first magnetic shield 21A is the same as the first magnetic shield 21, and thus a description thereof will be omitted.

In contrast, the second magnetic shield 22A includes a thick portion 2A and a thin portion 3A in the same manner as the first magnetic shield 21. The second magnetic shield 22A has a recess 1A formed therein in the same manner as the first magnetic shield 21. That is, the second magnetic shield 22A has the thick portion 2A facing the first bus bar 210, the thick portion 2A facing the second bus bar 220, and the thin portion 3A linking between the two thick portions 2A. The thick portion 2A can be called a facing base portion. Meanwhile, the thin portion 3A can be called a facing coupling portion.

The current sensor 101 can achieve a similar effect to that of the current sensor 100. Moreover, since having a similar configuration to that of the first magnetic shield 21, the second magnetic shield 22A can achieve a similar effect to that of the first magnetic shield 21 described above. Therefore, the current sensor 101 can improve the detection accuracy more than the current sensor 100. In addition, the current sensor 101 easily maintains the shield function of the second magnetic shield 22A and can easily prevent the magnetic saturation of the second magnetic shield 22A from affecting the magnetic detection elements 11, 12.

Second Modification

With reference to FIG. 4, a current sensor 102 of the second modification will be described. The current sensor 102 differs from the current sensor 100 in a structure of a first magnetic shield 21B. FIG. 4 is a sectional view corresponding to FIG. 2.

The current sensor 102 includes a first magnetic shield 21B and a second magnetic shield 22B. The second magnetic shield 22B is the same as the second magnetic shield 22, and thus a description thereof will be omitted.

The first magnetic shield 21B includes two thick portions 2 and a thin portion 3B linking between the two thick portions 2. The thin portion 3B corresponds to a coupling portion. The opposite surface and the facing surface of the first magnetic shield 21B are flat surfaces in parts of which recessed sections are formed. That is, in addition to the recess 1, the first magnetic shield 21B is also provided with an outer recess 1B on the opposite surface side. The current sensor 102 can achieve a similar effect to that of the current sensor 100.

Third Modification

With reference to FIG. 5, a current sensor 103 of the third modification will be described. The current sensor 103 differs from the current sensor 100 in a structure of a first magnetic shield 21C. FIG. 5 is a sectional view corresponding to FIG. 2.

The current sensor 103 includes a first magnetic shield 21C and a second magnetic shield 22C. The second magnetic shield 22C is the same as the second magnetic shield 22, and thus a description thereof will be omitted.

The first magnetic shield 21C includes two thick portions 2 and a lid portion 3C linking between the two thick portions 2. In the first magnetic shield 21C, the two thick portions 2 are coupled by the lid portion 3C to form the recess 1. The lid portion 3C corresponds to a coupling portion. As an example, the thickness of the lid portion 3C in the Z direction is smaller than that of the thick portion 2. The lid portion 3C is coupled to the opposite surface of the two thick portions 2. The current sensor 103 can achieve a similar effect to that of the current sensor 100.

Fourth Modification

With reference to FIG. 6, a current sensor 104 of the fourth modification will be described. The current sensor 104 differs from the current sensor 100 in a structure of a first magnetic shield 21D. FIG. 6 is a sectional view corresponding to FIG. 2.

The current sensor 104 includes a first magnetic shield 21D and a second magnetic shield 22D. The second magnetic shield 22D is the same as the second magnetic shield 22, and thus a description thereof will be omitted.

The first magnetic shield 21D includes two base portions 2D and a protrusion 3D linking between the two base portions 2D. The base portion 2D corresponds to the thick portion 2 of the above embodiment. The protrusion 3D corresponds to a coupling portion.

The protrusion 3D protrudes on the opposite surface side with respect to the base portion 2D. In other words, the protrusion 3D is provided protruding on the opposite side of the first magnetic shield 21D from the facing region. As an example, for the protrusion 3D, a protrusion having a thin section with a thickness smaller than that of the base portion 2D is employed between the coupling portion with one base portion 2D and the coupling portion with the other base portion 2D. The thickness of the protrusion 3D is the thickness in the X direction at the section extending in the Z direction and the thickness in the Z direction at the section extending in the X direction. Therefore, the protrusion 3D is a section having the same function as that of the thin portion 3.

In the first magnetic shield 21D, the recess 1 is formed in the protrusion 3D. The first magnetic shield 21D can thus have a larger depth of the recess 1 in the Z direction than the first magnetic shield 21. Hence, the recess 1 is formed to be deeper than the thickness of the first magnetic shield 21. That is, the length of the first magnetic shield 21D in the Z direction from a virtual plane along the facing surface to the bottom of the recess 1 is set larger than the thickness of the base portion 2D in the Z direction.

The current sensor 104 can achieve a similar effect to that of the current sensor 100. Moreover, in the current sensor 104, the recess 1 is deeper than the recess 1 in the current sensor 100, so that a component 30 can be more easily disposed in the recess 1. In the current sensor 104, when the electronic component 30 is disposed in the recess 1, it is not necessary to provide a mechanical shield function for the electronic component 30 and to protect the electronic component with a protective member such as a gel. Therefore, the current sensor 104 can be reduced in the number of manufacturing steps and can also be reduced in cost.

Fifth Modification

With reference to FIG. 7, a current sensor 105 of the fifth modification will be described. The current sensor 105 differs from the current sensor 100 in a structure of a first magnetic shield 21E. FIG. 7 is a sectional view corresponding to FIG. 2.

The current sensor 105 includes a first magnetic shield 21E and a second magnetic shield 22E. The second magnetic shield 22E is similar to the second magnetic shield 22, and thus a description thereof will be omitted.

The first magnetic shield 21E includes two thick portions 2 and a thin portion 3B linking between the two thick portions 2. In the first magnetic shield 21E, the recess 1 is formed. More specifically, in the first magnetic shield 21E, a recess 1 having a sidewall which is an inclined portion 1E is formed. Hence, the opening area of the recess 1 in the first magnetic shield 21E increases from the bottom to the opening end of the recess 1.

The recess 1 in the first magnetic shield 21E is formed by press working. Therefore, in the first magnetic shield 21E, the inclined portion 1E can be formed by providing a metal mold of a press machine with inclination.

The current sensor 105 can achieve a similar effect to that of the current sensor 100. Moreover, in the current sensor 105, the sidewall of the recess 1 is the inclined portion 1E, so that the metal mold can be easily removed from the recess 1 at the time of press working.

Sixth Modification

With reference to FIG. 8, a current sensor 106 of the sixth modification will be described. The current sensor 106 differs from the current sensor 105 in a structure of a first magnetic shield 21F. FIG. 8 is a sectional view corresponding to FIG. 2.

The current sensor 106 includes a first magnetic shield 21F and a second magnetic shield 22F. The second magnetic shield 22F is similar to the second magnetic shield 22E, and thus a description thereof will be omitted.

The first magnetic shield 21F includes two base portions 2F and a protrusion 3F linking between the two base portions 2F. The base portion 2F corresponds to the thick portion 2 of the above embodiment. The protrusion 3F corresponds to a coupling portion. The first magnetic shield 21F has a recess 1 in which the sidewall is the inclined portion 1F in the same manner as the first magnetic shield 21E.

As thus described, the first magnetic shield 21F differs from the first magnetic shield 21E mainly in that the protrusion 3F protrudes to the opposite surface side. Further, the recess 1 in the first magnetic shield 21F can be formed by a press working in the same manner as the fifth modification.

The current sensor 106 can achieve a similar effect to that of the current sensor 105. Moreover, since the protrusion 3F protrudes to the opposite surface side, the current sensor 106 can be easily manufactured by press working.

Seventh Modification

Figure 9:
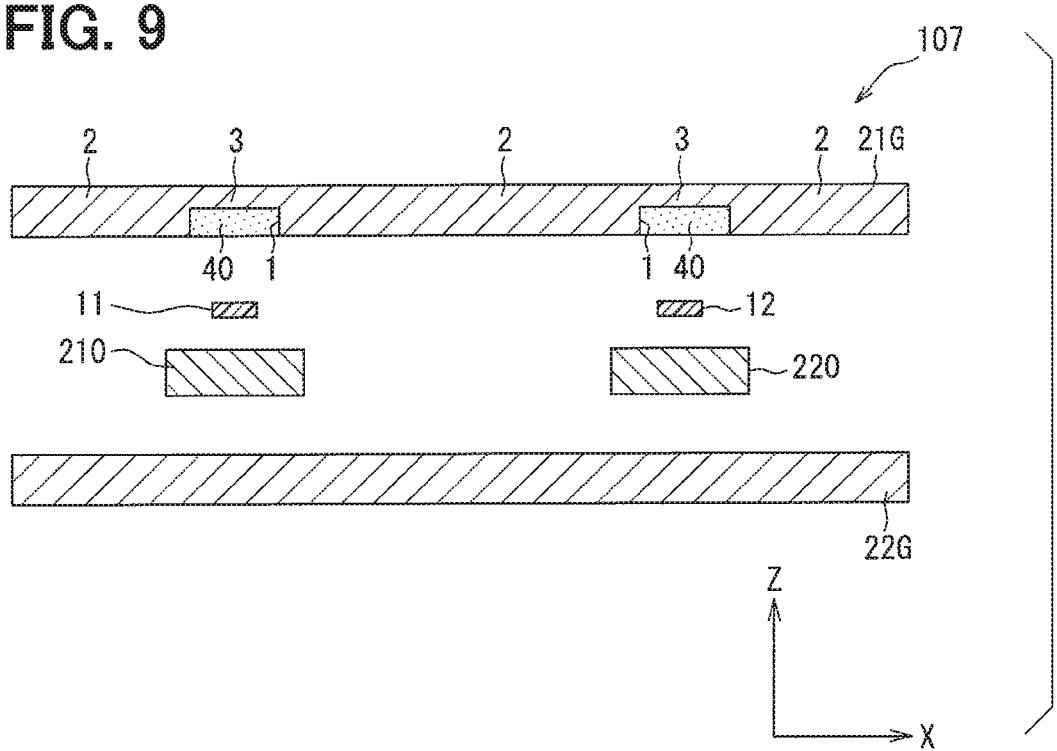
FIG. 9 is a sectional view showing a schematic configuration of a current sensor in a seventh modification.

With reference to FIG. 9, a current sensor 107 of the seventh modification will be described. The current sensor 107 differs from the current sensor 100 in a structure of a first magnetic shield 21G. FIG. 9 is a sectional view corresponding to FIG. 2.

The current sensor 107 includes a first magnetic shield 21G and a second magnetic shield 22G. The second magnetic shield 22F is similar to the second magnetic shield 22E, and thus a description thereof will be omitted.

In the first magnetic shield 21G, the recess 1 is formed in each of the vicinity of the first bus bar 210 and the vicinity of the second bus bar 220. More specifically, the recess 1 is formed at each of a position that the first bus bar 210 faces and a position that the second bus bar 220 faces. That is, the recess 1 is formed at a position facing each of the magnetic detection elements 11, 12. The first magnetic shield 21G is provided with a heat radiation gel 40 in the recess 1. The heat radiation gel 40 corresponds to a heat radiation member.

The current sensor 107 can achieve a similar effect to that of the current sensor 100. Further, in the current sensor 107, the heat radiation gel 40 is provided in each of the vicinities of the bus bars 210, 220 in the first magnetic shield 21G, in this case, at the positions facing the bus bars 210, 220. Hence, in the current sensor 107, heat generated by each of the bus bars 210, 220 is easily transferred to the first magnetic shield 21G via the heat radiation gel 40. Moreover, with the heat radiation gel 40 being provided in the recess 1 in the current sensor 107, the mechanical strength of the first magnetic shield 21G can be improved as compared to the case where the recess 1 is a space.

Alternatively, in the current sensor 107, the recess 1 may be provided at each of positions of the second magnetic shield 22G which face the bus bars 210, 220, and the heat radiation gel 40 may be disposed in the recess 1. In this case, it is possible to further improve heat radiation properties of the current sensor 107. Further, in the current sensor 107, the mechanical strength of the second magnetic shield 22G can be improved by disposing the heat radiation gel 40 in the recess 1 as compared to the case where the recess is a space in the second magnetic shield 22G.

Eighth Modification

Figure 10:
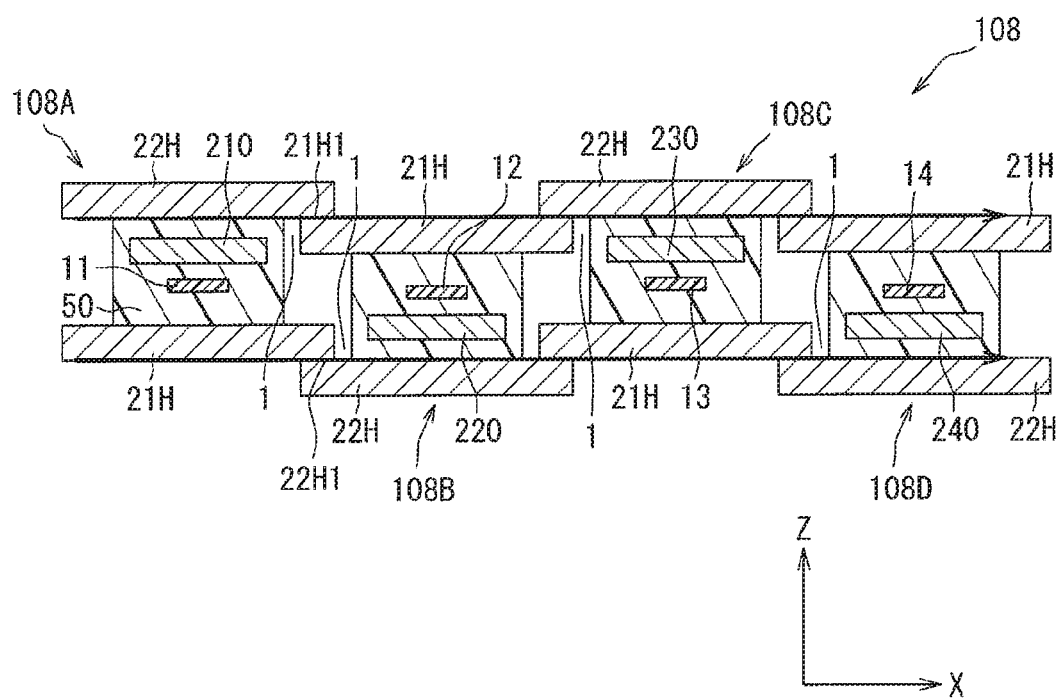
FIG. 10 is a sectional view showing a schematic configuration of a current sensor in an eighth modification.
Figure 11:
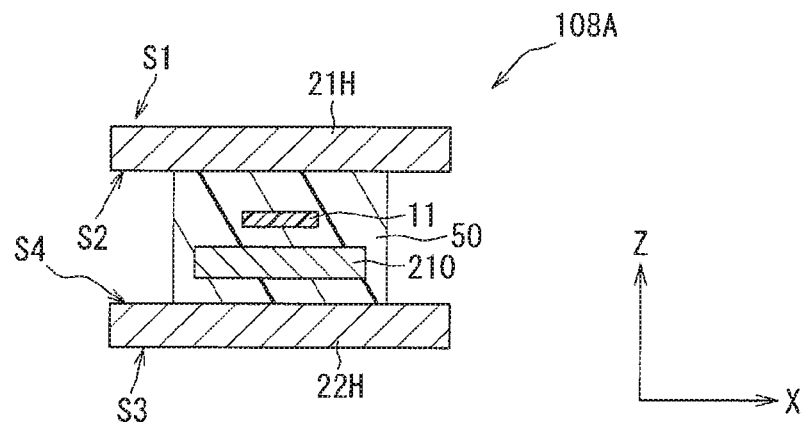
FIG. 11 is a sectional view showing a schematic configuration of a sensor block in the eighth modification.

With reference to FIGS. 10 and 11, a current sensor 108 of the eighth modification will be described. The current sensor 108 differs from the current sensor 100 in a structure of a first magnetic shield 21G. Further, the current sensor 108 differs from the current sensor 100 in being configured as a sensor for four phases. FIG. 10 is a sectional view corresponding to FIG. 2.

The current sensor 108 includes a first sensor block 108A, a second sensor block 108B, a third sensor block 108C, and a fourth sensor block 108D. The current sensor 108 is constructed by assembling a plurality of sensor blocks 108A to 108D. Moreover, the current sensor 108 can be said to be modularized by connecting the plurality of sensor blocks 108A to 108D. Each of the sensor blocks 108A to 108D has a same configuration.

With reference to FIG. 11, the configuration of each of the sensor blocks 108A to 108D will be described here. A description will be given using the first sensor block 108A as a typical example.

The first sensor block 108A includes a magnetic detection element 11, a bus bar 210, a first magnetic shield 21H, a second magnetic shield 22H, and a sealing resin portion 50. The bus bar 210 of the first sensor block 108A can be called the first bus bar 210 in which a current of the first phase flows. The magnetic detection element 11 of the first sensor block 108A can be called the first magnetic detection element 11 that detects the current of the first phase.

Each of the first magnetic shield 21H and the second magnetic shield 22H is made of a magnetic material. The first magnetic shield 21H and the second magnetic shield 22H are configured as platy members orthogonal to the Z direction. The first magnetic shield 21H and the second magnetic shield 22H face each other with an interval therebetween in the Z direction.

In addition, the first magnetic shield 21H and the second magnetic shield 22H are arranged so as to sandwich the magnetic detection element 11 and the bus bar 210 in the Z direction. Hence, the magnetic detection element 11 and the bus bar 210 can be said to be disposed in a region where the first magnetic shield 21H and the second magnetic shield 22H face each other. The first magnetic detection element 11 faces the first magnetic shield 21H without sandwiching the bus bar 210 therebetween and faces the second magnetic shield 22H across the bus bar 210.

In the present embodiment, the first magnetic shield 21H and the second magnetic shield 22H having the same shape are employed. The first magnetic shield 21H and the second magnetic shield 22H are platy members in the tabular shape. The first magnetic shield 21H has a first facing surface S2 that is the surface facing the second magnetic shield 22H and a first opposite surface S1 that is the surface opposite from the first facing surface S2. Meanwhile, the second magnetic shield 22H has a second facing surface S4 that is a surface facing the first magnetic shield 21H and a second opposite surface S3 that is the surface opposite from the second facing surface S4.

In the first magnetic shield 21H and the second magnetic shield 22H, the first opposite surface S1, the first facing surface S2, the second opposite surface S3, and the second facing surface S4 are flat surfaces. In addition, the first magnetic shield 21H and the second magnetic shield 22H have uniform thickness in the Z direction over the entire region.

In the first sensor block 108A, the first magnetic detection element 11, the first bus bar 210, the first magnetic shield 21H, and the second magnetic shield 22H are integrally constituted with a sealing resin portion 50. The first magnetic detection element 11 and the first bus bar 210 are sealed with the sealing resin portion 50 in the state of being disposed in a region where the magnetic shield 21H and the second magnetic shield 22H face each other. Both ends of the first bus bar 210 in the Y direction are exposed from the sealing resin portion 50. The magnetic shield 21H and the second magnetic shield 22H are fixed to the sealing resin portion 50.

The first magnetic shield 21H and the second magnetic shield 22H include a region where the sealing resin portion 50 is not formed at both ends in the X direction. This is because adjacent sensor blocks are connected by the first magnetic shield 21H and the second magnetic shield 22H.

The second sensor block 108B includes a second bus bar 220 in which a current of the second phase flows as the bus bar and a second magnetic detection element 12 that detects the current of the second phase as the magnetic detection element. Similarly, the third sensor block 108C includes a third bus bar 230 in which a current of the third phase flows as the bus bar, and a third magnetic detection element 13 that detects the current of the third phase as the magnetic detection element. The fourth sensor block 108D includes a fourth bus bar 240 in which a current of the fourth phase flows as the bus bar and a fourth magnetic detection element 14 that detects the current of the fourth phase as the magnetic detection element. The bus bars 230, 240 correspond to current paths.

In the present embodiment, as an example, the current sensor 108 is employed in which the first sensor block 108A, the second sensor block 108B, the third sensor block 108C, and the fourth sensor block 108D are arranged in this order. In the current sensor 108, the second sensor block 108B and the fourth sensor block 108D are assembled with the first sensor block 108A and the third sensor block 108C in a vertically inverted state. Therefore, in the current sensor 108, the plurality of sensor blocks 108A to 108D are assembled such that the first magnetic shields 21H and the second magnetic shields 22H of the adjacent sensor blocks are in contact with each other.

That is, in the current sensor 108, the first magnetic shield 21H of the first sensor block 108A and the second magnetic shield 22H of the second sensor block 108B are in contact with each other, and the second magnetic shield 22H of the first sensor block 108A and the first magnetic shield 21H of the second sensor block 108E are in contact with each other. In the current sensor 108, the second facing surface S4 of the first sensor block 108A and the first opposite surface S1 of the second sensor block 108E are assembled in contact with each other, and the first opposite surface S1 of the first sensor block 108A and the second facing surface S4 of the second sensor block 108E are assembled in contact with each other. These portions in contact with each other are sections in the first magnetic shield 21H and the second magnetic shield 22H where the sealing resin portions 50 are not provided.

Further, in the current sensor 108, the first magnetic shield 21H of the second sensor block 108B and the second magnetic shield 22H of the third sensor block 108C are in contact with each other, and the second magnetic shield 22H of the second sensor block 108B and the first magnetic shield 21H of the third sensor block 108C are in contact with each other. In the current sensor 108, the first opposite surface S1 of the second sensor block 108E and the second facing surface S4 of the third sensor block 108C are assembled in contact with each other, and the second facing surface S4 of the second sensor block 108B and the first opposite surface S1 of the third sensor block 108C are assembled in contact with each other.

Moreover, in the current sensor 108, the first magnetic shield 21H of the third sensor block 108C and the second magnetic shield 22H of the fourth sensor block 108D are in contact with each other, and the second magnetic shield 22H of the third sensor block 108C and the first magnetic shield 21H of the fourth sensor block 108D are in contact with each other. In the current sensor 108, the second facing surface S4 of the third sensor block 108C and the first opposite surface S1 of the fourth sensor block 108D are assembled in contact with each other, and the first opposite surface S1 of the third sensor block 108C and the second facing surface S4 of the fourth sensor block 108D are assembled in contact with each other.

In the current sensor 108, these sections in contact are coupled and integrated. Reference numeral 21H1 in FIG. 10 denotes a coupling portion in the magnetic shield on the upper side. Meanwhile, reference numeral 22H1 denotes a coupling portion in the magnetic shield on the lower side. The magnetic shield in which the second magnetic shields 22H of the first sensor block 108A and the third sensor block 108C and the first magnetic shields 21H of the second sensor block 108B and the fourth sensor block 108D are integrated can be referred to as an upper magnetic shield. Meanwhile, the magnetic shield in which the first magnetic shields 21H of the first sensor block 108A and the third sensor block 108C and the second magnetic shields 22H of the second sensor block 108B and the fourth sensor block 108D are integrated can be referred to as a lower magnetic shield.

In the current sensor 108, the second magnetic shields 22H of the first sensor block 108A and the third sensor block 108C are formed as recessed from the first magnetic shields 21H of the second sensor block 108B and the fourth sensor block 108D. Similarly, in the current sensor 108, the second magnetic shields 22H of the second sensor block 108B and the fourth sensor block 108D are formed as recessed from the first magnetic shields 21H of the first sensor block 108A and the third sensor block 108C. It can be said that in the current sensor 108, the recess 1 recessed from the periphery is formed in the surface facing the other magnetic shield by assembling the sensor blocks 108A to 108D as described above.

The current sensor 108 can achieve a similar effect to that of the current sensor 100. That is, the current sensor 108 has a configuration in which adjacent sensor blocks, such as the first sensor block 108A and the second sensor block 108B, are connected by the first magnetic shield 21H and the second magnetic shield 22H. The current sensor 108 can thus reduce the leakage magnetic field.

Further, with the recess 1 being formed in the current sensor 108, a magnetic field is generated in the first magnetic shield 21H and the second magnetic shield 22H as indicated by a straight arrow extending in the X direction in FIG. 10. That is, the current sensor 108 can cause the magnetic flux to flow on the outer surface of the first magnetic shield 21H.

In other words, the current sensor 108 can control the magnetic flow path such that the magnetic flux flows on the surface of the first magnetic shield 21H on the farther side from the magnetic detection elements 11 to 14. Therefore, in the current sensor 108, each of the magnetic detection elements 11 to 14 is hardly affected by the leakage magnetic field due to magnetic saturation.

Moreover, in the current sensor 108, each of the sensor blocks 108A to 108D has a same configuration. That is, each of the sensor blocks 108A to 108D is standardized. As thus described, since the current sensor 108 is configured by assembling the standardized sensor blocks 108A to 108D, the cost can be reduced. Note that the current sensor 108 can be implemented in combination with the seventh modification, and the heat radiation gel 40 may be embedded in the recess 1.

Ninth Modification

Figure 12:
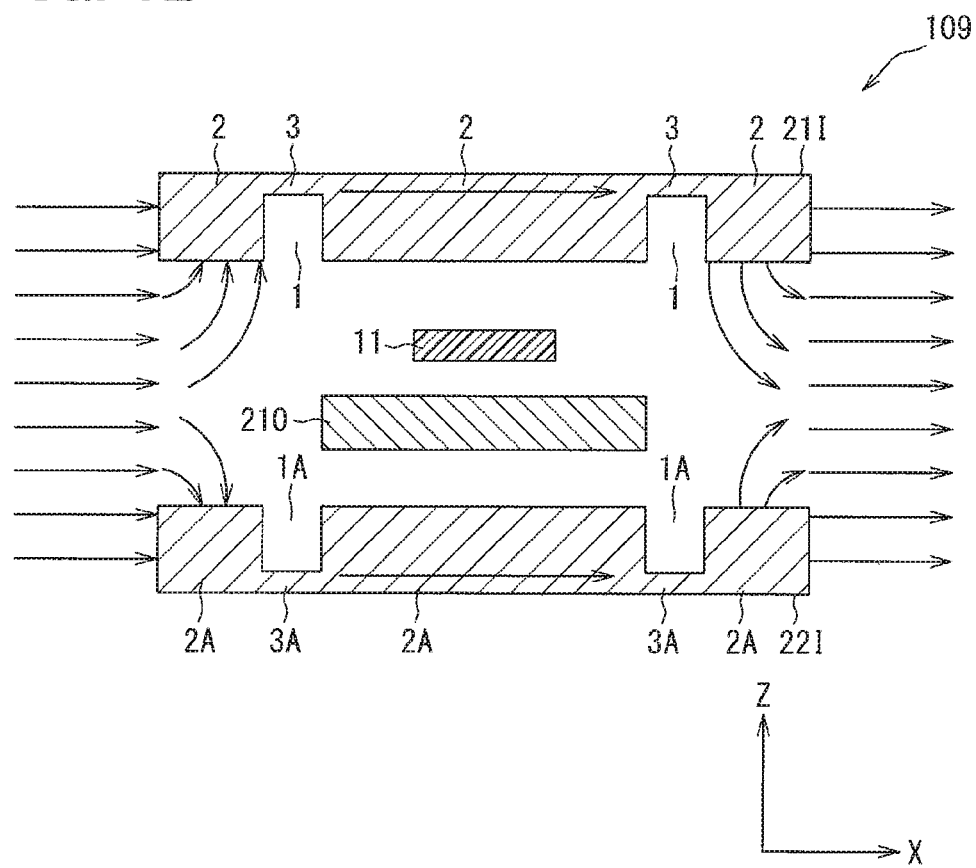
FIG. 12 is a sectional view showing a schematic configuration of a current sensor in a ninth modification.

With reference to FIG. 12, a current sensor 109 of the ninth modification will be described. The current sensor 109 differs from the current sensor 101 in the number of magneto resistance elements and the positions of the recesses 1, 1A. FIG. 12 is a sectional view corresponding to FIG. 2.

The current sensor 109 includes one first magnetic detection element 11, a first magnetic shield 21I, and a second magnetic shield 22I. The first magnetic detection element 11 is located facing the first bus bar 210 and is disposed in a region where the first magnetic shield 21I and the second magnetic shield 22I face each other. More specifically, the first magnetic detection element 11 and the first bus bar 210 are disposed at positions where the thick portion 2 at the center of the first magnetic shield 21I and a thick portion 2A at the center of the second magnetic shield 22I face each other.

The first magnetic shield 21I includes three thick portions 2 and two thin portions 3. A recess 1 is thus formed in each of two places of the first magnetic shield 21I. The second magnetic shield 22I is formed in the same manner as the first magnetic shield 21I. In the current sensor 109, the recess 1 in the first magnetic shield 21I and the recess 1A of the second magnetic shield 22I are arranged facing each other. In this manner, the current sensor 109 is configured as a sensor for one phase.

In the current sensor 109, the recesses 1 are formed in the first magnetic shield 21I. Therefore, in the current sensor 109, a disturbance magnetic field flows on the outer surface of the first magnetic shield 21I. The current sensor 109 can thus prevent the magnetic saturation from affecting the first magnetic detection element 11 in the same manner as the current sensor 100. Further, in the current sensor 109, the recesses 1A are also formed in the second magnetic shield 22I, thereby enabling further prevention of the magnetic saturation from affecting the first magnetic detection element 11.

In the current sensor 109, instead of the second magnetic shield 22I, the second magnetic shield 22, the second magnetic shield 22A, or the like may be employed.

Tenth Modification

Figure 13:
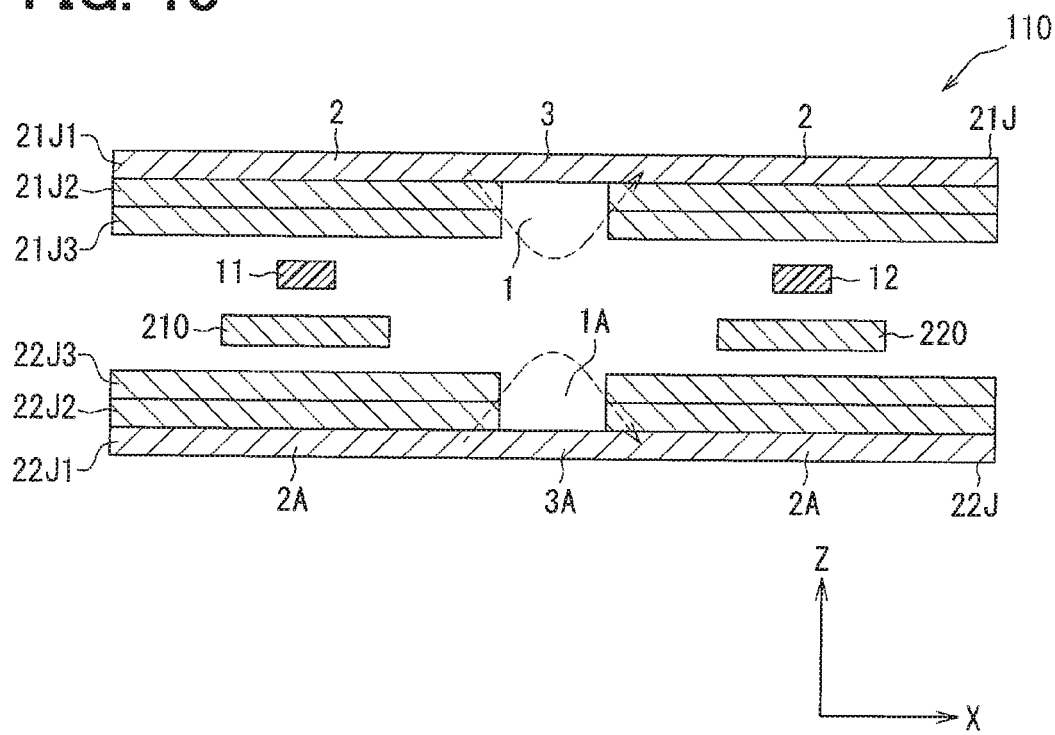
FIG. 13 is a sectional view showing a schematic configuration of a current sensor in a tenth modification.

With reference to FIG. 13, a current sensor 110 of the tenth modification will be described. The current sensor 110 differs from the current sensor 101 in configurations of a first magnetic shield 21J and a second magnetic shield 22J. FIG. 13 is a sectional view corresponding to FIG. 2.

The first magnetic shield 21J is constituted by stacking a plurality of layers made of a magnetic material. In the present modification, the first magnetic shield 21J in which a first surface layer 21J1, a first intermediate layer 21J2, and a first facing layer 21J3 are stacked is employed. The first surface layer 21J1 is one tabular member. Meanwhile, the first intermediate layer 21J2 and the first facing layer 21J3 are two tabular members.

The thick portion 2 of the first magnetic shield 21J is constituted by stacking the first surface layer 21J1, the first intermediate layer 21J2, and the first facing layer 21J3. In the thick portion 2 of the first magnetic shield 21J, the first facing layer 21J3, the first intermediate layer 21J2, and the first surface layer 21J1 are stacked in this order from the second magnetic shield 22J side.

The thin portion 3 of the first magnetic shield 21J is not provided with the first facing layer 21J3 and the first intermediate layer 21J2 but is made up of the first surface layer 21J1. That is, each of the first intermediate layer 21J2 and the first facing layer 21J3 is divided in order to form the recess 1 in the first magnetic shield 21J.

Further, the second magnetic shield 22J is constituted by stacking a plurality of layers made of a magnetic material. In the present modification, the second magnetic shield 22J in which a second surface layer 22J1, a second intermediate layer 22J2, and a second facing layer 22J3 are stacked is employed. The layers 22J1 to 22J3 of the second magnetic shield 22J respectively correspond to the layers 21J1 to 21J3 of the first magnetic shield 21J.

The current sensor 110 can achieve a similar effect to that of the current sensor 101. In the current sensor 110, instead of the second magnetic shield 22J, the second magnetic shield 22, the second magnetic shield 22A, or the like may be employed.

Moreover, in the current sensor 110, materials having different magnetic permeabilities may be used for the first surface layer 21J1, the first intermediate layer 21J2, and the first facing layer 21J3. Similarly, in the current sensor 110, materials having different magnetic permeabilities may be used for the second surface layer 22J1, the second intermediate layer 22J2, and the second facing layer 22J3.

The first surface layer 21J1 and the second surface layer 22J1 are made of a material having a magnetic permeability $\mu A$. Meanwhile, the first intermediate layer 21J2, the first facing layer 21J3, the second intermediate layer 22J2, and the second facing layer 22J3 are made of a material having a magnetic permeability $\mu B$. The relationship between $\mu A$ and $\mu B$ is $\mu A > \mu B$. The first surface layer 21J1 and the second surface layer 22J1 correspond to an outermost layer on the opposite side from the facing region.

In the current sensor 110 configured in this manner, the magnetic flux tends to gather more easily in the first surface layer 21J1 and the second surface layer 22J1 made of a material having lower magnetic resistance than the other layers, and the other layers are less likely to be magnetically saturated. That is, in the current sensor 110, the thick portions 2, 2A are less likely to be magnetically saturated. Further, since the thin portions 3, 3A have lower magnetic resistance than the thick portions 2, 2A, the leakage magnetic field in the recesses 1, 1A can be reduced. The other layers are the first intermediate layer 21J2, the first facing layer 21J3, the second intermediate layer 22J2, and the second facing layer 22J3.

Moreover, in the current sensor 110, materials having different saturation magnetic flux densities may be used for the first surface layer 21J1, the first intermediate layer 21J2, and the first facing layer 21J3. Similarly, in the current sensor 110, materials having different saturation magnetic flux densities may be used for the second surface layer 22J1, the second intermediate layer 22J2, and the second facing layer 22J3.

The first surface layer 21J1 and the second surface layer 22J1 are made of a material having a saturation magnetic flux density BsA. Meanwhile, the first intermediate layer 21J2, the first facing layer 21J3, the second intermediate layer 22J2, and the second facing layer 22J3 are made of a material having a saturation magnetic flux density BsB. The relationship between BsA and BsB is BsA>BsB.

Since the first surface layer 21J1 and the second surface layer 22J1 are less likely to be magnetically saturated than the other layers in the current sensor 110 configured as thus described, even when a relatively large current flows in the first bus bar 210 and the second bus bar 220, it is possible to reduce the leakage magnetic field from the recesses 1, 1A.

Eleventh Modification

Figure 14:
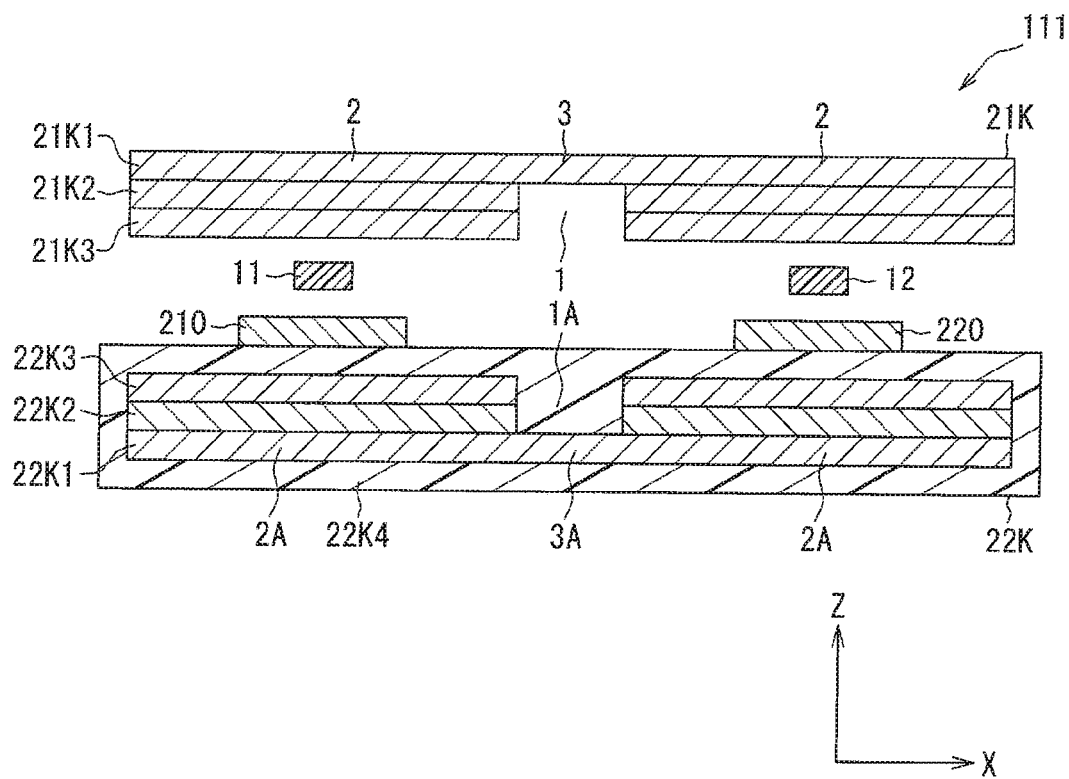
FIG. 14 is a sectional view showing a schematic configuration of a current sensor in an eleventh modification.

With reference to FIG. 14, a current sensor 111 of the eleventh modification will be described. The current sensor 111 differs from the current sensor 110 in a configuration of a second magnetic shield 22K. FIG. 14 is a sectional view corresponding to FIG. 2.

The first magnetic shield 21K is configured by stacking a first surface layer 21K1, a first intermediate layer 21K2, and a first facing layer 21K3 in the same manner as the first magnetic shield 21J. For example, the layers 21K1 to 21K3 of the first magnetic shield 21K shown in the tenth modification can be employed.

The second magnetic shield 22K is configured by stacking a second surface layer 22K1, a second intermediate layer 22K2, and a second facing layer 22K3 in the same manner as the second magnetic shield 22J. Moreover, in the second magnetic shield 22K, the layers 22K1 to 22K3 are held by a resinous housing 22K4. In other words, in the second magnetic shield 22K, the layers 22K1 to 22K3 are covered with the housing 22K4.

Therefore, the second surface layer 22K1 and the second facing layer 22K3 each have a larger contact area with the housing 22K4 than the second intermediate layer 22K2. The second surface layer 22K1 corresponds to an outermost layer on the opposite side from the facing region. The second facing layer 22K3 corresponds to an outermost layer on the facing region side.

The first bus bar 210 and the second bus bar 220 are mounted on the housing 22K4. The housing 22K4 corresponds to a resin member.

In the second magnetic shield 22K, the linear expansion coefficients of the constituent elements 22K1 to 22K4 are set as follows. The linear expansion coefficient of the second surface layer 22K1 and the second facing layer 22K3 is $\alpha A$, the linear expansion coefficient of the second intermediate layer 22K2 is $\alpha B$, and the linear expansion coefficient of the housing 22K4 is $\alpha C$. Then, the relationship among the linear expansion coefficients $\alpha A$ to $\alpha C$ is $|\alpha A-\alpha C|<|\alpha B-\alpha C|$.

The current sensor 111 can achieve a similar effect to that of the current sensor 100. Moreover, the current sensor 111 has the relationship of the linear expansion coefficient among the housing 22K4 and the layers 22K1 to 22K3 as described above, so that it is possible to prevent peeling at the interface between the housing 22K4 and the second surface layer 22K1 and the interface between the housing 22K4 and the second facing layer 22K3.

Twelfth Modification

Figure 15:
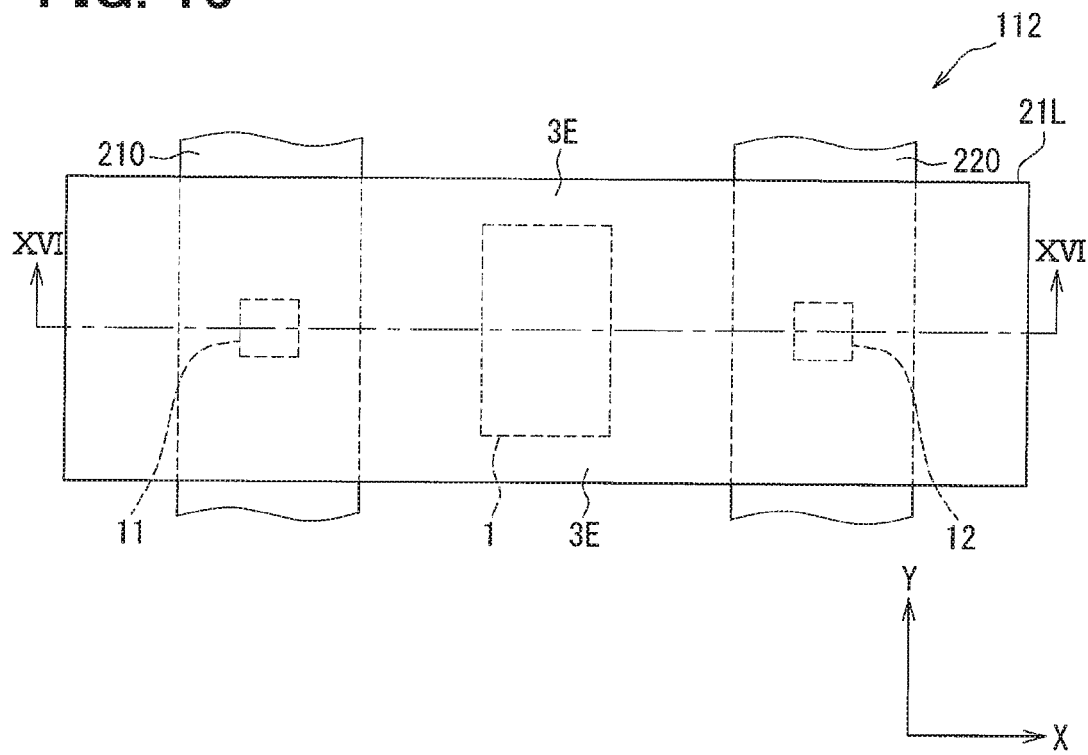
FIG. 15 is a sectional view showing a schematic configuration of a current sensor in a twelfth modification.
Figure 16:
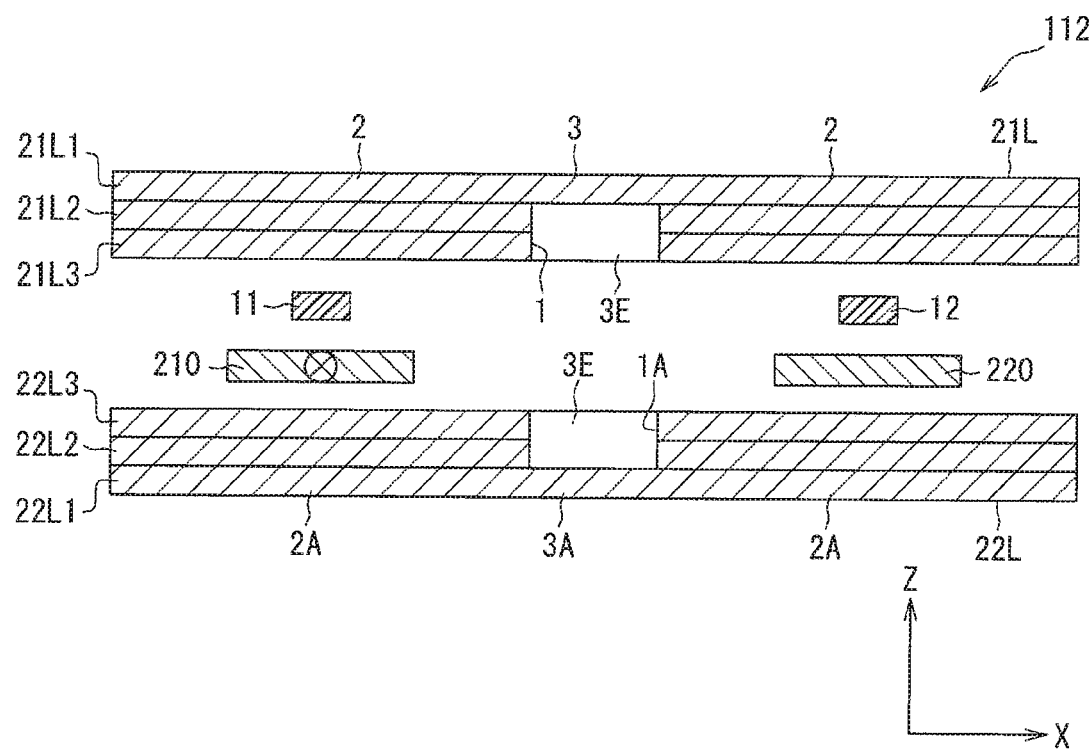
FIG. 16 is a sectional view taken along a line XVI-XVI in FIG. 15.

With reference to FIGS. 15 and 16, a current sensor 112 of the twelfth modification will be described. The current sensor 112 differs from the current sensor 110 in configurations of a first magnetic shield 21L and a second magnetic shield 22L.

The first magnetic shield 21L is configured by stacking a first surface layer 21L1, a first intermediate layer 21L2, and a first facing layer 21L3 in the same manner as the first magnetic shield 213. As the layers 21L1 to 21L3 of the first magnetic shield 21L, for example, those shown in the tenth modification can be employed.

However, as shown in FIG. 15, in the first magnetic shield 21L, the recess 1 does not reach both ends in the Y direction. That is, in the first magnetic shield 21L, as the recess 1, a bottomed hole portion surrounded by the bottom portion and the annular sidewall is formed. Thus, in the first magnetic shield 21L, sections 3E having the same thickness as the thick portion 2 are formed on both sides of the recess 1 in the Y direction. This section 3E corresponds to a beam portion 3E. Therefore, the first magnetic shield 21L can be said to have the beam portions 3E that are provided continuously with the two thick portions 2 on both sides of the recess 1.

The second magnetic shield 22L is configured by stacking a first surface layer 22L1, a first intermediate layer 22L2, and a first facing layer 22L3 in the same manner as the second magnetic shield 223. As the layers 22L1 to 22L3 of the second magnetic shield 22L, for example, those shown in the tenth modification can be employed. In the second magnetic shield 22L, likewise with the first magnetic shield 21L, the recess 1A does not reach both ends in the Y direction and the beam portions 3E are provided.

The current sensor 112 can achieve a similar effect to the current sensor 110. Moreover, since the recesses 1, 1A do not reach both ends in the Y direction in the current sensor 112, it is possible to improve the mechanical strength as compared to the current sensor 110.

Thirteenth Modification

With reference to FIG. 17, a current sensor 113 of the thirteenth modification will be described. The current sensor 113 differs from the current sensor 101 in inclusion of an upper phase 113A and a lower phase 113B. FIG. 17 is a sectional view corresponding to FIG. 2.

In the current sensor 113, the upper phase in which two bus bars 210, 220 are arranged and the lower phase in which two bus bars 230, 240 are arranged are stacked in the thickness direction (Z direction) of the first magnetic shield 21A. The current sensor 113 has a similar configuration to the current sensor 101 described in the first modification as the upper phase 113A and the lower phase 113B. That is, the current sensor 113 has a configuration in which two current sensors 101 are assembled integrally.

Therefore, the current sensor 113 includes two magnetic detection elements 11, 12 provided respectively facing the bus bars 210, 220 in the upper phase 113A, and two magnetic detection elements 13, 14 provided respectively facing the bus bars 230, 240 in the lower phase 113B. Further, the current sensor 113 includes two magnetic shields 21A, 22A that sandwich the bus bars 210, 220 and the magnetic detection elements 11, 12 in the upper phase 113A. Moreover, the current sensor 113 includes two magnetic shields 21A, 22A that sandwich the bus bars 230, 240 and the magnetic detection elements 13, 14 in the lower phase 113B.

In the current sensor 113, the second magnetic shield 22A of the upper phase 113A and the first magnetic shield 21A of the lower phase 113B are arranged facing each other.

More specifically, the opposite surface of the second magnetic shield 22A in the upper phase 113A and the opposite surface of the first magnetic shield 21A in the lower phase 113B are disposed facing each other. In this manner, the current sensor 113 is configured as a sensor for four phases.

The second magnetic shield 22A of the upper phase 113A and the first magnetic shield 21A of the lower phase 113B can be called intermediate magnetic shields. The thick portion 2A of the second magnetic shield 22A in the upper phase 113A and the thick portion 2 of the first magnetic shield 21A in the lower phase 113B can be called intermediate base portions. In addition, the thin portion 3A of the second magnetic shield 22A in the upper phase 113A and the thin portion 3 of the first magnetic shield 21A in the lower phase 113B can be called intermediate coupling portions.

The current sensor 113 can achieve a similar effect to that of the current sensor 101. In addition, since the current sensor 113 includes the second magnetic shield 22A of the upper phase 113A and the first magnetic shield 21A of the lower phase 113B as the intermediate magnetic shields, magnetic interference in the upper phase 113A and the lower phase 113B can be reduced. For example, when the upper phase 113A is an energization phase and the upper phase 113A is a detection phase in the current sensor 113, it is possible to reduce the leakage magnetic field from the upper phase 113A to the lower phase 113B.

In the present modification, the configuration is not limited thereto, and three or more bus bars may be arranged in the upper phase 113A and three or more bus bars may be arranged in the lower phase 113B. In this case, in the upper phase 113A, the magnetic detection elements are arranged facing the respective bus bars. Similarly, in the lower phase 113B, magnetic detection elements are arranged facing the respective bus bars.

Fourteenth Modification

With reference to FIG. 18, a current sensor 114 of the fourteenth modification will be described. The current sensor 114 differs from the current sensor 113 in the positional relationship of the magnetic detection elements 13, 14 and the bus bars 230, 240 in a lower phase 114B. FIG. 18 is a sectional view corresponding to FIG. 2.

The current sensor 114 includes an upper phase 114A and a lower phase 114B. The upper phase 114A is formed in the same manner as the upper phase 113A. In contrast, in the lower phase 114B, differently from the lower phase 113B, the magnetic detection elements 13, 14 are arranged on the side of the second magnetic shield 22A, and the bus bars 230, 240 are arranged on the side of the first magnetic shield 21A. The current sensor 114 can achieve a similar effect to the current sensor 113.

Fifteenth Modification

Figure 19:
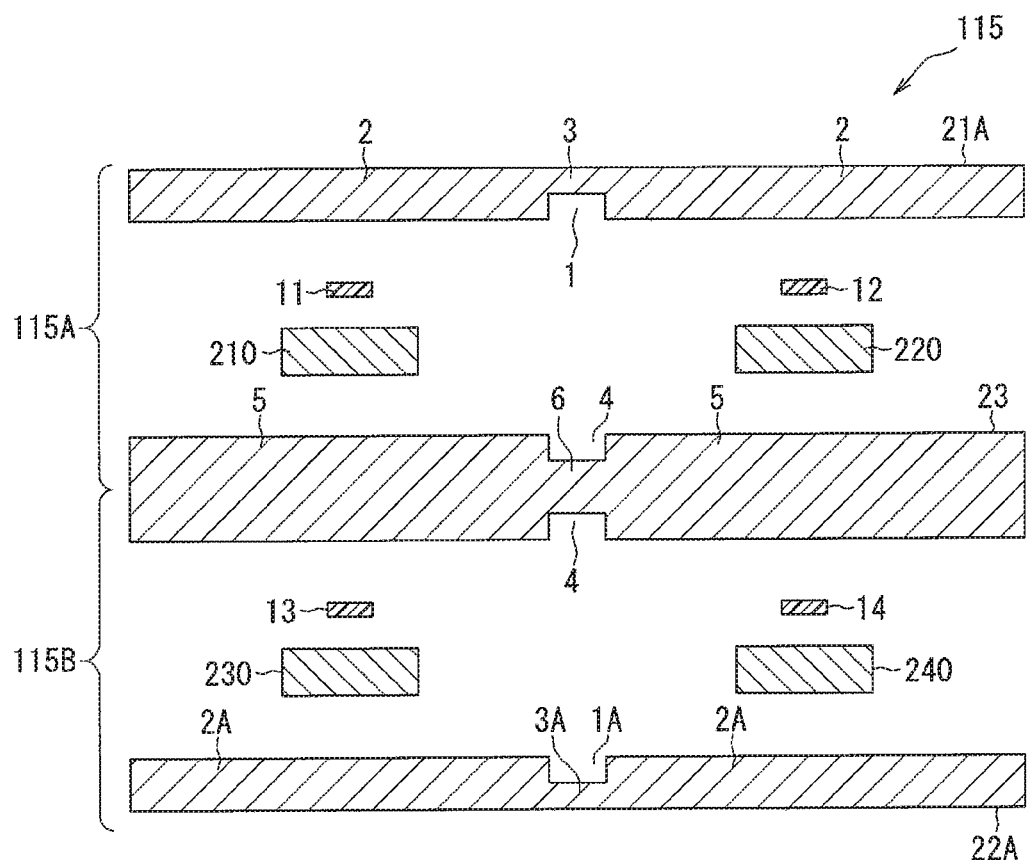
FIG. 19 is a sectional view showing a schematic configuration of a current sensor in a fifteenth modification.

With reference to FIG. 19, a current sensor 115 of the fifteenth modification will be described. The current sensor 115 differs from the current sensor 113 in that an intermediate magnetic shield 23 is constituted as an integrated matter. FIG. 19 is a sectional view corresponding to FIG. 2.

The current sensor 115 includes an upper phase 115A and a lower phase 115B. The intermediate magnetic shield 23 includes two thick portions 5 and a thin portion 6 linking between the two thick portions 5.

The intermediate magnetic shield 23 has the thick portion 5 facing the first magnetic detection element 11 and the third magnetic detection element 13 and the thick portion 5 facing the second magnetic detection element 12 and the fourth magnetic detection element 14. In other words, the intermediate magnetic shield 23 has the thick portion 5 on the side of the first magnetic detection element 11 and the third magnetic detection element 13, and the thick portion 5 on the side of the second magnetic detection element 12 and the fourth magnetic detection element 14. The intermediate magnetic shield 23 has a facing surface facing the first magnetic shield 21A on the upper phase 115A side and a facing surface facing the second magnetic shield 22A on the lower phase 115B side. The thick portion 5 can be called the intermediate base portion. The thin portion 6 can be called the intermediate coupling portion.

In the intermediate magnetic shield 23, the thick portions 5 and the thin portion 6 are provided to thereby form the recess 4 opened on the upper phase 115A side and the recess 4 opened on the lower phase 115B. As thus described, the intermediate magnetic shield 23 can be regarded as being formed of the second magnetic shield 22A of the upper phase 113A and the first magnetic shield 21A of the lower phase 113B in the thirteenth modification as an integrated matter.

The current sensor 115 can achieve a similar effect to that of the current sensor 113. Moreover, with the intermediate magnetic shield 23 being constituted as the integrated matter in the current sensor 115, the size of the current sensor 115 in the Z direction can be reduced. That is, the current sensor 115 can be made smaller than the current sensor 113 in which the second magnetic shield 22A of the upper phase 113A and the first magnetic shield 21A of the lower phase 113B are the intermediate magnetic shields.

Sixteenth Modification

With reference to FIG. 20, a current sensor 116 of the sixteenth modification will be described. The current sensor 116 differs from the current sensor 115 in the positional relationship of the magnetic detection elements 13, 14 and the bus bars 230, 240 in a lower phase 116B. FIG. 20 is a sectional view corresponding to FIG. 2.

The current sensor 116 includes an upper phase 116A and a lower phase 116B. The upper phase 116A is formed in the same manner as the upper phase 115A. In contrast, in the lower phase 116B, differently from the lower phase 115B, the magnetic detection elements 13, 14 are arranged on the side of the second magnetic shield 22A, and the bus bars 230, 240 are arranged on the side of the intermediate magnetic shield 23. The current sensor 116 can achieve a similar effect to that of the current sensor 115.

Seventeenth Modification

Figure 21:
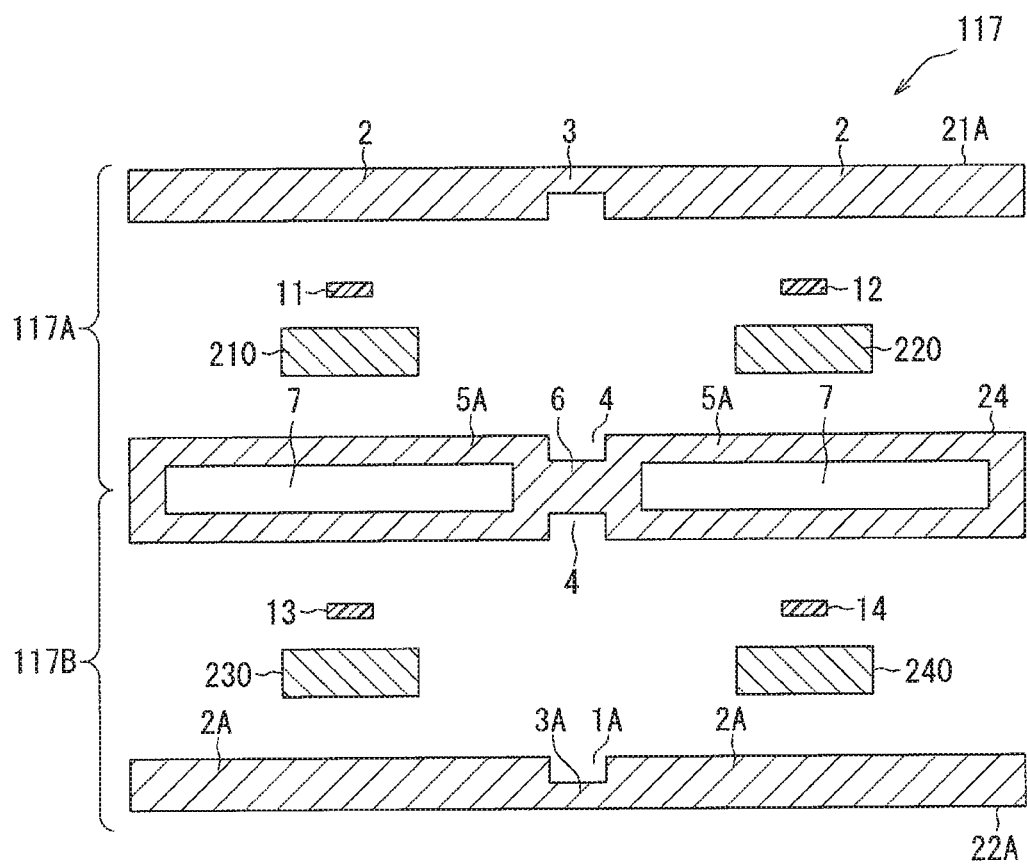
FIG. 21 is a sectional view showing a schematic configuration of a current sensor in a seventeenth modification.

With reference to FIG. 21, a current sensor 117 of the seventeenth modification will be described. The current sensor 117 differs from the current sensor 115 in a configuration of an intermediate magnetic shield 24. FIG. 21 is a sectional view corresponding to FIG. 2.

The current sensor 117 includes an upper phase 117A and a lower phase 117B. The intermediate magnetic shield 24 includes two base portions 5A and a thin portion 6 linking between the two base portions 5A. The intermediate magnetic shield 23 includes the base portion 5A facing the first magnetic detection element 11 and the third magnetic detection element 13 and the base portion 5A facing the second magnetic detection element 12 and the fourth magnetic detection element 14. In other words, the intermediate magnetic shield 23 includes the base portion 5A on the side of the first magnetic detection element 11 and the third magnetic detection element 13, and the base portion 5A on the side of the second magnetic detection element 12 and the fourth magnetic detection element 14. The base portion 5A can be called the intermediate base portion. The thin portion 6 can be called the intermediate coupling portion.

In the base portion 5A, a space portion 7 penetrating in the Y direction is formed. That is, the intermediate magnetic shield 23 can be said to be provided with space portions 7 in a region where the bus bars 210, 220 on the upper phase 117A side and the bus bars 230, 240 on the lower phase 117B side face each other. The space portion 7 corresponds to a nonmagnetic portion. Further, the space portion 7 may be filled with a nonmagnetic material.

The intermediate magnetic shield 24 has a facing surface facing the first magnetic shield 21A on the upper phase 117A side and a facing surface facing the second magnetic shield 22A on the lower phase 117B side. An interval between the facing surfaces of the base portion 5A is larger than the thickness of the thin portion 6 in the Z direction.

The current sensor 117 can achieve a similar effect to that of the current sensor 115. Moreover, since the space portion 7 is formed in the intermediate magnetic shield 24, the current sensor 117 can control the magnetic flow path in the intermediate magnetic shield 24.

Eighteenth Modification

Figure 22:
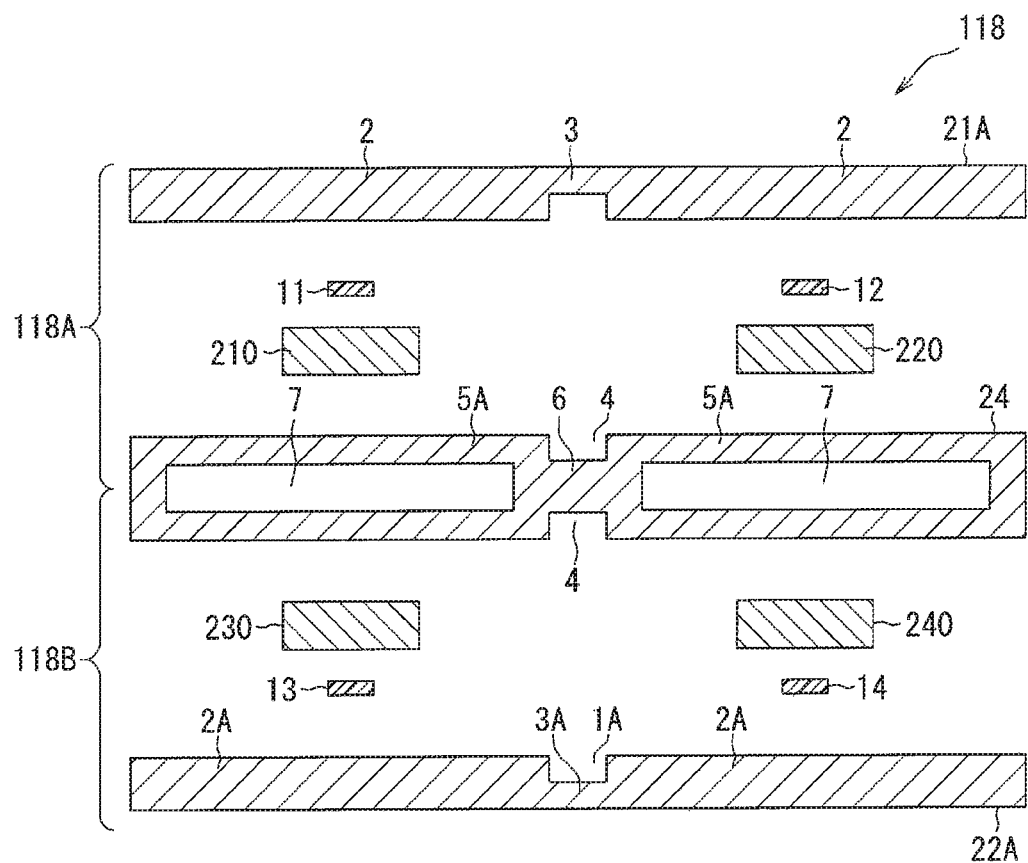
FIG. 22 is a sectional view showing a schematic configuration of a current sensor in an eighteenth modification.

With reference to FIG. 22, a current sensor 118 of the eighteenth modification will be described. The current sensor 118 differs from the current sensor 117 in the positional relationship of the magnetic detection elements 13, 14 and the bus bars 230, 240 in a lower phase 118B. FIG. 22 is a sectional view corresponding to FIG. 2.

The current sensor 118 includes an upper phase 118A and a lower phase 118B. The upper phase 118A is formed in the same manner as the upper phase 117A. In contrast, in the lower phase 118B, differently from the lower phase 117B, the magnetic detection elements 13, 14 are arranged on the side of the second magnetic shield 22A, and the bus bars 230, 240 are arranged on the side of the intermediate magnetic shield 24. The current sensor 118 can achieve a similar effect to the current sensor 117.

Nineteenth Modification

With reference to FIG. 23 to FIG. 26, a current sensor 119 of the nineteenth modification will be described. The current sensor 119 differs from the current sensor 101 in inclusion of three magnetic detection elements 11 to 13 and a shape of a first magnetic shield 21M. Further, differently from the thirteenth modification and other modifications, the current sensor 119 does not have a configuration in which the upper phase and the lower phase are stacked. In other words, the current sensor 119 is a current sensor with a single phase structure. Each of current sensors of the twentieth modification and thereafter described later is also a current sensor with a single phase structure.

In the present modification, as an example, the current sensor 119 is employed which is mounted in a vehicle together with an inverter that converts DC power into three-phase AC power and a motor generator driven by three-phase AC power from the inverter. The current sensor 119 detects a current flowing between the inverter and the motor generator. More specifically, the current sensor 119 individually detects a current flowing in each of the three bus bars 210 to 230 electrically connecting between the inverter and the motor generator.

Further, the current sensor 119 has three phases P1 to P3, which will be described later. Each of the phases P1 to P3 is provided corresponding to each phase between the inverter and the motor generator. Each of the phases P1 to P3 includes one magnetic detection element, a part of the first magnetic shield 21M, and a part of a second magnetic shield 22M. Here, the first magnetic detection element 11 is taken as a magnetic detection element of a first phase P1, the second magnetic detection element 12 is taken as a magnetic detection element of a second phase P2, and the third magnetic detection element 13 is taken as a magnetic detection element of a third phase P3.

In the current sensor 119, the second magnetic shield 22M, the magnetic detection elements 11 to 13, and the first magnetic shield 21M are stacked in this order in the Z direction. Therefore, the Z direction can also be called a stacking direction.

Figure 23:
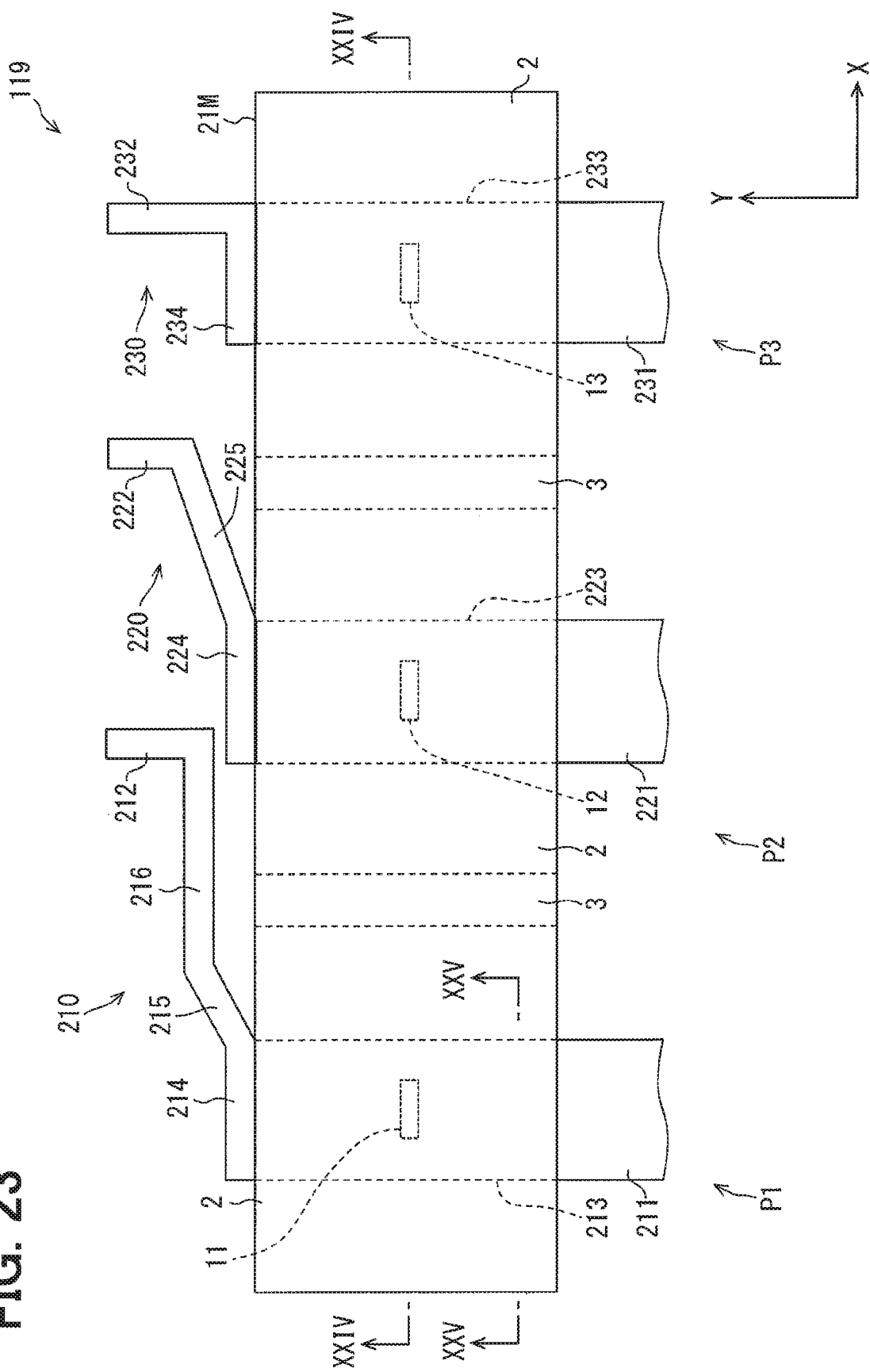
FIG. 23 is a plan view showing a schematic configuration of a current sensor in a nineteenth modification.

First, the three bus bars 210 to 230 will be described. The three bus bars 210 to 230 have, for example, a shape in which platy conductive members are bent. As for the three bus bars 210 to 230, the first bus bar 210 can be called a bus bar of the first phase P1, the second bus bar 220 can be called a bus bar of the second phase P2, and the third bus bar 230 can be called a bus bar of the third phase P3. In the present modification, as shown in FIG. 23, three bus bars 210 to 230 having different shapes are employed. This is because the interval between terminals of the motor generator and the interval between terminals of the inverter are different.

The first bus bar 210 includes a first end 211 which is an end on the motor generator side, and a second end 212 which is an end on the inverter side. Between these ends, the first bus bar 210 includes a faced portion 213, a bend 214, a first extension 215 and a second extension 216. The faced portion 213 is a section disposed in a region where the first magnetic shield 21M and the second magnetic shield 22M face each other. The faced portion 213 is a section facing the first magnetic detection element 11. Therefore, the first magnetic detection element 11 is provided in a region in which the faced portion 213 and the first magnetic shield 21M face each other.

The bend 214 is a section bent from the faced portion 213 in the Z direction. The first extension 215 and the second extension 216 are sections for linking between the bend 214 and the second end 212. As shown in FIG. 23, the first bus bar 210 includes the first extension 215 and the second extension 216 and is thus provided so as to reach the region of the second phase P2 on the Y direction side.

The second bus bar 220 includes a first end 221 which is an end on the motor generator side, and a second end 222 which is an end on the inverter side. Between these ends, the second bus bar 220 includes a faced portion 223, a bend 224, and an extension 225. The faced portion 223 is a section facing the second magnetic detection element 12. Therefore, the second magnetic detection element 12 is provided in a region in which the faced portion 223 and the first magnetic shield 21M face each other.

The configuration (length) of the extension 225 of the second bus bar 220 differs from that of the first bus bar 210. As shown in FIG. 23, the second bus bar 220 includes the extension 225 and is thus provided so as to reach the region of the third phase P3 on the Y direction side.

The third bus bar 230 includes a first end 231 which is an end on the motor generator side, and a second end 232 which is an end on the inverter side. Between these ends, the third bus bar 230 includes a faced portion 233 and a bend 234. As thus described, the third bus bar 230 differs from the first bus bar 210 and the second bus bar 220 in that the bend 234 and the second end 232 are linked to each other without interposing the extension. Further, the faced portion 233 is a section facing the third magnetic detection element 13. Therefore, the third magnetic detection element 13 is provided in a region in which the faced portion 233 and the first magnetic shield 21M face each other.

The bus bars 210 to 230 employed in the present modification are examples. The bus bars 210 to 230 are not limited thereto.

Next, the first magnetic shield 21M and the second magnetic shield 22M will be described. The first magnetic shield 21M has a configuration similar to the configuration in which the number of thick portions 2 of the first magnetic shield 21M is increased to three. In contrast, the second magnetic shield 22M has a configuration similar to the configuration in which the number of thick portions 2A of the second magnetic shield 22A is increased to three.

Figure 24:
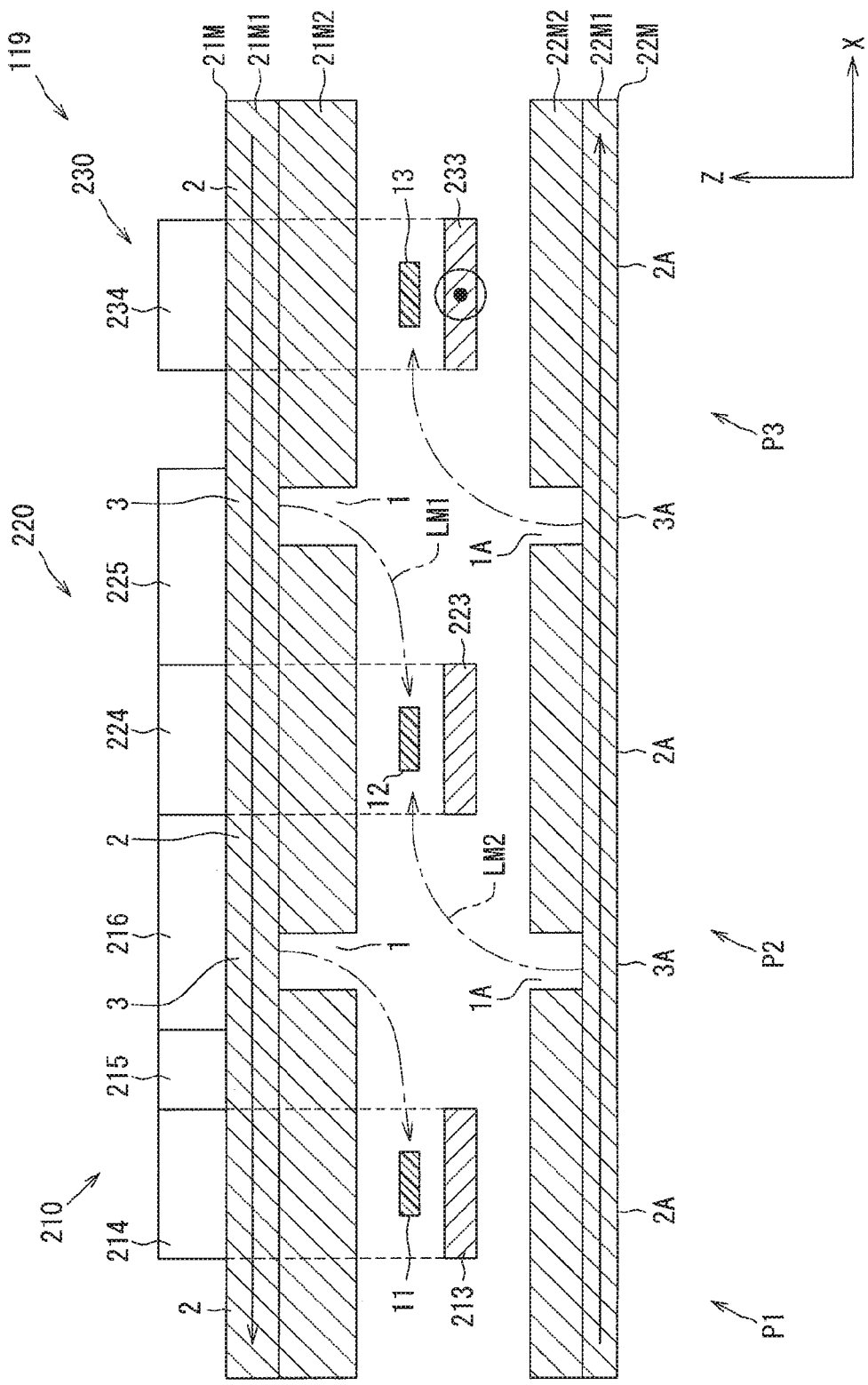
FIG. 24 is a sectional view taken along a line XXIV-XXIV in FIG. 23.

As shown in FIG. 24, the first magnetic shield 21M has three thick portions 2 arranged in the X direction, and the three thick portions 2 are arranged respectively facing the magnetic detection elements 11 to 13. In the first magnetic shield 21M, a surface layer portion 21M1 and a protrusion 21M2 are formed, the surface layer portion 21M1 including a thin portion 3 and an end layer portion provided continuously with the thin portion 3 in each thick portion 2, the protrusion 21M2 protruding from the end layer portion in each thick portion 2. The recess 1 is formed between the protrusions 21M2. That is, the surface layer portion 21M1 can be said to include a part of the thick portion 2 and the thin portion 3. In the present modification, the first magnetic shield 21M including three protrusions 21M2 included in the three respective phases P1 to P3 and two thin portions 3 is employed.

The end layer portion is a section excluding the thin portion 3 in the surface layer portion 21M1, and is a section facing the protrusion 21M2 in the thick portion 2. The end layer portion can also be called a section extending in the X direction with respect to the thin portion 3.

Here, as an example, the first magnetic shield 21M having a structure in which the surface layer portion 21M1 and the protrusion 21M2 are stacked and integrated is employed. In addition, each of the surface layer portion 21M1 and the protrusion 21M2 may be constituted by stacking a plurality of layers made of a magnetic material. However, the first magnetic shield 21M is not limited thereto, and the surface layer portion 21M1 and the protrusion 21M2 may be integrally formed using a mold, or the surface layer portion 21M1 and the protrusion 21M2 may be integrally formed by cutting or the like.

Similarly, in the second magnetic shield 22M, a surface layer portion 22M1 and a protrusion 22M2 are formed, the surface layer portion 22M1 including a thin portion 3A and an end layer portion provided continuously with the thin portion 3A in each thick portion 2A, the protrusion 22M2 protruding from the end layer portion in each thick portion 2A. The recess 1 is formed between the protrusions 22M2. The second magnetic shield 22M is different in the thickness of the surface layer portion 22M1 from the surface layer portion 21M1 of the first magnetic shield 21M, and the other points are the same.

The protrusion 21M2 of the first magnetic shield 21M is disposed facing the protrusion 22M2 of the second magnetic shield 22M. That is, in the current sensor 119, the protrusion 21M2 and the protrusion 22M2 of the first phase P1 are arranged facing each other, the protrusion 21M2 and the protrusion 22M2 of the second phase P2 are arranged facing each other, and the protrusion 21M2 and the protrusion 22M2 of the third phase P3 are arranged facing each other. Each of the magnetic detection elements 11 to 13 is individually disposed in the facing regions of the protrusions 21M2, 22M2 arranged facing each other.

In both the magnetic shields 21M, 22M, the thick portions 2, 2A arranged facing the first magnetic detection element 11 can be called the thick portions 2, 2A of the first phase P1. Therefore, the protrusions 21M2, 22M2 in these thick portions 2, 2A can be called the protrusions 21M2, 22M2 of the first phase P1. Moreover, the end layer portion which is a section facing each of the protrusions 21M2, 22M2 can be called the end layer portion of the first phase P1. The same applies to the thick portions 2, 2A arranged facing the second magnetic detection element 12 and the thick portions 2, 2A arranged facing the third magnetic detection element 13. In addition, it can be said that both the magnetic shields 21M, 22M have thin portions 3, 3A linking between the thick portions 2, 2A of the first phase P1 and the thick portions 2, 2A of the second phase P2, and thin portions 3, 3A linking between the thick portions 2, 2A of the second phase P2 and the thick portions 2, 2A of the third phase P3.

Therefore, the first phase P1 can be said to include the first magnetic detection element 11, the thick portion 2 facing the first magnetic detection element 11 in the first magnetic shield 21M, and the thick portion 2A facing the first magnetic detection element 11 in the second magnetic shield 22M. That is, the first phase P1 is disposed facing the first bus bar 210 and includes the first magnetic detection element 11 that senses a magnetic field generated from the first bus bar 210 and converts the magnetic field into an electric signal.

Similarly, the second phase P2 can be said to include the second magnetic detection element 12, the thick portion 2 facing the second magnetic detection element 12 in the first magnetic shield 21M, and the thick portion 2A facing the second magnetic detection element 12 in the second magnetic shield 22M. That is, the second phase P2 is disposed facing the second bus bar 220 and includes the second magnetic detection element 12 that senses a magnetic field generated from the second bus bar 220 and converts the magnetic field into an electric signal.

The third phase P3 can be said to include the third magnetic detection element 13, the thick portion 2 facing the third magnetic detection element 13 in the first magnetic shield 21M, and the thick portion 2A facing the third magnetic detection element 13 in the second magnetic shield 22M. That is, the third phase P3 is disposed facing the third bus bar 230 and includes the third magnetic detection element 13 that senses a magnetic field generated from the third bus bar 230 and converts the magnetic field into an electric signal.

The current sensor 119 is configured, for example, by integrally assembling each of the phases P1 to P3 via a circuit board and a housing. This circuit board is electrically connected to each of the magnetic detection elements 11 to 13, and a sensor signal from each of the magnetic detection elements 11 to 13 is input. Moreover, the current sensor 119 may be configured by integrally assembling each of the bus bars 210 to 230 in addition to each of the phases P1 to P3 via a circuit board and a housing. As thus described, the structural body in which the bus bars 210 to 230 and the like are integrally assembled can also be referred to as a terminal block. Note that each of the phases P1 to P3 can also be regarded as including the corresponding bus bars 210, 220, 230.

As shown in FIGS. 23 and 24, the three phases P1 to P3 as thus configured are arranged side by side in the X direction, and the thick portions 2, 2A are linked via the thin portions 3, 3A. Further, the phases P1 to P3 can be said to be arranged such that directions (Y direction) in which currents flow in the faced portions 213, 223, 233 are parallel. Hereinafter, phases adjacent to each other are also referred to as adjacent phases. The direction in which the three phases P1 to P3 are arranged can also be called an arrangement direction.

In the present embodiment, an example in which the first phase P1, the second phase P2, and the third phase P3 are arranged in this order in the X direction is employed. Therefore, the second phase P2 can be called an intermediate phase sandwiched between the first phase P1 and the third phase P3. The second phase P2 is an adjacent phase to the first phase P1 and is an adjacent phase to the third phase P3. That is, the first phase P1 and the third phase P3 are not adjacent.

Therefore, each of the magnetic detection elements 11 to 13 is arranged side by side in the X direction. In the first magnetic shield 20, the thick portions 2 are arranged side by side in the X direction. Similarly, in the second magnetic shield 22M, the thick portions 2A are arranged side by side in the X direction. The faced portions 213, 223, 233 corresponding to the respective phases P1 to P3 are also arranged side by side in the X direction.

The current sensor 119 configured as thus described may come into a situation where a relatively large current such as 1200 A flows in the bus bar which is a detection target of a certain phase, and the current sensor detects a current to be detected flowing in the bus bar of a detection target in an adjacent phase to this phase. Note that the bus bar in which a relatively large current flows can be a noise generation source. For this reason, the phase in which this bus bar is the detection target can be called a noise phase. Meanwhile, the phase in which the current to be detected is detected can be called the detection phase. In the present modification, as shown in FIG. 24, a situation where the third phase P3 is the noise phase and the second phase P2 is the detection phase is employed as an example.

The magnetic field generated from the third bus bar 230 being the noise phase is generated concentrically according to the Ampere's right-handed screw rule. This magnetic field concentrates inside the first magnetic shield 21M and the second magnetic shield 22M. In the first magnetic shield 21M and the second magnetic shield 22M, as shown in FIG. 24, a magnetic flux flows, in other words, lines of magnetic force run, in the direction indicated by a solid arrow.

In particular, the current sensor 119 controls the magnetic flow path by providing the recesses 1 in both the magnetic shields 21M, 22M, as described in the above embodiment and modifications, such that the lines of magnetic force run on the outer surfaces of both the magnetic shields 21M, 22M. Therefore, in the current sensor 119, the lines of magnetic force run in both surface layer portions 21M1, 22M1. The lines of magnetic force in the first magnetic shield 21M and the lines of magnetic force in the second magnetic shield 22M are inverse vectors.

The current sensor 119 can thus reduce the leakage magnetic field more than the current sensor of the above comparative example. However, as shown in FIG. 24, in the current sensor 119, a leakage magnetic field may be generated from the recesses 1 due to the sizes of both the surface layer portions 21M1, 22M1 or magnetic fluxes flowing in both the surface layer portions 21M1, 22M1. In the present embodiment, as shown in FIG. 24, an example is employed in which leakage magnetic fields as represented by one-dot chain lines LM1 and LM2 are generated from the recesses 1 in both the magnetic shields 21M, 22M.

When the leakage magnetic fields LM1, LM2 are directed to the second magnetic detection element 12 of the second phase P2 and transmitted through the second magnetic detection element 12, there is the possibility that the leakage magnetic fields LM1, LM2 affect a result of electromagnetic conversion by the second magnetic detection element 12. That is, in the current sensor 119, when the magnetic fields formed from the recesses 1, 1A reach the second magnetic detection element 12, there is the possibility that the leakage magnetic fields affect the result of electromagnetic conversion by the second magnetic detection element 12. The second magnetic detection element 12 corresponds to a magnetic detection element sandwiched between two magnetic detection elements 11, 13.

The vectors of the leakage magnetic fields LM1, LM2 are inverse vectors at the position of the second magnetic detection element 12. Therefore, in the current sensor 119, the shape of at least one of the first magnetic shield 21M and the second magnetic shield 22M is adjusted such that the leakage magnetic field LM1 and the leakage magnetic field LM2 cancel each other out and both the leakage magnetic fields LM1, LM2 do not reach the second magnetic detection element 12 in the intermediate phase. That is, it can be said that in the current sensor 119, the shape of at least one of the first magnetic shield 21M and the second magnetic shield 22M is adjusted so as to cause both the leakage magnetic fields LM1, LM2 to cancel each other out at the position of the second magnetic detection element 12. Therefore, both the magnetic shields 21M, 22M can also be said to have shapes adjusted such that both the leakage magnetic fields LM1, LM2 cancel each other out so as not to reach the second magnetic detection element 12.

In the present modification, an example is employed in which as the shape, the thickness of each of the surface layer portions 21M1, 22M1 is adjusted with respect to a total thickness of each of the magnetic shields 21M, 22M. For example, in the case of the first magnetic shield 21M, the total thickness is the thickness obtained by adding the thickness of the surface layer portion 21M1 and the thickness of the protrusion 21M2. The thickness here is the length in the stacking direction.

Figure 25:
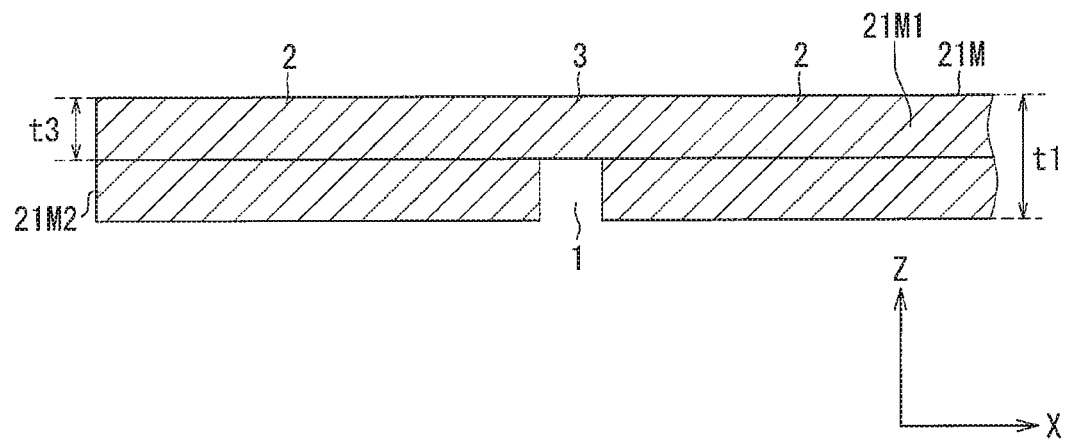
FIG. 25 is a sectional view taken along a line XXV-XXV in FIG. 23.
Figure 26:
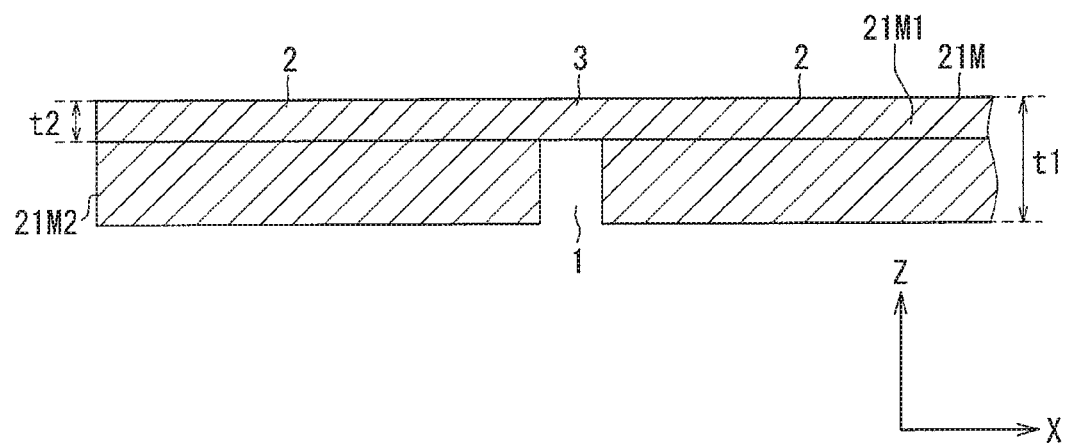
FIG. 26 is a sectional view of a first magnetic shield in a comparison target.

Further, in the present modification, a total thickness t1 of the first magnetic shield 21M and a total thickness t1 of the second magnetic shield 22M are the same. Then, in the present modification, as shown in FIGS. 25 and 26, an example is employed in which a thickness t3 of the surface layer portion 21M1 of the first magnetic shield 21M is adjusted so as to be larger than a thickness t2 of the surface layer portion 22M1 of the second magnetic shield 22M. FIG. 25 is an enlarged view of a part of the first magnetic shield 21M in FIG. 24.

Therefore, in the first magnetic shield 21M, a thickness (t1−t3) of the protrusion 21M2 is smaller than a thickness (t1−t2) of the protrusion 22M2 of the second magnetic shield 22M. FIG. 26 is a sectional view of a case where the surface layer portion 21M1 of the first magnetic shield 21M has the same thickness as the surface layer portion 22M1 of the second magnetic shield 22M. Therefore, the second magnetic shield 22M can be regarded as having a shape and a size similar to the first magnetic shield 21M shown in FIG. 26.

However, the present disclosure is not limited thereto. According to the present disclosure, at least one of the thickness of the surface layer portion 21M1 with respect to the total thickness of the first magnetic shield 21M and the thickness of the surface layer portion 22M1 with respect to the total thickness of the second magnetic shield 22M may be adjusted in accordance with the states of the leakage magnetic fields LM1, LM2.

In each of the surface layer portions 21M1, 22M1, the amount of the leakage magnetic field decreases with increase in thickness, and the amount of the leakage magnetic field increases with decrease in thickness. That is, the current sensor 119 is configured such that the thickness of at least one of the surface layer portions 21M1, 22M1 is adjusted to control the amount of the leakage magnetic field, so as to cause the leakage magnetic field LM1 and the leakage magnetic field LM2 to cancel each other out at the position of the second magnetic detection element 12. Therefore, in the present embodiment, it is configured such that the amount of the leakage magnetic field LM1 from the recess 1 in the first magnetic shield 21M is decreased to cause both the leakage magnetic fields LM1, LM2 to cancel each other out at the position of the second magnetic detection element 12.

It can be said that in the current sensor 119, at least one of the thickness of the surface layer portion 21M1 and the thickness of the surface layer portion 22M1 is adjusted to control the amount of the leakage magnetic field, so as to prevent the leakage magnetic field LM1 and the leakage magnetic field LM2 from affecting the second magnetic detection element 12. Moreover, the current sensor 119 can be said to be configured such that the leakage magnetic field LM1 and the leakage magnetic field LM2 are mutually weakened at the position of the second magnetic detection element 12.

The thickness of the surface layer portion 21M1 with respect to the total thickness of the first magnetic shield 21M can be adjusted by the number of stacked layers of the magnetic material constituting the surface layer portion 21M1 and the number of stacked layers of the magnetic material constituting the protrusion 21M2. The same also applies to the case of adjusting the thickness of the surface layer portion 22M1 with respect to the total thickness of the second magnetic shield 22M.

The thickness of the surface layer portion 21M1 and the thickness of the surface layer portion 22M1 can be set to such values that both the leakage magnetic fields LM1, LM2 cancel each other out at the position of the second magnetic detection element 12 by simulation, experiment, or the like.

As described above, in the current sensor 119, the thickness of at least one of the surface layer portions 21M1, 22M1 is adjusted such that the leakage magnetic field LM1 and the leakage magnetic field LM2 cancel each other out at the position of the second magnetic detection element 12. Therefore, in the current sensor 119, even when the leakage magnetic fields LM1, LM2 are generated from the recesses 1 in the magnetic shields 21M, 22M toward the second magnetic detection element 12, it is possible to prevent the second magnetic detection element 12 from sensing these leakage magnetic fields LM1, LM2. The current sensor 119 can thus detect a current with high accuracy. Needless to say, the current sensor 119 can achieve a similar effect to that of the current sensors 100, 101.

Moreover, also when the magnetic detection element of the detection phase senses the magnetic field generated from the bus bar of the noise phase, there is the possibility that the result of the electromagnetic conversion is affected. For example, when the first phase P1 is the noise phase and the second phase P2 is the detection phase, the second magnetic detection element 12 may be influenced by the magnetic field generated from the extension 215, the second extension 216, and the like of the first bus bar 210. Hence, in the current sensor 119, the thicknesses of the first surface layer portions 21M1, 22M1 are preferably set so as to prevent not only the leakage magnetic fields LM1, LM2 but also the magnetic field generated from the first bus bar 210 from reaching the second magnetic detection element 12.

Note that the nineteenth modification can be implemented in combination with each of the tenth to twelfth modifications. Even in this case, it is possible to achieve a similar effect to that of the current sensor 119. In the current sensor 119, it is possible to employ each of the two magnetic shields 21M, 22M also having a shape similar to the first magnetic shield 21B of the second modification or the first magnetic shield 21C of the third modification. In the case of employing the first magnetic shield 21B, the current sensor 119 has a configuration in which the thickness of the thin portion 3B is adjusted. Meanwhile, in the case of employing the first magnetic shield 21C of the third modification, the current sensor 119 has a configuration in which the thickness of the lid portion 3C is adjusted. These points also apply to the following modifications.

Twentieth Modification

Figure 27:
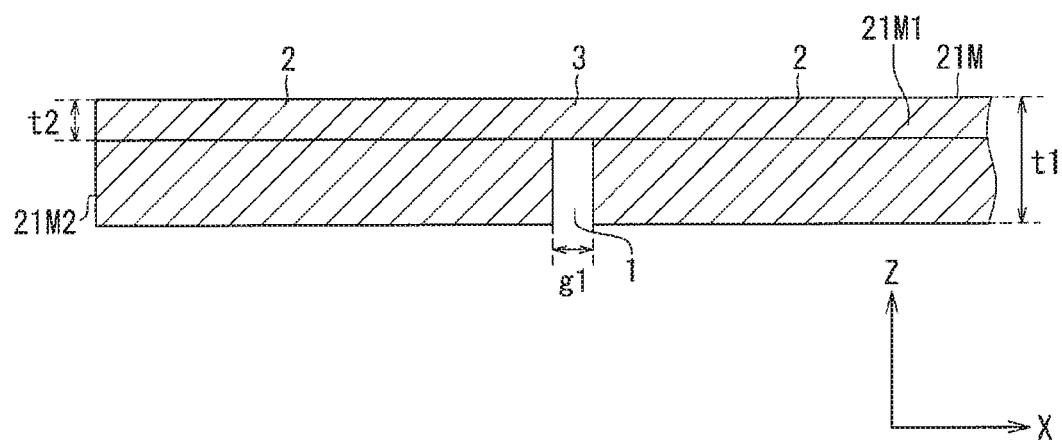
FIG. 27 is a sectional view showing a schematic configuration of a first magnetic shield in a twentieth modification.

With reference to FIG. 27, a current sensor of the twentieth modification will be described. In the present modification, the same reference numerals as in the nineteenth modification are employed for the sake of convenience. In addition, FIG. 27 only shows the first magnetic shield 21M as an example. FIG. 27 is a sectional view corresponding to FIG. 25.

The current sensor of the twentieth modification differs from the current sensor 119 in that an interval g1 between the protrusions is adjusted. That is, in the current sensor, the interval g1 in at least one of the two magnetic shields 21M, 22M is adjusted such that the leakage magnetic field LM1 and the leakage magnetic field LM2 cancel each other out at the position of the second magnetic detection element 12, for example. In other words, the interval g1 between protrusions adjacent to each other across the recess 1 is adjusted as the shape of at least one of the two magnetic shields 21M, 22M.

This interval g1 is, for example, the distance in the X direction between the protrusion 21M2 of the first phase P1 and the protrusion 21M2 of the second phase P2 in the first magnetic shield 21M. The interval g1 here can also be called the width of the recess 1 in the X direction.

In each of the magnetic shields 21M, 22M, the amount of the leakage magnetic field decreases with decrease in the interval g1, and the amount of the leakage magnetic field increases with increase in the interval g1. Therefore, the current sensor is configured such that the interval g1 in at least one of the two magnetic shields 21M, 22M is adjusted to control the amount of the leakage magnetic field, so as to cause the leakage magnetic field LM1 and the leakage magnetic field LM2 to cancel each other out at the position of the magnetic detection element which is the detection phase. For example, the current sensor is configured such that the interval g1 in the first magnetic shield 21M is smaller than the interval g1 in the second magnetic shield 22M.

The twentieth modification can achieve a similar effect to that of the nineteenth modification. The present disclosure can also be implemented by combining the technique disclosed in the twentieth modification with the technique disclosed in the nineteenth modification. Even in this case, it is possible to achieve a similar effect to that of the twentieth modification.

Twenty-First Modification

Figure 28:
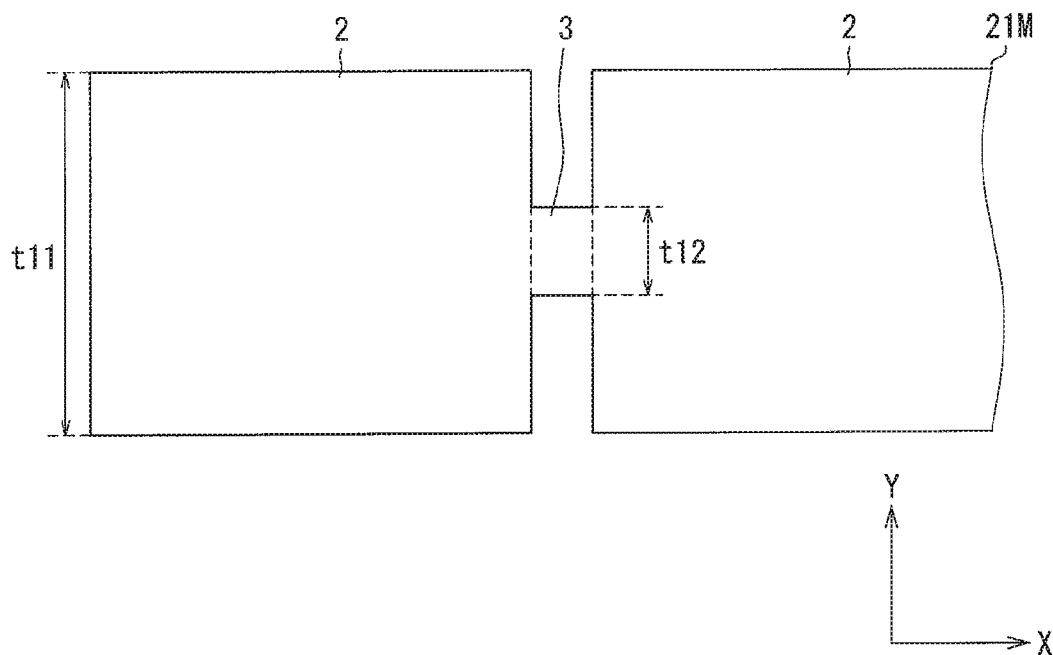
FIG. 28 is a sectional view showing a schematic configuration of a first magnetic shield in a twenty-first modification.

With reference to FIG. 28, a current sensor of the twenty-first modification will be described. In the present modification, the same reference numerals as in the nineteenth modification are employed for the sake of convenience. In addition, FIG. 28 only shows the first magnetic shield 21M as an example. FIG. 28 is a sectional view corresponding to FIG. 25.

The current sensor of the twenty-first modification differs from the current sensor 119 in that a length t12 of each of the thin portions 3, 3A is adjusted. That is, in the current sensor, the length t12 of each of the thin portions 3, 3A in at least one of the two magnetic shields 21M, 22M is adjusted such that the leakage magnetic field LM1 and the leakage magnetic field LM2 cancel each other out at the position of the second magnetic detection element 12, for example. In other words, the length t12 of each of the thin portion 3, 3A in facing sections is adjusted as the shape of at least one of the two magnetic shields 21M, 22M.

This length t12 is the length of the thin portion 3 in the Y direction. The length t12 can also be called the length of the thin portion 3 in the stacking direction and the direction orthogonal to the arrangement direction. The length t11 of the thick portion 2, which will be described later, is the length in the Y direction likewise with t12.

As shown in FIG. 28, in the first magnetic shield 21M, only parts of the respective facing sections of the thick portions 2 adjacent to each other across the thin portion 3 are linked via the thin portion 3. For example, in the thick portion 2 of the first phase P1 and the thick portion 2 of the second phase P2, only parts of the respective facing sections are linked via the thin portion 3 in the Z direction and the Y direction. Hence, the length t11 of the thick portion 2 is larger than the length t12 of the thin portion 3. In the first magnetic shield 21M, a recess is thus formed between adjacent thick portions 2 on the XY plane.

In the second magnetic shield 22M, likewise with the first magnetic shield 21M, only parts of the respective facing sections of the thick portions 2A adjacent to each other across the thin portion 3A are linked to each other via the thin portion 3A. However, in the current sensor, at least one of the two magnetic shields 21M, 22M may have a configuration in which only parts of the respective facing portions are linked, as described above. Thus, for example, one of the two magnetic shields 21M, 22M may have a configuration in which the whole is linked in the Y direction, as employed in the nineteenth modification.

In each of the magnetic shields 21M, 22M, the amount of the leakage magnetic field decreases with increase in the length t12, and the amount of the leakage magnetic field increases with decrease in the length t12. Therefore, the current sensor is configured such that the length t12 of at least one of the two magnetic shields 21M, 22M is adjusted to control the amount of the leakage magnetic field, so as to cause the leakage magnetic field LM1 and the leakage magnetic field LM2 to cancel each other out at the position of the magnetic detection element which is the detection phase. For example, the current sensor is configured such that the length t12 in the first magnetic shield 21M is smaller than the length t12 in the second magnetic shield 22M.

The twenty-first modification can achieve a similar effect to that of the nineteenth modification. The present disclosure can also be implemented by combining the technique disclosed in the twenty-first modification with the techniques disclosed in the nineteenth and twentieth modifications. Even in this case, it is possible to achieve a similar effect to that of the twenty-first modification.

Twenty-Second Modification

Figure 29:
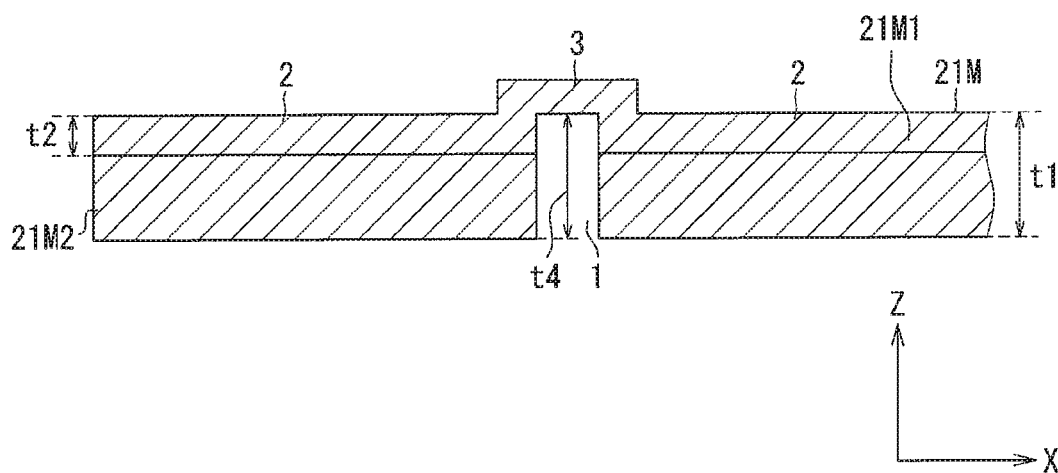
FIG. 29 is a sectional view showing a schematic configuration of a first magnetic shield in a twenty-second modification.

With reference to FIG. 29, a current sensor of the twenty-second modification will be described. In the present modification, the same reference numerals as in the nineteenth modification are employed for the sake of convenience. In addition, FIG. 29 only shows the first magnetic shield 21M as an example. FIG. 29 is a sectional view corresponding to FIG. 25.

In the current sensor of the twenty-second modification, a shape similar to that of the first magnetic shield 21D of the fourth modification is employed in at least one of the two magnetic shields 21M, 22M. The current sensor of the twenty-second modification differs from the current sensor 119 in that a depth t4 of each of the recesses 1, 1A is adjusted. That is, in the current sensor, the depth t4 of each of the recesses 1, 1A in at least one of the two magnetic shields 21M, 22M is adjusted such that the leakage magnetic field LM1 and the leakage magnetic field LM2 cancel each other out at the position of the second magnetic detection element 12, for example. In other words, the depth t4 of each of the recesses 1, 1A is adjusted as the shape of at least one of the two magnetic shields 21M, 22M. This depth t4 is the length in the Z direction.

In the current sensor, at least one of the two magnetic shields 21M, 22M may have a configuration shown in FIG. 29. Thus, for example, one of the two magnetic shields 21M, 22M may have the configuration employed in the nineteenth modification.

In each of the magnetic shields 21M, 22M, the amount of the leakage magnetic field decreases with increase in the depth t4, and the amount of the leakage magnetic field increases with decrease in the depth t4. Therefore, the current sensor is configured such that the depth t4 of at least one of the two magnetic shields 21M, 22M is adjusted to control the amount of the leakage magnetic field, so as to cause the leakage magnetic field LM1 and the leakage magnetic field LM2 to cancel each other out at the position of the magnetic detection element which is the detection phase. For example, the current sensor is configured such that the depth t4 of the first magnetic shield 21M is smaller than the depth t4 of the second magnetic shield 22M.

The twenty-second modification can achieve a similar effect to that of the nineteenth modification. The present disclosure can also be implemented by combining the technique disclosed in the twenty-second modification with each of the techniques disclosed in the nineteenth to twenty-first modifications. Even in this case, it is possible to achieve a similar effect to that of twenty-second modification. Moreover, the twenty-second modification can achieve a similar effect to that of the fourth modification.

Twenty-Third Modification

Figure 30:
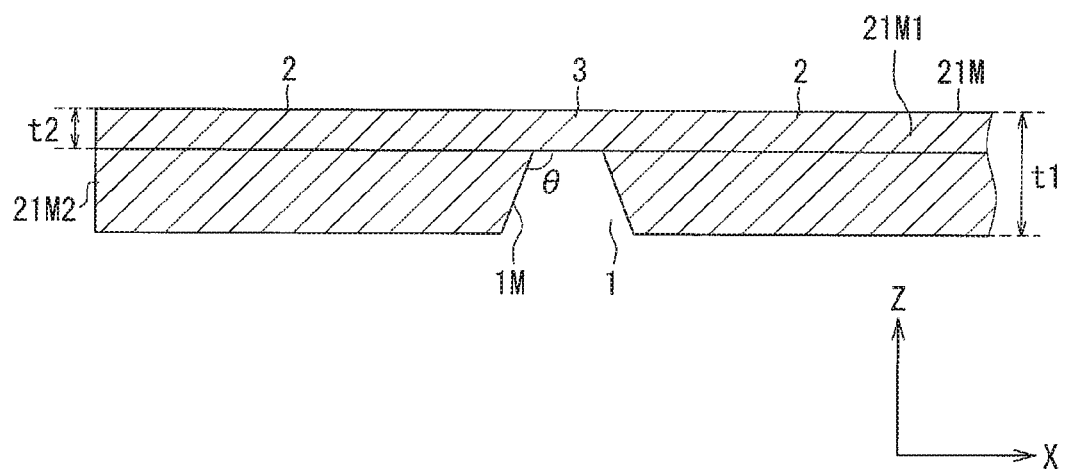
FIG. 30 is a sectional view showing a schematic configuration of a first magnetic shield in a twenty-third modification.

With reference to FIG. 30, a current sensor of the twenty-third modification will be described. In the present modification, the same reference numerals as in the nineteenth modification are employed for the sake of convenience. In addition, FIG. 30 only shows the first magnetic shield 21M as an example. This FIG. 30 is a sectional view corresponding to FIG. 25.

In the current sensor of the twenty-third modification, a similar shape to that of the first magnetic shield 21E of the fifth modification is employed in at least one of the two magnetic shields 21M, 22M. The current sensor of the twenty-third modification differs from the current sensor 119 in that an inclination angle θ in an inclined portion 1M corresponding to the inclined portion 1E of the first magnetic shield 21E is adjusted. That is, in the current sensor, the inclination angle θ in at least one of the two magnetic shields 21M, 22M is adjusted such that the leakage magnetic field LM1 and the leakage magnetic field LM2 cancel each other out at the position of the second magnetic detection element 12, for example. In other words, the inclination angle θ is adjusted as the shape of at least one of the two magnetic shields 21M, 22M. This inclination angle θ corresponds to an angle between the bottom surface of the recess 1 and the side surface (inclined portion 1M) on the XZ plane.

In the current sensor, at least one of the two magnetic shields 21M, 22M may have the configuration shown in FIG. 30. Thus, for example, one of the two magnetic shields 21M, 22M may have the configuration employed in the nineteenth modification.

In each of the magnetic shields 21M, 22M, the amount of the leakage magnetic field decreases with decrease in the inclination angle θ, and the amount of the leakage magnetic field increases with increase in the inclination angle θ. Therefore, the current sensor is configured such that the inclination angle θ in at least one of the two magnetic shields 21M, 22M is adjusted to control the amount of the leakage magnetic field, so as to cause the leakage magnetic field LM1 and the leakage magnetic field LM2 to cancel each other out at the position of the magnetic detection element which is the detection phase. For example, the current sensor is configured such that the inclination angle θ in the first magnetic shield 21M is smaller than the inclination angle θ in the second magnetic shield 22M.

The twenty-third modification can achieve a similar effect to that of the nineteenth modification. The present disclosure can also be implemented by combining the technique disclosed in the twenty-third modification with each of the techniques disclosed in the nineteenth to twenty-second modifications. Even in this case, it is possible to achieve a similar effect to that of the twenty-third modification. Moreover, the twenty-third modification can achieve a similar effect to that of the fifth modification.

Further, in the current sensor of the twenty-third modification, the same shape as that of the first magnetic shield 21F of the sixth modification can be employed in at least one of the two magnetic shields 21M, 22M. Even in this case, it is possible to achieve a similar effect. Moreover, in this case, in the current sensor, the amount of the leakage magnetic field can be adjusted by the depth of the recess 1 in addition to the inclination angle θ.

Twenty-Fourth Modification

Figure 31:
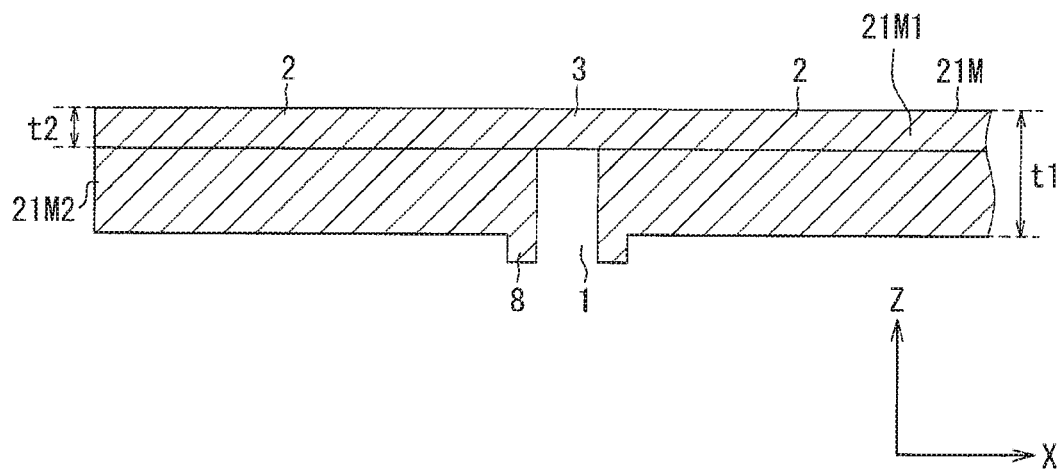
FIG. 31 is a sectional view showing a schematic configuration of a first magnetic shield in a twenty-fourth modification.

With reference to FIG. 31, a current sensor of the twenty-fourth modification will be described. In the present modification, the same reference numerals as in the nineteenth modification are employed for the sake of convenience. In addition, FIG. 31 only shows the first magnetic shield 21M as an example. FIG. 31 is a sectional view corresponding to FIG. 25.

In the current sensor of the twenty-fourth modification, a shape is employed in which a protrusion 8 is formed in at least one of the two magnetic shields 21M, 22M. For example, as shown in FIG. 31, the first magnetic shield 21M has protrusions 8 formed at a position along the recess 1 in the thick portion 2. The current sensor of the twenty-fourth modification differs from the current sensor 119 in that the length of the protrusion 8 is adjusted. That is, in the current sensor, the length of the protrusion 8 in at least one of the two magnetic shields 21M, 22M is adjusted such that the leakage magnetic field LM1 and the leakage magnetic field LM2 cancel each other out at the position of the second magnetic detection element 12, for example. In other words, the length of the protrusion 8 is adjusted as the shape of at least one of the two magnetic shields 21M, 22M. This length is the length in the Z direction.

In the current sensor, at least one of the two magnetic shields 21M, 22M may have the structure shown in FIG. 31. Thus, for example, one of the two magnetic shields 21M, 22M may have the configuration employed in the nineteenth modification.

In each of the magnetic shields 21M, 22M, the amount of the leakage magnetic field decreases with increase in the protrusion 8, and the amount of the leakage magnetic field increases with decrease in the length of the protrusion 8. Therefore, the current sensor is configured such that the length of the protrusion 8 in at least one of the two magnetic shields 21M, 22M is adjusted to control the amount of the leakage magnetic field, so as to cause the leakage magnetic field LM1 and the leakage magnetic field LM2 to cancel each other out at the position of the magnetic detection element which is the detection phase. For example, the current sensor is configured such that the length of the protrusion 8 in the first magnetic shield 21M is smaller than the length of the protrusion 8 in the second magnetic shield 22M.

The twenty-fourth modification can achieve a similar effect to that of the nineteenth modification. The present disclosure can also be implemented by combining the technique disclosed in the twenty-fourth modification with each of the techniques disclosed in the nineteenth to twenty-third modifications. Even in this case, it is possible to achieve a similar effect to that of the twenty-fourth modification. In the twenty-fourth modification, the amount of the leakage magnetic field can be adjusted by adjusting the length of at least one of the two protrusions 8 along the recess 1.

Twenty-Fifth Modification

Figure 32:
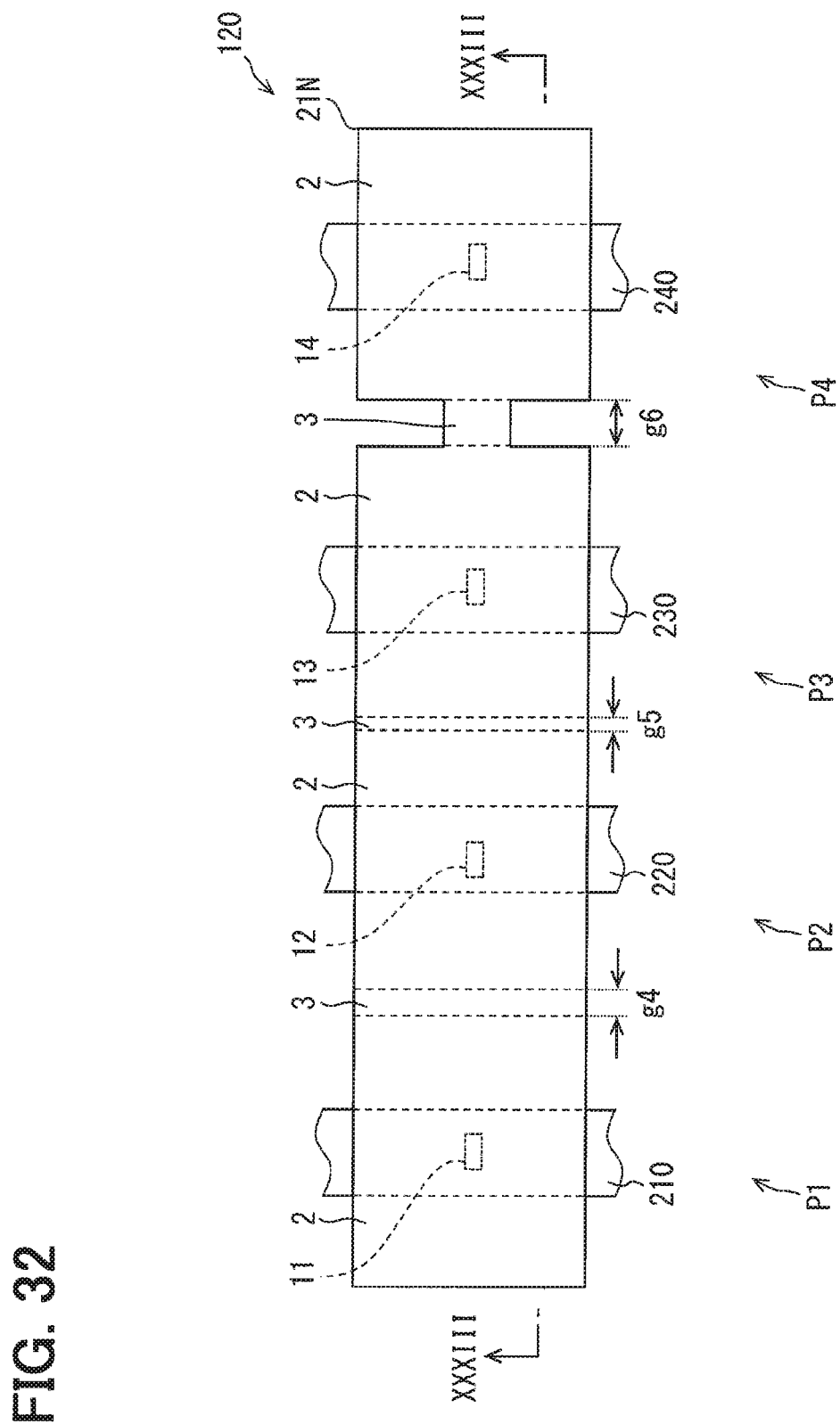
FIG. 32 is a plan view showing a schematic configuration of a current sensor in a twenty-fifth modification.
Figure 33:
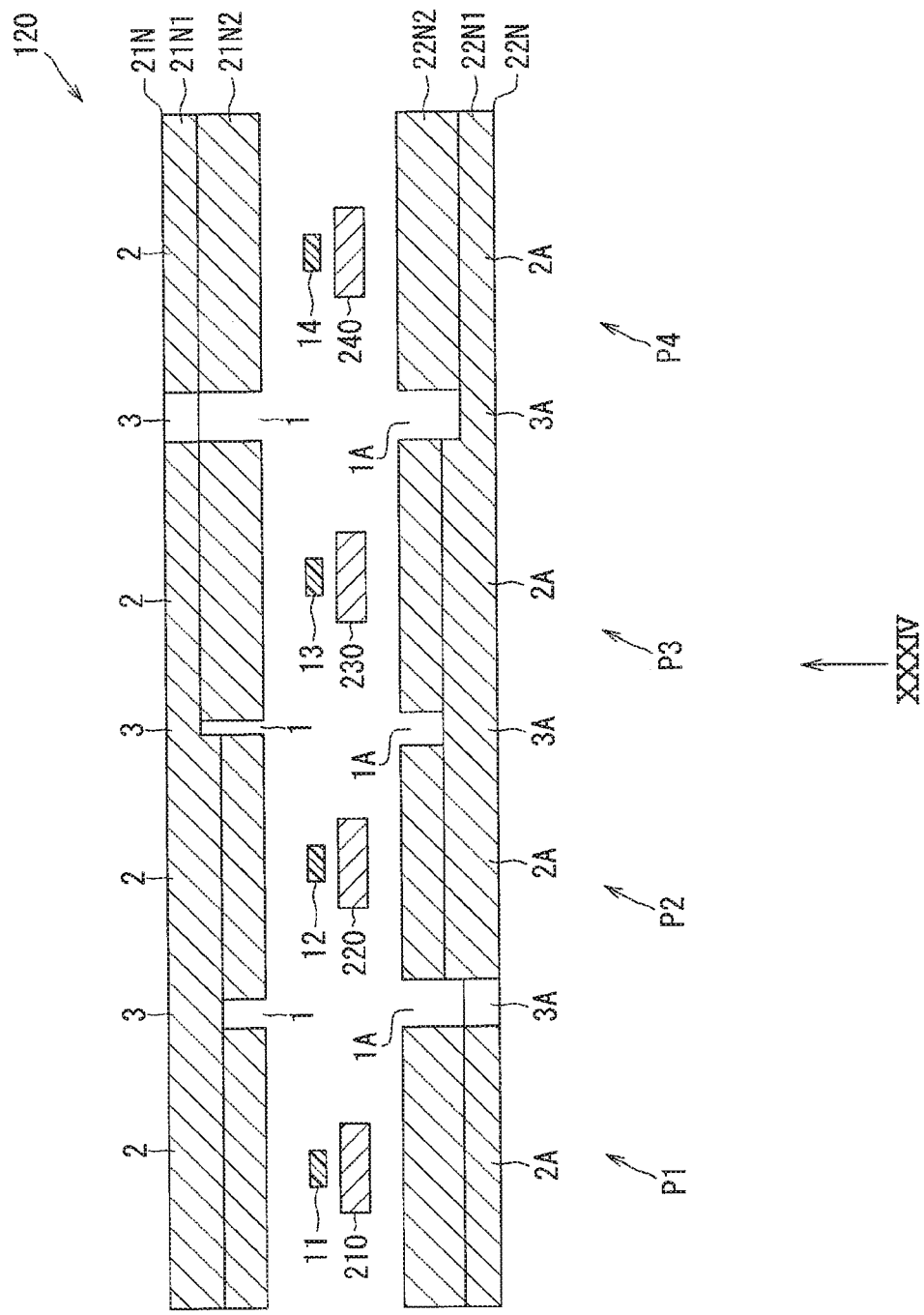
FIG. 33 is a sectional view taken along a line XXXIII-XXXIII in FIG. 32.
Figure 34:
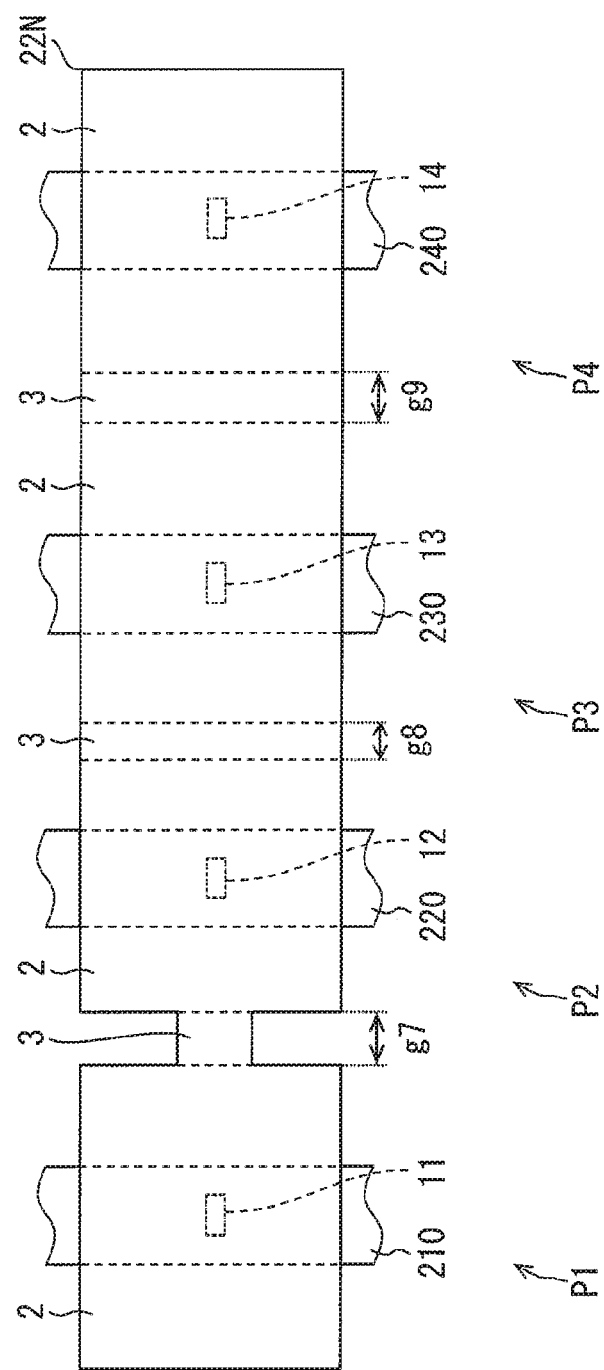
FIG. 34 is a plan view in a XXXIV direction in FIG. 33.

With reference to FIGS. 32 to 34, a current sensor 120 of the twenty-fifth modification will be described. In the present modification, the same reference numerals as in the nineteenth modification are employed for some reference numerals for the sake of convenience. In the current sensor 120, the number of phases and the configuration of the two magnetic shields 21N and 22N are different from those of the current sensor 119. Further, the current sensor 120 can be regarded as an example of a configuration in which the techniques of the nineteenth to twenty-first modifications are combined.

As shown in FIGS. 32, 33, and 34, the current sensor 120 has a fourth phase P4 corresponding to the fourth bus bar 240 in addition to the first phase P1 to the third phase P3. The fourth phase P3 includes the fourth magnetic detection element 14 and the thick portions 2, 2A in the same manner as the other phases P1 to P3. Further, the fourth magnetic detection element 14 is disposed facing the fourth bus bar 240 and has a similar configuration to the other magnetic detection elements 11 to 13.

The first magnetic shield 21N includes a surface layer portion 21N1 and a protrusion 21N2. In the first magnetic shield 21N, the thickness of the surface layer portion 21N1 is adjusted as in the nineteenth modification. That is, as shown in FIG. 33, in the first magnetic shield 21N, adjustment is made such that the thicknesses of the surface layer portions 21N1 of the first phase P1 and the second phase P2 are the same, that the thicknesses of the surface layer portions 21N1 of the third phase P3 and the fourth phase P4 are the same, and that the thicknesses of the surface layer portions 21N1 of the first phase P1 and the third phase P3 are different.

Further, in the first magnetic shield 21N, the interval is adjusted as in the twentieth modification. That is, as shown in FIGS. 32 and 33, in the first magnetic shield 21N, adjustment is made such that an interval g4 between the first phase P1 and the second phase P2, an interval g5 between the second phase P2 and the third phase P3, and an interval g6 between the third phase P3 and the fourth phase P4 are different. These intervals are $g5<g4<g6$.

Moreover, in the first magnetic shield 21N, the length of the thin portion 3 is adjusted as in the twenty-first modification. That is, in the first magnetic shield 21N, as shown in FIG. 32, the length of the thin portion 3 between the third phase P3 and the fourth phase P4 is adjusted to be smaller than the lengths of the other thin portions 3.

Meanwhile, the second magnetic shield 22N includes a surface layer portion 22N1 and a protrusion 22N2. In the second magnetic shield 22N, the thickness of the surface layer portion 22N1 is adjusted as in the nineteenth modification. That is, as shown in FIG. 33, in the second magnetic shield 22N, adjustment is made such that the thicknesses of the surface layer portions 22N1 of the second phase P2 and the third phase P3 are the same, that the thicknesses of the surface layer portions 22N1 of the first phase P1 and the fourth phase P4 are the same, and that the thicknesses of the surface layer portions 22N1 of the first phase P1 and the second phase P2 are different.

Further, in the second magnetic shield 22N, the interval is adjusted as in the twentieth modification. That is, as shown in FIGS. 33 and 34, in the second magnetic shield 22N, adjustment is made such that an interval g7 between the first phase P1 and the second phase P2, an interval g8 between the second phase P2 and the third phase P3, and an interval g9 between the third phase P3 and the fourth phase P4 are different. These intervals are $g8<g7=g9$.

In the second magnetic shield 22N, the length of the thin portion 3 is adjusted as in the twenty-first modification. That is, in the second magnetic shield 22N, as shown in FIG. 34, the length of the thin portion 3 between the first phase P1 and the second phase P2 is adjusted to be smaller than the lengths of the other thin portions 3.

The current sensor 120 thus configured is adjusted in shape such that the leakage magnetic fields LM1, LM2 from the recesses 1, 1A do not reach the magnetic detection elements of the detection phase. Therefore, the twenty-fifth modification can achieve a similar effect to that of the nineteenth modification.

Twenty-Sixth Modification

Figure 35:
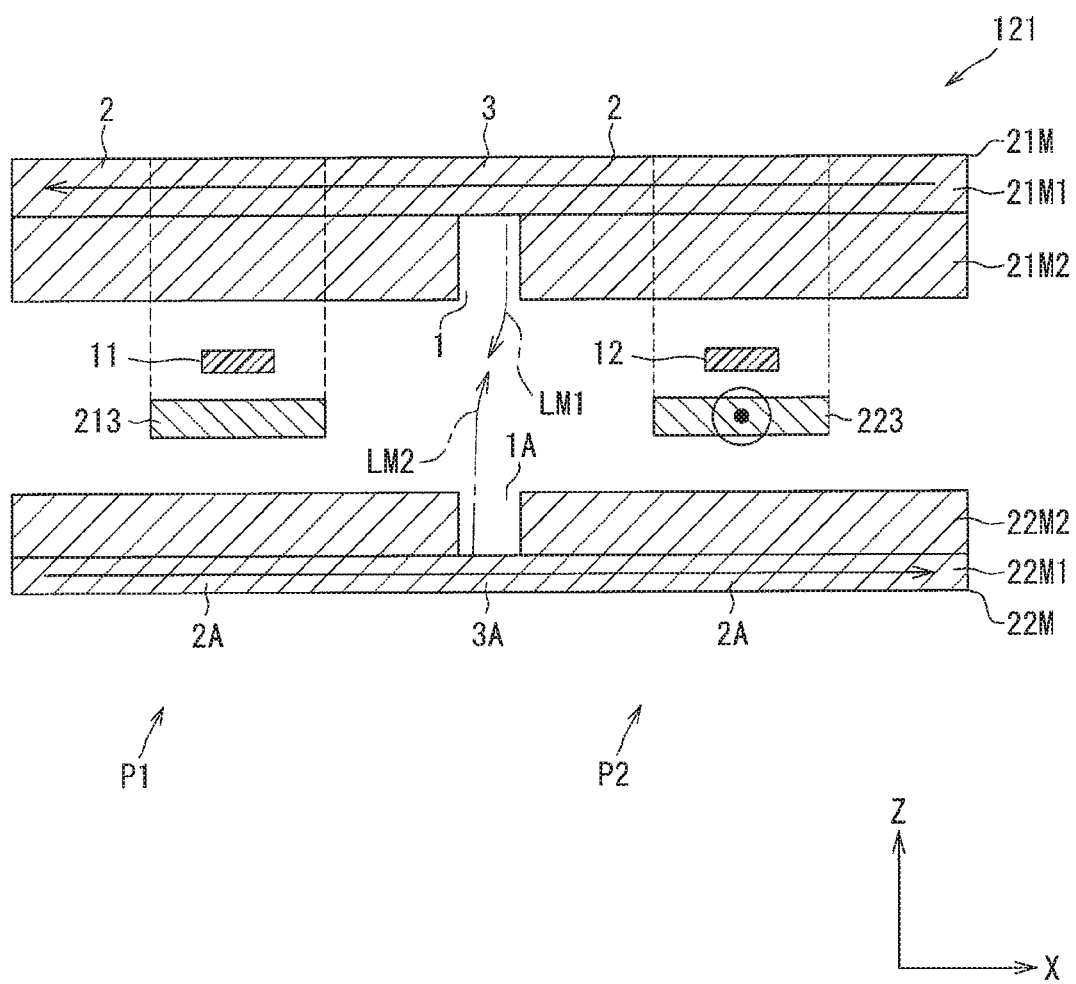
FIG. 35 is a plan view showing a schematic configuration of a current sensor in a twenty-sixth modification.

With reference to FIG. 35, a current sensor 121 of the twenty-sixth modification will be described. In the present modification, the same reference numerals as in the nineteenth modification are employed for the sake of convenience. FIG. 35 is a sectional view corresponding to FIG. 24. However, in order to simplify the drawing, FIG. 35 only shows the faced portions 213, 223 concerning the first bus bar 210 and the second bus bar 220.

The current sensor 121 differs from the current sensor 119 in that the number of phases is two. That is, the current sensor 121 has the first phase P1 and the second phase P2 but does not have the third phase P3.

Even with such a current sensor 121, one phase may be the noise phase and the other phase may be the detection phase. In the present modification, as shown in FIG. 35, a situation where the second phase P2 is the noise phase and the first phase P1 is the detection phase is employed as an example. In this case, in the current sensor 121, when the magnetic fields formed from the recesses 1, 1A reach the first magnetic detection element 11, there is the possibility that the leakage magnetic fields affect the result of electromagnetic conversion by the first magnetic detection element 11.

Therefore, likewise with the nineteenth modification, at least one of the thicknesses of the surface layer portions 21M1, 22M1 with respect to the total thickness of the magnetic shields 21M, 22M is adjusted as the shape of the current sensor 121. Therefore, both the magnetic shields 21M, 22M can also be said to have shapes adjusted such that both the leakage magnetic fields LM1, LM2 cancel each other out so as not to reach the first magnetic detection element 11.

The twenty-sixth modification can achieve a similar effect to that of the nineteenth modification. The present disclosure can also be implemented by combining the technique disclosed in the twenty-sixth modification with each of the techniques disclosed in the nineteenth to twenty-fifth modifications. Even in this case, it is possible to achieve a similar effect to that of the twenty-sixth modification. Further, in the current sensor 121 of the twenty-sixth modification, even when the first phase P1 and the second phase P2 are two phases out of three or more phases, a similar effect can be achieved.

Second Embodiment

Figure 36:
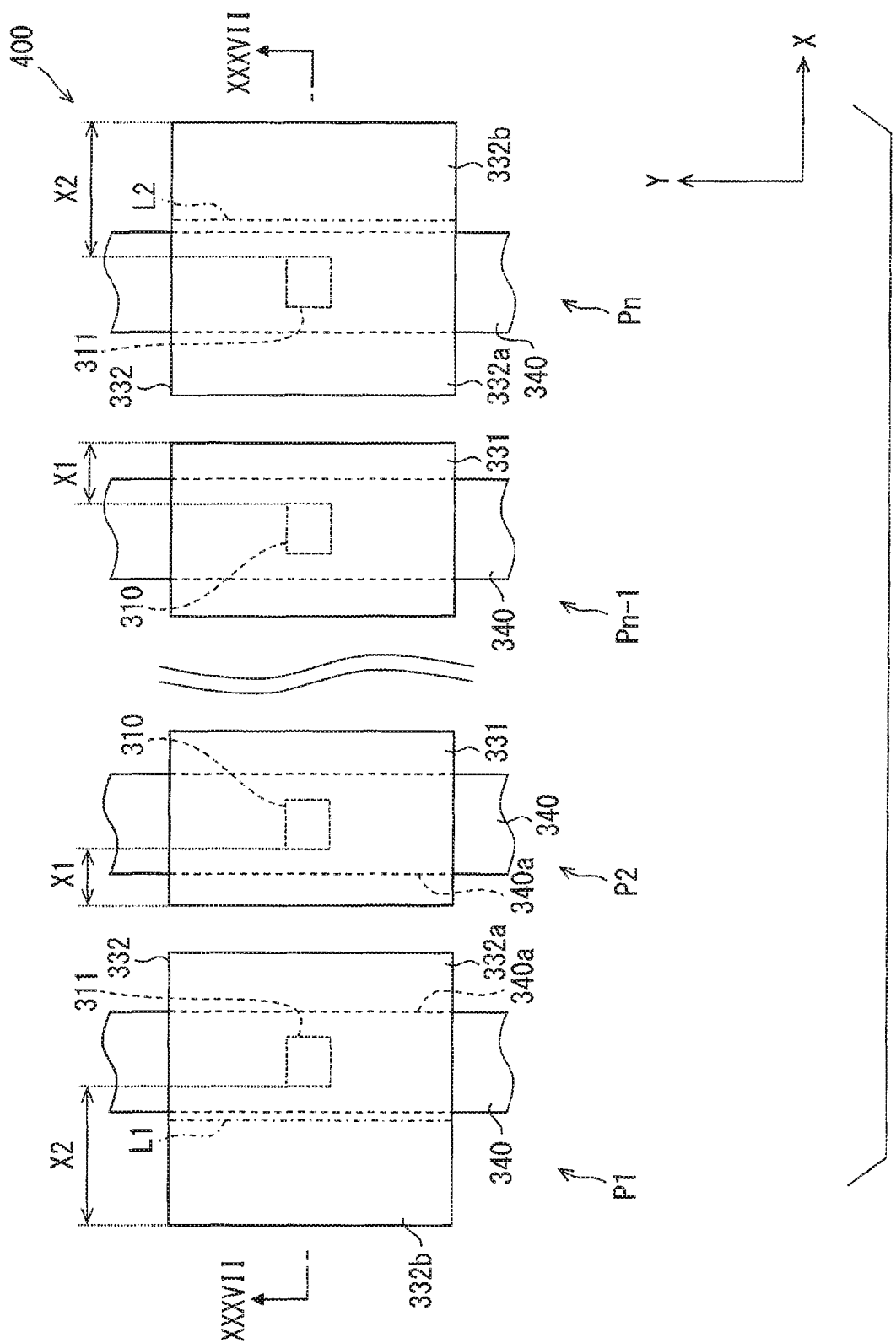
FIG. 36 is a plan view showing a schematic configuration of a current sensor in a second embodiment.
Figure 37:
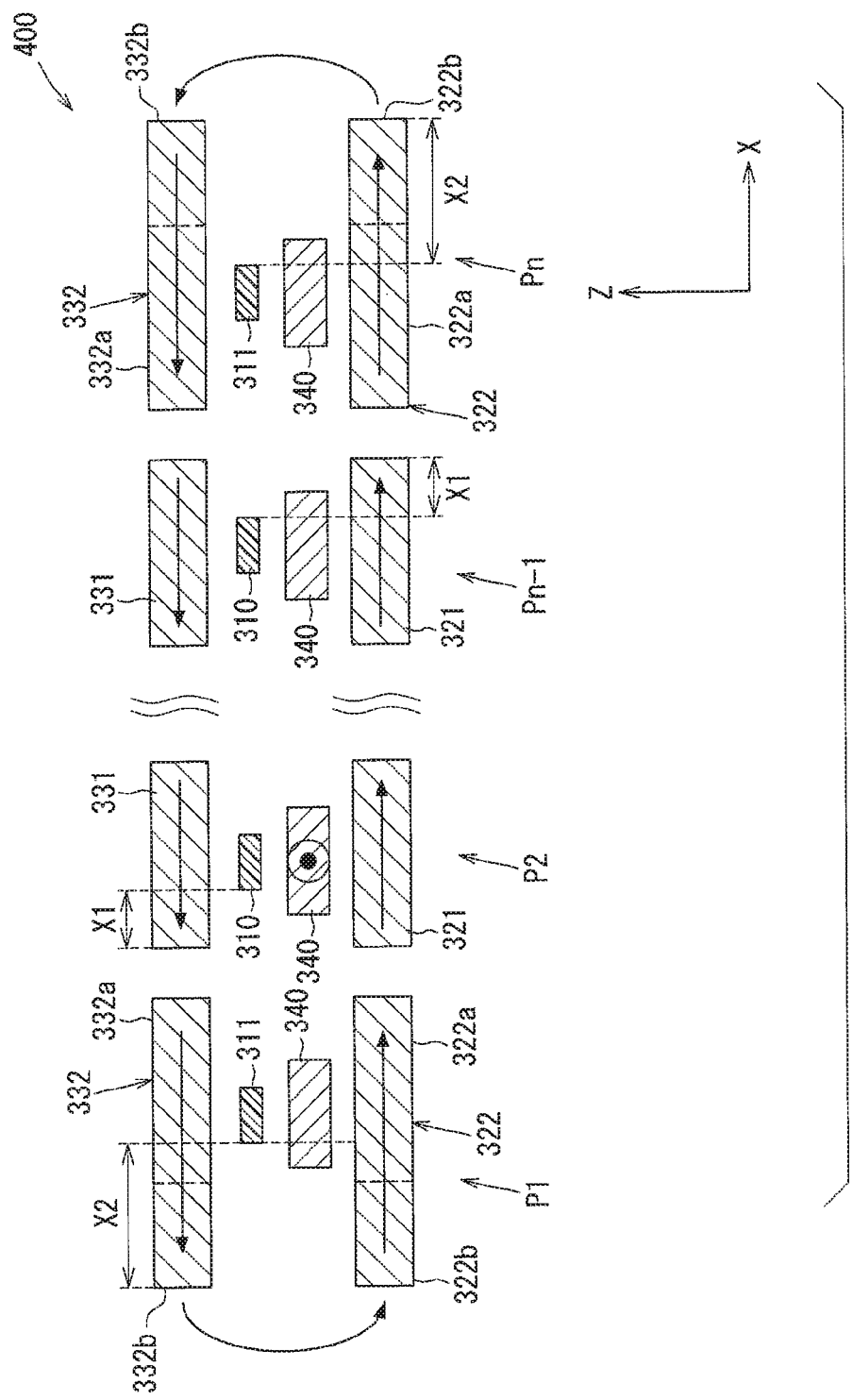
FIG. 37 is a sectional view taken along a line XXXVII-XXXVII in FIG. 36.

With reference to FIGS. 36 and 37, a current sensor 400 of the second embodiment will be described. The current sensor 400 is, for example, mounted in a vehicle together with an inverter that converts DC power into three-phase AC power and a motor generator driven by three-phase AC power from the inverter. The current sensor 400 detects a current flowing between the inverter and the motor generator. More specifically, the current sensor 400 individually detects a current flowing in each of a plurality of bus bars 340 electrically connecting between the inverter and the motor generator. As the current sensor 400, for example, it is possible to employ a careless current sensor that does not require a magnetism collecting core. The current sensor 400 is not limited to a current sensor that detects a current flowing between the inverter and the motor generator.

Further, the current sensor 400 has a plurality of phases P1 to Pn, which will be described later. At least three of these phases P1 to Pn are provided corresponding to the respective phases between the inverter and the motor generator. The bus bar 340 corresponds to a current path. The current flowing in the bus bar 340 can also be called a current to be detected.

In the present embodiment, as an example, a bus bar 340 including a first end, a second end, and an intermediate portion 340a sandwiched between both the ends is employed. For example, the first end of the bus bar 340 is the end on the motor generator side and the second end is the end on the inverter side. The intermediate portion 340a is a section between the first end and the second end and is a section that is sandwiched between the first shield and the second shield, which will be described later. However, the configuration of the bus bar 340 is not limited thereto.

As shown in FIGS. 36 and 37, the current sensor 400 has a first phase P1 to an nth phase Pn. In the current sensor 400, the first phase P1 to the nth phase Pn are arranged side by side in the X direction. Therefore, the X direction can also be called an arrangement direction. The arrangement direction is a direction orthogonal to a stacking direction which will be described later.

Further, the first phase P1 and the nth phase are phases at both ends in the arrangement direction and can thus be called end phases. Meanwhile, the second phase P2 to the (n−1)th phase Pn−1 intervene between the end phases P1, Pn and can thus be called intervening phases. In the present embodiment, an example in which n is a natural number being 3 or larger is employed. However, the present disclosure can be employed as long as n is 2 or larger. The current sensor in this case has no intervening phase which will be described later.

Each of the phases P1 to Pn includes magnetic detection elements 310, 311. Each of the phases P1 to Pn includes a magnetic shield portion including a pair of first shields 321, 322 and second shields 331, 332 arranged facing each other while sandwiching the bus bar 340 and the magnetic detection elements 310, 311 therebetween.

Each of the magnetic detection elements 310, 311 is disposed facing one bus bar 340, senses a magnetic field generated from the bus bar 340, and converts the magnetic field into an electric signal. For example, it is possible to employ a configuration for the magnetic detection elements 310, 311 where a sensor chip, a bias magnet, and a circuit chip are mounted on a substrate, these are sealed with a sealing resin body, and leads connected to the circuit chip are exposed to the outside of the sealing resin body. As the sensor chip, for example, a giant magneto resistance element (GMR), an anisotropic magneto resistance element (AMR), a tunnel magneto resistance element (TMR), a Hall element, or the like can be employed. The magnetic detection element 311 of each of the end phases P1, Pn can be called an end phase detection element 311. Meanwhile, the magnetic detection element 310 of each of the intervening phases P2 to Pn−1 can be called an intervening detection element 310.

Each of the first shields 321, 322 and the second shields 331, 332 is made of a magnetic material and serves to shield the magnetic detection elements 310, 311 against the magnetic field from the outside. Each of the shields 321, 322, 331, 332 are arranged facing each other while sandwiching the bus bar 340 and the magnetic detection elements 310, 311. In other words, each of the shields 321, 322, 331, 332 serves to prevent the external magnetic field from reaching or passing through the magnetic detection elements 310, 311. The first shields 321, 322 and the second shields 331, 332 correspond to magnetic shield portions.

Each of the shields 321, 322, 331, 332 is constituted, for example, by stacking tabular magnetic materials. Therefore, as shown in FIGS. 36 and 37, each of the shields 321, 322, 331, 332 is a tabular member, and is, for example, rectangular on the XY plane, the YZ plane, and the XZ plane. Moreover, each of the shields 321, 322, 331, 332 is large enough to cover a region facing each of the magnetic detection elements 310, 311 and a region facing the intermediate portion 340a. The facing region is a region in the Z direction.

The first shield 322 of each of the end phases P1, Pn can be called a first end phase shield 322. Similarly, the second shield 332 of each of the end phases P1, Pn can be called a second end phase shield 332. The current sensor 400 thus includes two first end phase shields 322 and two second end phase shields 332.

Meanwhile, the first shield 321 of each of the intervening phases P2 to Pn−1 can be called a first intervening shield 321. Similarly, the second shield 331 of each of the intervening phases P2 to Pn−1 can be called a second intervening shield 331.

As thus described, the first shield includes the first intervening shields 321 and the first end phase shields 322. The second shield includes the second intervening shields 331 and the second end phase shields 332.

The first shields 321, 322 are arranged on one side in the Z direction with the bus bar 340 and the magnetic detection elements 310, 311 taken as a reference. The second shields 331, 332 are arranged on the other side in the Z direction with the bus bar 340 and the magnetic detection elements 310, 311 taken as a reference. Specifically, the first shields 321, 322 are arranged on the side facing the bus bar 340 and the second shields 331, 332 are arranged on the side facing the magnetic detection elements 310, 311.

Each of the first shields 321, 322 and each of the second shields 331, 332 form a pair, and are arranged facing each other with an interval in the Z direction. For example, in the first phase P1, the first end phase shield 322 and the second end phase shield 332 are paired, and in the Z direction, the first end phase shield 322 and the second end phase shield 332 are arranged facing each other. The first end phase shield 322 and the second end phase shield 332 are arranged so as to sandwich the end phase detection element 311 and the bus bar 340 in the Z direction.

Therefore, the end phase detection element 311 and the intermediate portion 340a can be said to be disposed in the region facing the first end phase shield 322 and the region facing the second end phase shield 332. In the first phase P1, as shown in FIG. 37, the first end phase shield 322, the intermediate portion 340a of the bus bar 340, the end phase detection element 311, and the second end phase shield 332 are stacked in this order. That is, in the first phase P1, these constituent elements are stacked in the Z direction.

Further, for example, in the second phase P2, the first intervening shield 321 and the second intervening shield 331 are paired, and in the Z direction, the first intervening shield 321 and the second intervening shield 331 are arranged facing each other. The first intervening shield 321 and the second intervening shield 331 are arranged so as to sandwich the intervening detection element 310 and the bus bar 340 in the Z direction.

Therefore, the intervening detection element 310 and the intermediate portion 340a can be said to be disposed in the region facing the first intervening shield 321 and the region facing the second intervening shield 331. In the second phase P2, as shown in FIG. 37, the first intervening shield 321, the intermediate portion 340a of the bus bar 340, the intervening detection element 310, and the second intervening shield 331 are stacked in this order. That is, in the second phase P2, these constituent elements are stacked in the Z direction.

As thus described, the current sensor 400 has a configuration in which the first shields 321, 322 are divided for each of the phases P1 to Pn and the second shields 331, 332 are divided for each of the phases P1 to Pn. However, each of the first shields 321, 322 and the second shields 331, 332 may be integrated with a material such as resin which does not function as a magnetic shield.

The first shields 321, 322 are arranged side by side in the X direction. Similarly, the second shields 331, 332 are arranged side by side in the X direction. The intermediate portions 340a of the bus bars 340 corresponding to the respective phases P1 to Pn are also arranged side by side in the X direction.

For example, the first shields 321, 322 are provided with facing surfaces (hereinafter referred to as first facing surfaces) facing the intermediate portions 340a in parallel with the XY plane. The first facing surfaces of the first shields 321, 322 are provided on a same virtual plane parallel to the XY plane. Similarly, for example, the second shields 331, 332 are provided with facing surfaces (hereinafter referred to as second facing surfaces) facing the magnetic detection elements 310, 311 in parallel with the XY plane. The second facing surfaces of the second shields 331, 332 are provided on a same virtual plane parallel to the XY plane. The virtual plane on which the first facing surface is provided is different in position in the Z direction from the virtual plane on which the second facing surface is provided.

The first facing surface is the surface on the side facing the second shields 331, 332. The second facing surface is the surface on the side facing the first shields 321, 322. The first shields 321, 322 and the second shields 331, 332 are arranged in parallel, so that these shields can also be called parallel tabular shields.

The first shields 321, 322 are different in position in the X direction, but the same in position in the Y direction and the Z direction. Similarly, the second shields 331, 332 are different in position in the X direction, but the same in position in the Y direction and the Z direction.

The current sensor 400 thus configured may come into a situation where a relatively large current such as 1200 A flows in the bus bar 340 which is a detection target of a certain phase, and the current sensor detects a current to be detected flowing in the bus bar 340 of a detection target in an adjacent phase to this phase. Note that the bus bar 340 in which a relatively large current flows can be a noise generation source. For this reason, the phase in which this bus bar is the detection target can be called a noise phase. Meanwhile, the phase in which the current to be detected is detected can be called the detection phase. In the present embodiment, as shown in FIG. 37, a situation where the second phase P2 is the noise phase and the first phase P1 is the detection phase is employed as an example.

The magnetic field generated from the bus bar 340 being the noise phase is generated concentrically according to the Ampere's right-handed screw rule. This magnetic field concentrates inside each of the shields 321, 322, 331, 332. In each of the shields 321, 322, 331, 332, as shown in FIG. 37, a magnetic flux flows, in other words, lines of magnetic force run, in the direction indicated by a solid arrow.

Then, the magnetic field reaches the extreme end of the end phase. As a result, in the current sensor 400, the magnetic field exchange occurs between the first shield and the second shield in the end phase. Specifically, in the first phase P1, the magnetic field exchange occurs from the extreme end of the second end phase shield 332 to the first end phase shield 322. Similarly, in the nth phase Pn, the magnetic field exchange occurs from the extreme end of the first end phase shield 322 to the second end phase shield 332. In other words, in the first phase P1, the leakage magnetic field from the extreme end of the second end phase shield 332 is transmitted to the extreme end of the first end phase shield 322. Similarly, in the nth phase Pn, the leakage magnetic field from the extreme end of the first end phase shield 322 is transmitted to the extreme end of the second end phase shield 332. In the current sensor 400, when the end phase detection element 311 senses this leakage magnetic field, a current detection error occurs.

Depending on the direction of the current flowing in the bus bar 340, the direction may be opposite to the direction employed here. The extreme end here is the end in the X direction, which is the end of the end phase shields 322, 332 on the side not facing the intervening shields 321, 331.

The current sensor 400 is thus provided with the first end phase shield 322 and the second end phase shield 332 in order to prevent occurrence of a current detection error. The first end phase shield 322 and the second end phase shield 332 will be described here. The first end phase shield 322 and the second end phase shield 332 have similar configurations. However, the configurations of the end phase shields 322, 332 are different from the configurations of the intervening shields 321, 331. Specifically, the positional relationship between the end phase shields 322, 332 and the magnetic detection element 311 and the sizes of the end phase shields 322, 332 are different from the positional relationship between the intervening shields 321, 331 and the intervening detection element 310 and the sizes of the intervening shields 321, 331.

The first end phase shield 322 includes a first base portion 322a and a first extension 322b. Similarly, the second end phase shield 332 includes a second base portion 332a and a second extension 332b. Both the extensions 322b, 332b are sections for performing the magnetic field exchange between the end phase shields 322, 332 such that the leakage magnetic field from the extreme end of each of the end phase shields 322, 332 more easily reaches each of the facing end phase shields 322, 332 on the other side which are arranged facing each other, than the end phase detection element 311. In the present embodiment, the magnetic field is transmitted from the second extension 332b in the first phase P1 to the first extension 322b in the first phase P1, and the magnetic field is transmitted from the first extension 322b in the nth phase Pn to the second extension 332b in the nth phase Pn. Both the extensions 322b, 332b correspond to a magnetic field exchanger.

In the first end phase shield 322, a first base portion 322a and a first extension 322b are provided integrally. The first base portion 322a is a section facing the end phase detection element 311. For example, the length of the first base portion 322a in the X direction is similar to that of the first intervening shield 321. Therefore, the length of the first end phase shield 322 in the X direction is larger than that of the first intervening shield 321 by the inclusion of the first extension 322b.

That is, the first end phase shield 322 can be said to include a section (first extension 322b) having a length X2 larger than a length X1 in the X direction as the magnetic field exchanger. The length X2 is a length from a portion facing the end phase detection element 311 to the extreme end where the leakage magnetic field is generated. In contrast, the length X1 is a length from a portion facing the intervening detection element 310 to the extreme-end-side end in the first intervening shield 321.

Further, as for the first intervening shield 321, the intervening detection element 310 is disposed so as to face the center of the first intervening shield 321 in the X direction. In contrast, as for the first end phase shield 322, the end phase detection element 311 is disposed so as to face a position shifted from the center of the first end phase shield 322 in the X direction. More specifically, the end phase detection element 311 is disposed facing a position shifted from the center of the first end phase shield 322 on the side opposite to the extreme end. The same applies to the second end phase shield 332, and hence, the description of the first end phase shield 322 can be referred to and applied to the second end phase shield 332.

As thus described, in the current sensor 400, both the end phase shields 322, 332 are provided with the extensions 322b, 332b. As a result, in the current sensor 400, the leakage magnetic fields from the extreme ends of both the end phase shields 322, 332 in the X direction more easily reach the facing end phase shields 322, 332 on the other side which are arranged facing each other, than the end phase detection element 311. In other words, the current sensor 400 can prevent the leakage magnetic field from each of the extreme ends of the both the end phase shields 322 and 332 in the X direction from entering the space between the end phase shields 322, 332. Therefore, the current sensor 400 can prevent the leakage magnetic field from reaching the end phase detection element 311 and can detect the current with high accuracy.

In the present embodiment, the current sensor 400 in which the extensions 322b, 332b are provided in both the first end phase shield 322 and the second end phase shield 332 is employed. However, the present disclosure is not limited thereto, and a current sensor can be employed as long as including an extension in at least one of the first end phase shield 322 and the second end phase shield 332.

Hereinafter, third to fifth embodiments of the present disclosure will be described. Each of the second embodiment and the third to fifth embodiments can be performed independently and can also be performed in an appropriate combination. The present disclosure is not limited to combinations shown in the embodiments but can be performed in various combinations.

Third Embodiment

Figure 38:
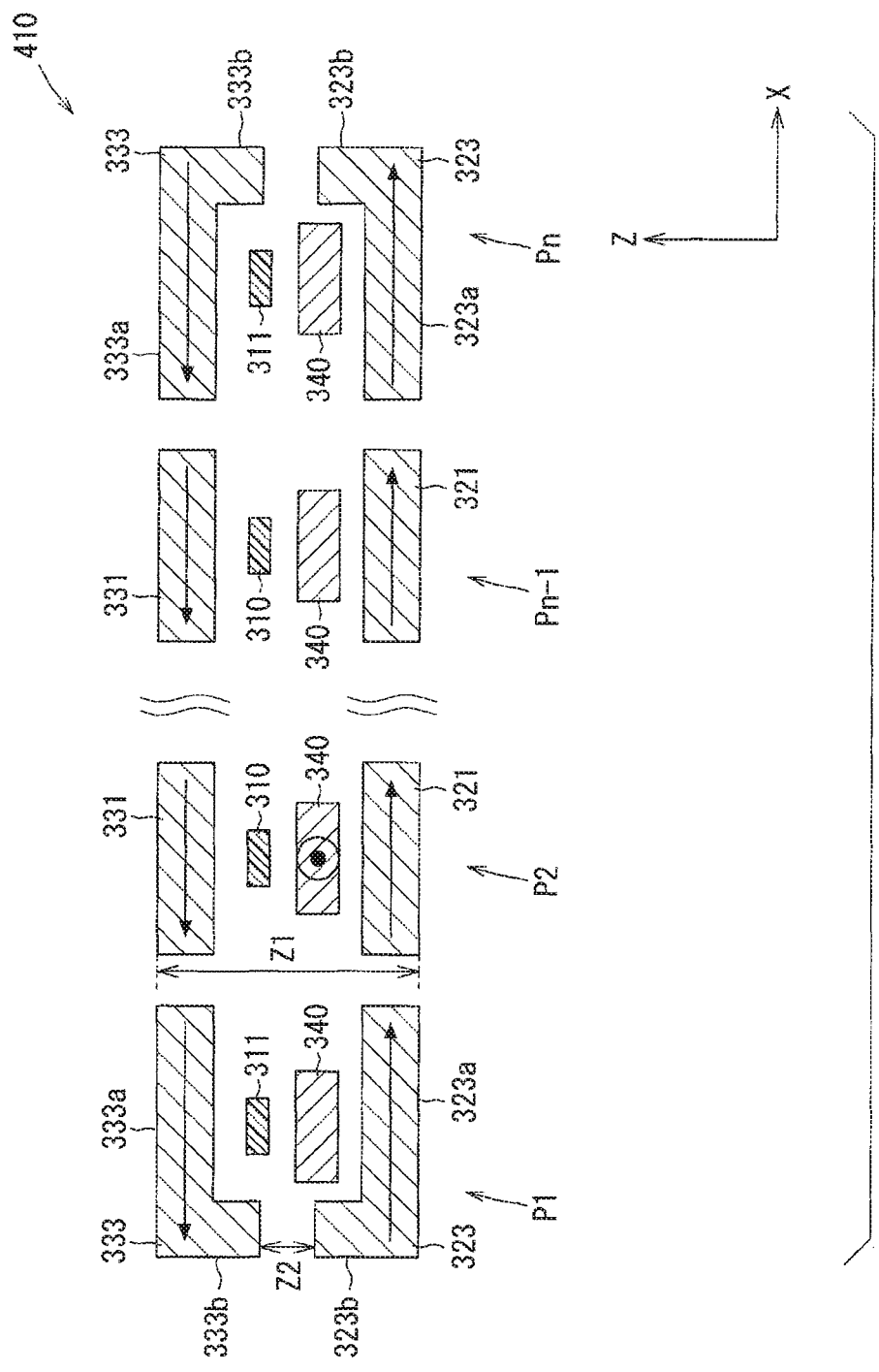
FIG. 38 is a sectional view showing a schematic configuration of a current sensor in a third embodiment.

With reference to FIG. 38, a current sensor 410 of the present embodiment will be described. FIG. 38 is a sectional view corresponding to FIG. 37. The current sensor 410 differs from the current sensor 400 in the configurations of the end phase shields 323, 333. Here, mainly the difference from the current sensor 400 will be described.

The first end phase shield 323 includes a first base portion 323a and a first protrusion 323b. The first protrusion 323b is a section for performing magnetic field exchange between the first end phase shield 323 and the second end phase shield 333 and corresponds to a magnetic field exchanger. Similarly, the second end phase shield 333 includes a second base portion 333a and a second protrusion 333b. The second protrusion 333b is a section for performing magnetic field exchange between the second end phase shield 333 and the first end phase shield 323 and corresponds to a magnetic field exchanger. The first end phase shield 323 corresponds to a first shield. The second end phase shield 333 corresponds to a second shield.

The first base portion 323a is a section having a tabular shape facing the end phase detection element 311 just like the first base portion 322a of the above embodiment. The first protrusion 323b is a section bent from the end of the first base portion 323a toward the second end phase shield 333. The end of the first base portion 323a here is an end on the opposite side from the side facing the first intervening shield 321. Therefore, the first end phase shield 323 has an L shape on the XZ plane. The same applies to the second end phase shield 333, and hence, the description of the first end phase shield 323 can be referred to and applied to the second end phase shield 333.

As thus described, the end phase shields 323, 333 include, as magnetic field exchangers, sections (protrusions 323b, 333b) bent toward the end phase shields 323, 333 on the other sides than the portion facing the end phase detection element 311. Therefore, in the current sensor 410, an interval Z2 between the first protrusion 323b and the second protrusion 333b in the Z direction is shorter than an interval Z1 between the first intervening shield 321 and the second intervening shield 331 in the Z direction. The interval Z1 in the Z direction is an interval between the opposite surface of the first intervening shield 321 from the surface facing the bus bar 340 and the opposite surface of the second intervening shield 331 from the surface facing the intervening detection element 310.

The current sensor 410 can achieve a similar effect to that of the current sensor 400. Moreover, with the end phase shields 323, 333 being bent, the size of the current sensor 410 in the X direction can be made smaller than that of the current sensor 400.

First Modification

Figure 39:
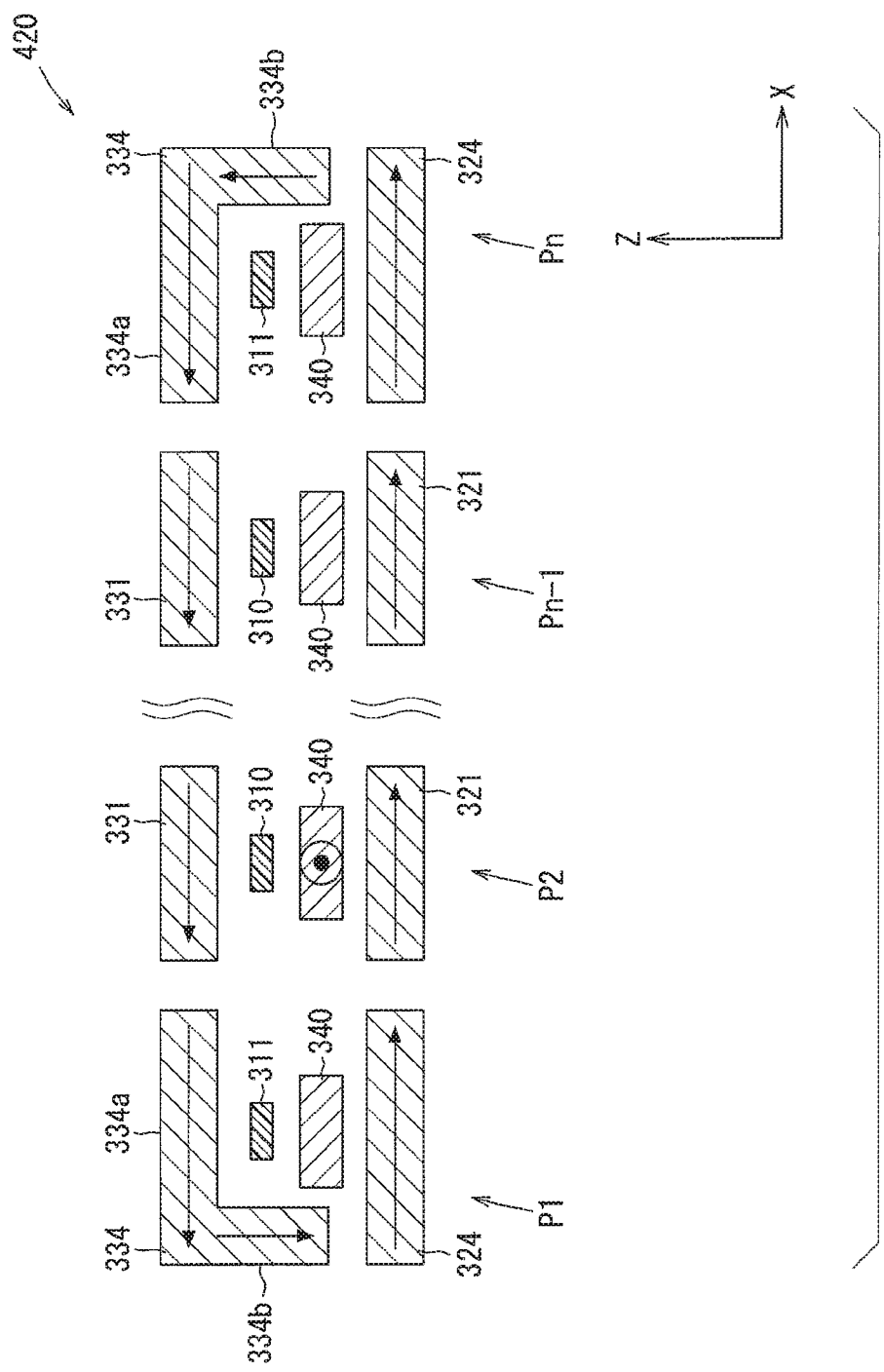
FIG. 39 is a sectional view showing a schematic configuration of a current sensor in a first modification of the third embodiment.

With reference to FIG. 39, a current sensor 420 of a first modification of the third embodiment will be described. FIG. 39 is a sectional view corresponding to FIG. 37. The current sensor 420 differs from the current sensor 410 in the configurations of end phase shields 324, 334. Here, mainly the difference from the current sensor 410 will be described.

Differently from the first end phase shield 323, the first end phase shield 324 has a tabular shape. In contrast, the second end phase shield 334 includes a second base portion 334a and a second protrusion 334b. The second end phase shield 334 has an L shape just like the second end phase shield 333. The second protrusion 334b is a section for performing magnetic field exchange between the second end phase shield 334 and the first end phase shield 324 and corresponds to a magnetic field exchanger. The first end phase shield 324 corresponds to a first shield. The second end phase shield 334 corresponds to a second shield.

The current sensor 420 can achieve a similar effect to that of the current sensor 410. That is, when the current sensor 420 includes a section corresponding to the magnetic field exchanger in at least one of the end phase shields 324, 334, a similar effect to that of the current sensor 410 can be achieved.

Second Modification

Figure 40:
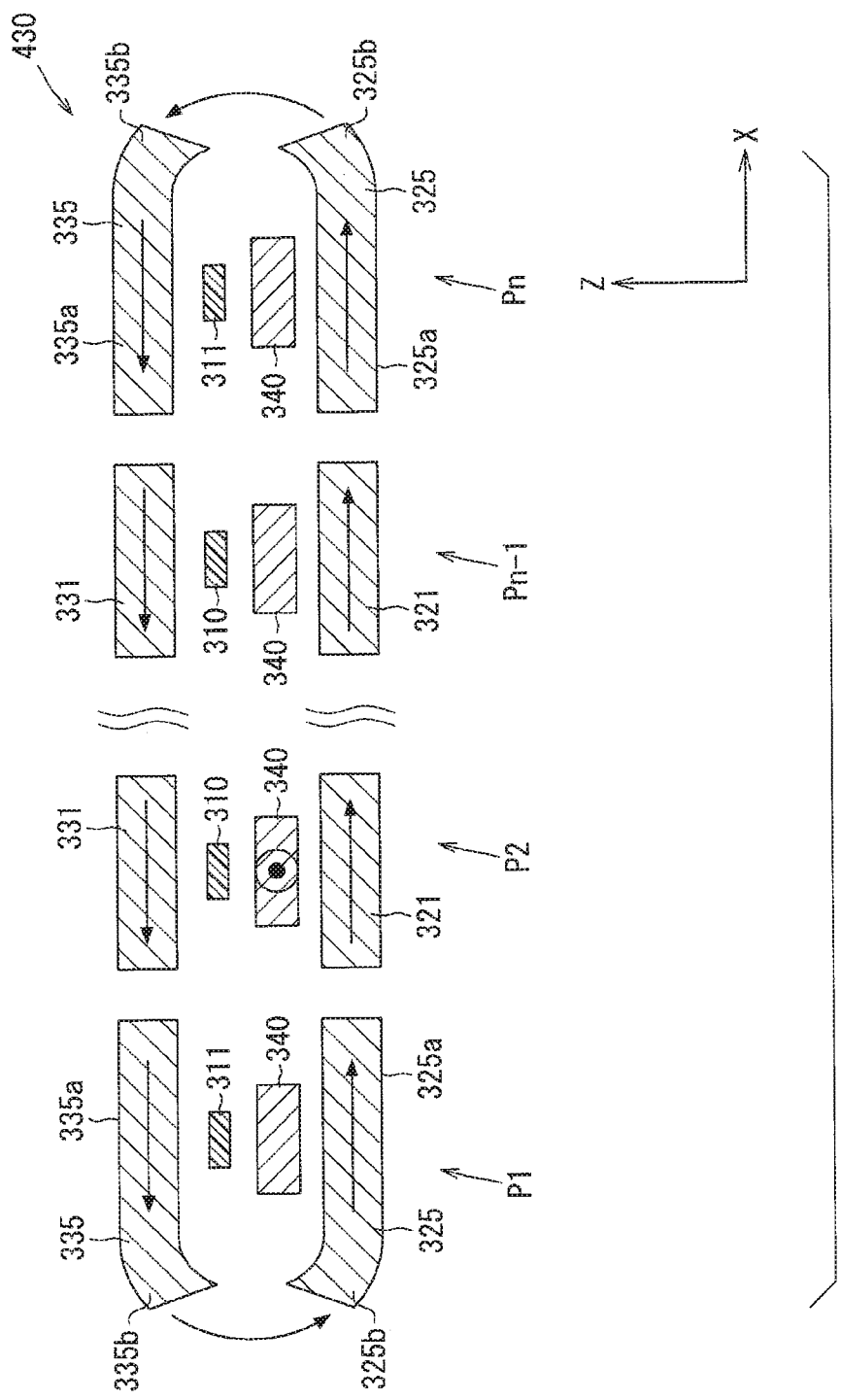
FIG. 40 is a sectional view showing a schematic configuration of a current sensor in a second modification.

With reference to FIG. 40, a current sensor 430 of the second modification of the third embodiment will be described. FIG. 40 is a sectional view corresponding to FIG. 37. The current sensor 430 differs from the current sensor 410 in the configurations of end phase shields 325, 335. Here, mainly the difference from the current sensor 410 will be described.

The first end phase shield 325 includes a first base portion 325a and a first bend 325b. The first bend 325b is a section for performing magnetic field exchange between the first end phase shield 325 and the second end phase shield 335 and corresponds to a magnetic field exchanger. Similarly, the second end phase shield 335 includes a second base portion 335a and a second bend 335b. The second bend 335b is a section for performing magnetic field exchange between the second end phase shield 335 and the first end phase shield 325 and corresponds to a magnetic field exchanger. The first end phase shield 325 corresponds to a first shield. The second end phase shield 335 corresponds to a second shield.

The first base portion 325a is a section having a tabular shape and facing the end phase detection element 311 just like the first base portion 322a. The first bend 325b is a section bent from the end of the first base portion 325a toward the second end phase shield 335. Here, the end of the first base portion 325a is an end on the opposite side from the side facing the first intervening shield 321.

Further, differently from the first end phase shield 323, in the first end phase shield 325, the first bend 325b is bent in a curved manner. That is, in the first end phase shield 325, a part of the surface facing the bus bar 340 and a part of the surface opposite from the facing surface are curved surfaces. The first end phase shield 325 can be manufactured by, for example, bending a tabular shield plate by press working or the like. The same applies to the second end phase shield 335, and hence, the description of the first end phase shield 325 can be referred to and applied to the second end phase shield 335.

As thus described, the end phase shields 325, 335 include, as magnetic field exchangers, sections (bends 325b, 335b) bent toward the end phase shields 325, 335 on the other sides than the portion facing the end phase detection element 311. The current sensor 430 can achieve a similar effect to that of the current sensor 410.

Fourth Embodiment

Figure 41:
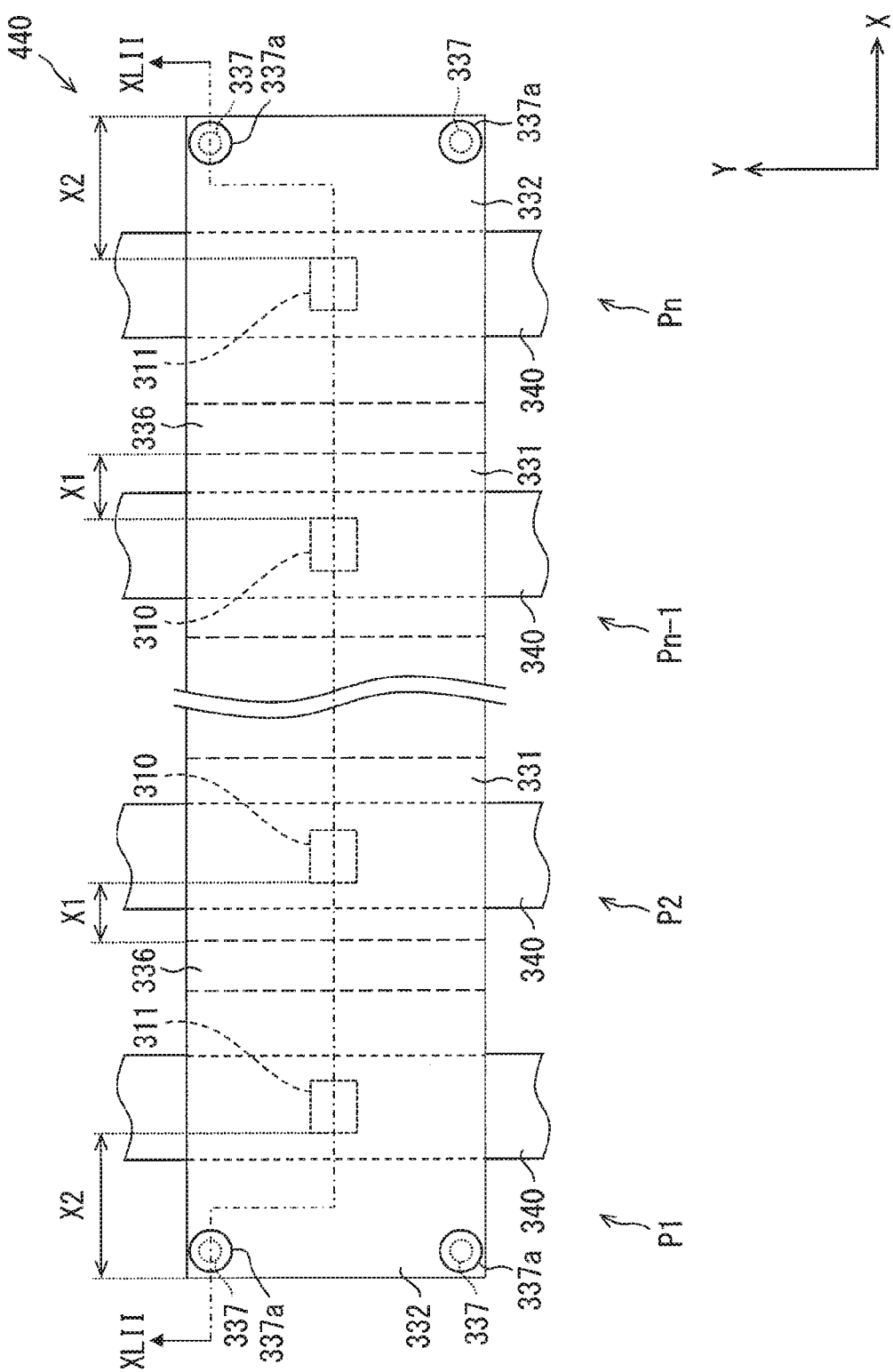
FIG. 41 is a sectional view showing a schematic configuration of a current sensor in a fourth embodiment.
Figure 42:
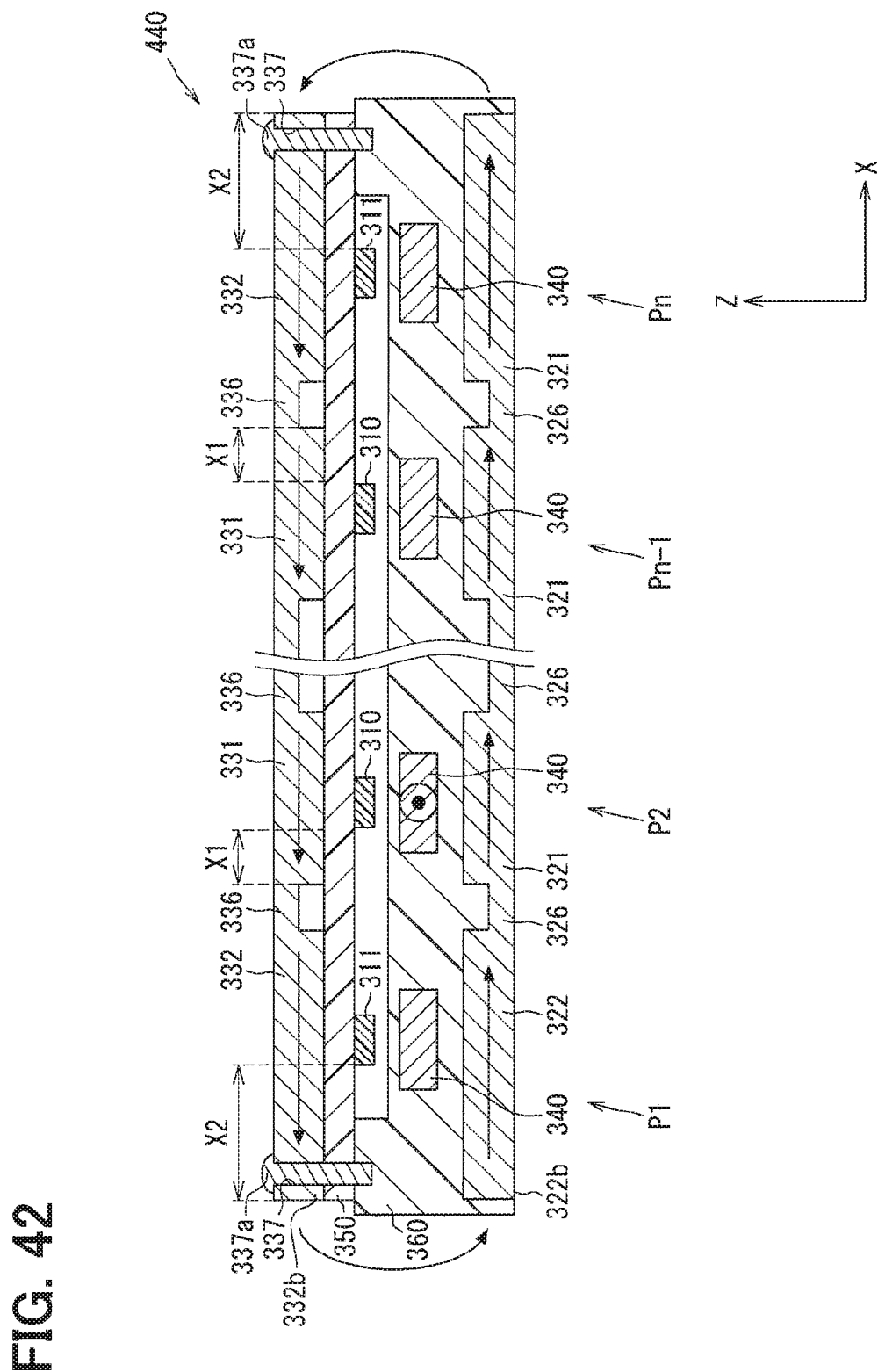
FIG. 42 is a sectional view taken along a line XLII-XLII in FIG. 41.

With reference to FIGS. 41 and 42, a current sensor 440 of the fourth embodiment will be described. The current sensor 440 differs from the current sensor 400 in the configuration of the shield and inclusion of a circuit board 350 and a housing 360. Here, mainly the difference from the current sensor 400 will be described.

As shown in FIG. 42, the current sensor 440 includes a circuit board 350 and a housing 360. The circuit board 350 is electrically connected to the magnetic detection elements 310, 311 and receives sensor signals from the magnetic detection elements 310, 311. More specifically, on the circuit board 350, circuit elements, conductive wiring, and the like are formed, and the magnetic detection elements 310, 311 are mounted. On the circuit board 350, the magnetic detection elements 310, 311 are electrically connected to a part of the wiring. The surface of the circuit board 350 on which the magnetic detection elements 310, 311 are mounted can be called a mounting surface.

Moreover, through holes are formed in the circuit board 350 in the stacking direction. Each of these through holes is a hole into which a fixing member 337a, described later, is inserted. The through holes are provided at positions facing fixing hole portions 337, described later, in the circuit board 350.

The housing 360 is made of resin or the like, for example, and integrally holds the first shield and the bus bar 340. The housing 360 can integrally hold the first shield and the bus bar 340 by insert molding or insertion. Hereinafter, the housing 360 integrally holding the first shield and the bus bar 340 will be referred to as a structural body.

Further, the housing 360 is provided with holes, into each of which the fixing member 337a is fixed, in a section facing the circuit board 350. These holes are provided at positions facing the fixing hole portions 337. For each of these holes, a female screw corresponding to the fixing member 337a which is, for example, a male screw can be employed.

As shown in FIG. 42, the first shield includes, in addition to the first intervening shield 321 and the first end phase shield 322, a first thin portion 326 having a thickness smaller than that of the first intervening shield 321 and that of the first end phase shield 322. In the first shield, the first intervening shield 321 and the first end phase shield 322 are integrally constituted via the first thin portion 326. That is, the first shield is coupled by the first thin portion 326 for each phase. The first intervening shield 321 and the first end phase shield 322 can also be called a thick portion with respect to the first thin portion 326.

Therefore, the first shield has a shape in which a recess is formed in the surface on the magnetic detection elements 310, 311 side. As shown in FIG. 42, the surface of the first shield on the side where the recess is formed is provided facing the opposite surface of the circuit board 350 from the mounting surface. The thickness here is a thickness in the stacking direction.

Similarly, the second shield includes, in addition to the second intervening shield 331 and the second end phase shield 332, a second thin portion 336 having a thickness smaller than that of the second intervening shield 331 and that of the second end phase shield 332. In the second shield, the second intervening shield 331 and the second end phase shield 332 are integrally constituted via the second thin portion 336.

Moreover, in the second end phase shield 332, a fixing hole portion 337 penetrating in the stacking direction is formed in the second extension 332b. As shown in FIG. 41, the second end phase shield 332 has, for example, fixing hole portions 337 formed at four corners thereof. Each of the fixing hole portions 337 is a hole into which the fixing member 337a for integrally fixing the second shield, the circuit board 350, and the housing 360 is inserted.

In the current sensor 440, the structural body, the circuit board 350, and the second shield are stacked in this order. In the current sensor 440, the stacked structural body, the circuit board 350, and the second shield are fixed by the fixing members 337a. That is, it can be said that the constituent elements of the respective phases P1 to Pn are integrally constituted via the circuit board 350 and the housing 360. The structural body integrally constituted in this manner can also be called a sensor terminal block.

The current sensor 440 can achieve a similar effect to that of the current sensor 400. The current sensor 440 can achieve a similar effect to that of the current sensor 400 even when not including the circuit board 350, the housing 360, the fixing member 337a, or the like.

Moreover, since the current sensor 440 includes the second extension 332b, the fixing hole portion 337 can be formed in the second extension 332b. That is, the current sensor 440 can be fixed with the circuit board 350, the housing 360, and the like while utilizing the configuration for the high accuracy in current detection. Hence, the current sensor 440 is more preferable than the case where the size is increased only for fixing with the circuit board 350, the housing 360, and the like.

The current sensor 440 can be employed even in a configuration in which the end phase shields 322, 332 and the intervening shields 321, 331 are separated in a manner similar to the current sensor 400 and the like. In this case, the second intervening shield 331 can be fixed to the circuit board 350 by an adhesive, a screw, or the like. Further, the current sensor 440 can be employed even when the end phase shields 322, 332 have bent shapes, as in the current sensor 410 and the like.

The circuit board 350 may be provided with a circuit element on the surface opposite from the mounting surface. The current sensor 440 can be downsized by assembling the circuit element on the opposite surface so as to be disposed in the recess formed in the second shield. That is, the current sensor 440 can be downsized in at least one of the X direction and the Y direction as compared to the case where the circuit element on the opposite surface is disposed outside the region facing the second shield.

Fifth Embodiment

Figure 43:
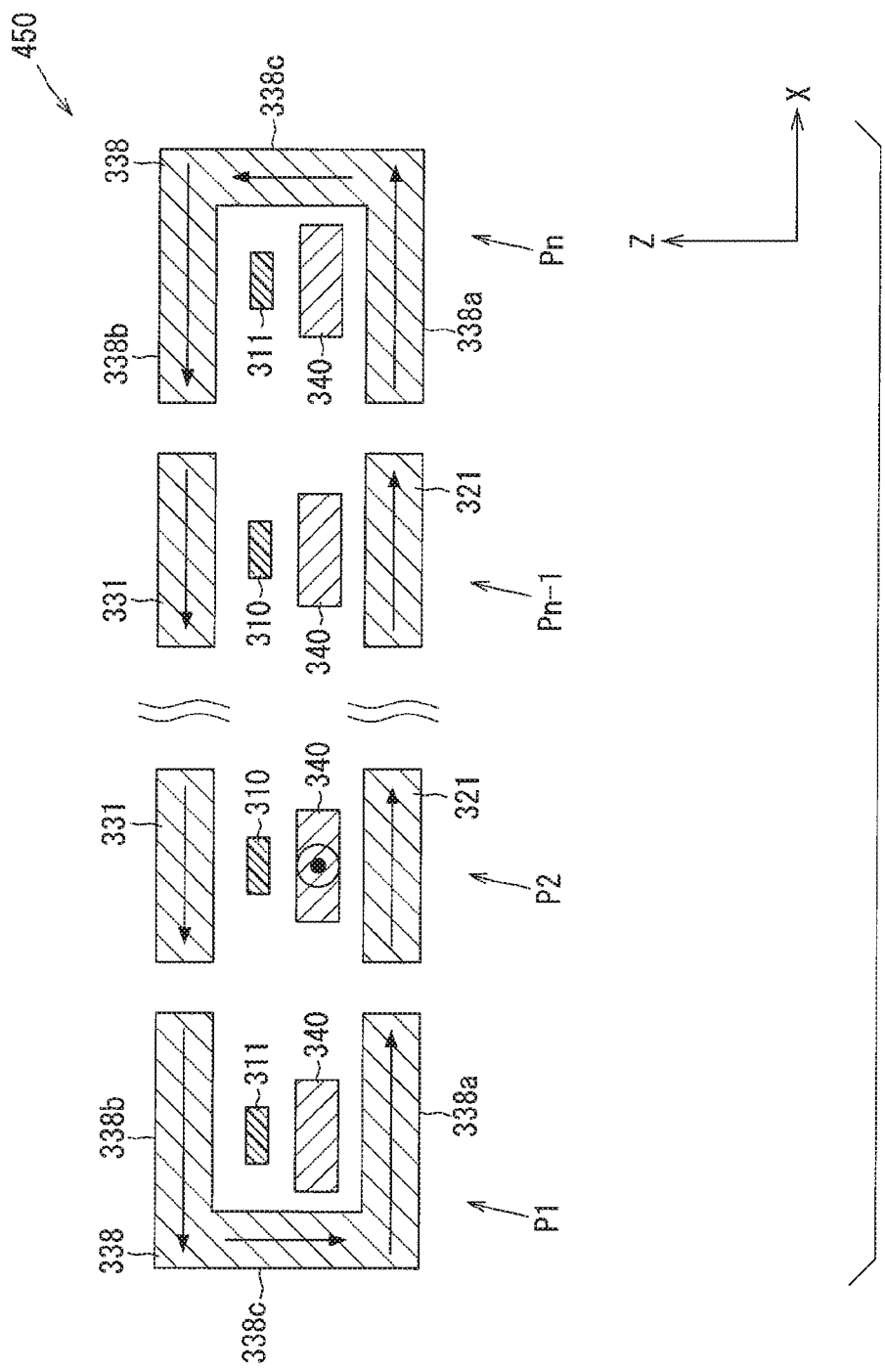
FIG. 43 is a sectional view showing a schematic configuration of a current sensor in a fifth embodiment.

With reference to FIG. 43, a current sensor 450 of the fifth embodiment will be described. FIG. 43 is a sectional view corresponding to FIG. 37. The current sensor 450 differs from the current sensor 400 in the configurations of the first shield and the second shield. Here, mainly the difference from the current sensor 400 will be described.

The current sensor 450 includes, as a magnetic shield portion, a third shield 338 in addition to the intervening shields 321, 331. The third shield 338 is made of a magnetic material in the same manner as the intervening shields 321, 331 and the like. The third shield 338 mainly serves to shield the end phase detection element 311 against the magnetic field from the outside. The third shield 338 includes a first base portion 338a, a second base portion 338b, and a sidewall portion 338c.

The first base portion 338a and the second base portion 338b correspond to end phase shields. The first base portion 338a is disposed facing the bus bar 340. Meanwhile, the second base portion 338b is disposed facing the end phase detection element 311. Both the base portions 338a, 338b are tabular sections parallel to the XY plane. Therefore, the third shield 338 can be said to include the first base portion 338a corresponding to the first end phase shield and the second base portion 338b corresponding to the second end phase shield.

The sidewall portion 338c corresponds to a magnetic field exchanger. The sidewall portion 338c is a section that is provided continuously with the ends of both the base portions 338a, 338b in the arrangement direction and integrated with both the base portions 338a, 338b to be an integrated matter, so as to perform magnetic field exchange between the base portions 338a, 338b. The sidewall portion 338c is a tabular section parallel to the YZ plane.

That is, in the third shield 338, the first base portion 338a, the second base portion 338b, and the sidewall portion 338c are constituted as an integrated matter. Therefore, as shown in FIG. 43, the third shield 338 is U-shaped on the XZ plane.

The first intervening shield 321 and the first base portion 338a correspond to first shields. The second intervening shield 331 and the second base portion 338b correspond to second shields. The third shield 338 can also be said to be a configuration in which the first end phase shield 322 and the second end phase shield 332 are integrated with the sidewall portion 338c.

As thus described, the current sensor 450 includes the sidewall portion 338c that is provided continuously with the ends of both the base portions 338a, 338b in the arrangement direction and integrated with both the base portions 338a, 338b to be an integrated matter. As a result, the current sensor 450 can reduce generation of a leakage magnetic field from the end of each of the base portions 338a, 338b in the arrangement direction. Therefore, the current sensor 450 can prevent the leakage magnetic field from reaching the end phase detection element 311 and can detect the current with high accuracy.

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

The invention claimed is:

1. A current sensor comprising:
a magnetic detection element that senses a magnetic flux generated from a current path to perform electromagnetic conversion; and
at least two magnetic shields that are arranged around the magnetic detection element and shield an external magnetic flux affecting the magnetic detection element, wherein:
the at least two magnetic shields include a first magnetic shield and a second magnetic shield facing each other across the magnetic detection element and the current path;
at least one of the first magnetic shield and the second magnetic shield includes at least two base portions and a coupling portion coupling the at least two base portions, and the at least one of the first magnetic shield and the second magnetic field has a recess recessed from a periphery in a surface facing the other of the first magnetic shield and the second magnetic shield;
at least one of the first magnetic shield and the second magnetic shield includes three or more layers stacked and is covered by a resin member; and
an outermost layer closest to a facing region between the first magnetic shield and the second magnetic shield and an outermost layer farthest from the facing region have a difference in linear expansion coefficient from the resin member less than another layer.

2. The current sensor according to claim 1, comprising two magnetic detection elements included in the magnetic detection element and respectively facing two current paths included in the current path, wherein:
the first magnetic shield and the second magnetic shield face each other across the two magnetic detection elements and the two current paths; and
the recess is provided in a section facing an intermediate position between the two magnetic detection elements.

3. The current sensor according to claim 1, comprising one magnetic detection element included in the magnetic detection element and facing one current path included in the current path, wherein
the first magnetic shield and the second magnetic shield face each other across the one magnetic detection element and the one current path.

4. The current sensor according to claim 1, wherein the recess is formed in each of the first magnetic shield and the second magnetic shield.

5. The current sensor according to claim 1, wherein the recess is formed at a position facing the coupling portion.

6. The current sensor according to claim 5, wherein:
the coupling portion protrudes away from a facing region between the first magnetic shield and the second magnetic shield; and
the recess has a depth greater than a thickness of the at least one of the first magnetic shield and the second magnetic shield having the recess.

7. The current sensor according to claim 5, wherein
the recess has a shape in which a sidewall is inclined so that an opening area increases from a bottom toward an opening end.

8. The current sensor according to claim 1, wherein
a heat radiation member is embedded in the recess.

9. The current sensor according to claim 1, wherein
the recess extends in a current flow direction in the current path from one end to the other end of the at least one of the first magnetic shield and the second magnetic shield having the recess.

10. The current sensor according to claim 1, wherein
the recess is a bottomed hole portion surrounded by a bottom and an annular sidewall.

11. The current sensor according to claim 1, wherein:
an upper phase and a lower phase are stacked in a thickness direction of the magnetic shield, the upper phase including two or more current paths included in the current path and the lower phase including two or more current paths included in the current path;
the magnetic detection element includes two or more upper phase magnetic detection elements respectively facing the current paths in the upper phase and two or more lower phase magnetic detection elements respectively facing the current paths in the lower phase; and
the at least two magnetic shields include a first upper phase magnetic shield and a second upper phase magnetic shield facing across the current paths in the upper phase and the upper phase magnetic detection elements, and include a first lower phase magnetic shield and a second lower phase magnetic shield facing across the current paths in the lower phase and the lower phase magnetic detection elements.

12. The current sensor according to claim 1, comprising
two or more magnetic detection elements included in the magnetic detection element and respectively facing two or more current paths included in the current path, wherein:
each of the first magnetic shield and the second magnetic shield includes a surface layer portion and a protrusion, the surface layer portion including the coupling portion and an end layer portion provided continuously with the coupling portion in each of the base portions, and the protrusion protruding from the end layer portion in each of the base portions;
the recess is formed between the protrusions of each of the first magnetic shield and the second magnetic field;
the protrusion of the first magnetic shield and the protrusion of the second magnetic shield face each other;
each of the magnetic detection elements is individually disposed in a facing region between the protrusion of the first magnetic shield and the protrusion of the second magnetic shield facing each other; and
at least one of the first magnetic shield and the second magnetic shield has a shape adjusted such that a leakage magnetic field from the recess in the first magnetic shield and a leakage magnetic field from the recess in the second magnetic shield cancel out each other and the leakage magnetic fields do not reach the magnetic detection elements.

13. A current sensor comprising:
a magnetic detection element that senses a magnetic flux generated from a current path to perform electromagnetic conversion; and
at least two magnetic shields that are arranged around the magnetic detection element and shield an external magnetic flux affecting the magnetic detection element, wherein:
the at least two magnetic shields include a first magnetic shield and a second magnetic shield facing each other across the magnetic detection element and the current path;
at least one of the first magnetic shield and the second magnetic shield includes at least two base portions and a coupling portion coupling the at least two base portions, and the at least one of the first magnetic shield and the second magnetic field has a recess recessed from a periphery in a surface facing the other of the first magnetic shield and the second magnetic shield; and
the recess is a bottomed hole portion surrounded by a bottom and an annular sidewall.

14. The current sensor according to claim 13, wherein:
at least one of the first magnetic shield and the second magnetic shield includes a plurality of layers stacked; and
an outermost layer farthest from a facing region between the first magnetic shield and the second magnetic shield has a higher magnetic permeability than another layer.

15. The current sensor according to claim 13, wherein:
at least one of the first magnetic shield and the second magnetic shield includes a plurality of layers stacked; and
an outermost layer farthest from a facing region between the first magnetic shield and the second magnetic shield has a higher saturation magnetic flux density than another layer.

16. The current sensor according to claim 13, wherein:
an upper phase and a lower phase are stacked in a thickness direction of the magnetic shield, the upper phase including two or more current paths included in the current path and the lower phase including two or more current paths included in the current path;
the magnetic detection element includes two or more upper phase magnetic detection elements respectively facing the current paths in the upper phase and two or more lower phase magnetic detection elements respectively facing the current paths in the lower phase; and
the at least two magnetic shields include a first upper phase magnetic shield and a second upper phase magnetic shield facing across the current paths in the upper phase and the upper phase magnetic detection elements, and include a first lower phase magnetic shield and a second lower phase magnetic shield facing across the current paths in the lower phase and the lower phase magnetic detection elements.

17. The current sensor according to claim 13, comprising
two or more magnetic detection elements included in the magnetic detection element and respectively facing two or more current paths included in the current path, wherein:
each of the first magnetic shield and the second magnetic shield includes a surface layer portion and a protrusion, the surface layer portion including the coupling portion and an end layer portion provided continuously with the coupling portion in each of the base portions, and the protrusion protruding from the end layer portion in each of the base portions;
the recess is formed between the protrusions of each of the first magnetic shield and the second magnetic field;
the protrusion of the first magnetic shield and the protrusion of the second magnetic shield face each other;

each of the magnetic detection elements is individually disposed in a facing region between the protrusion of the first magnetic shield and the protrusion of the second magnetic shield facing each other; and at least one of the first magnetic shield and the second magnetic shield has a shape adjusted such that a leakage magnetic field from the recess in the first magnetic shield and a leakage magnetic field from the recess in the second magnetic shield cancel out each other and the leakage magnetic fields do not reach the magnetic detection elements.

18. A current sensor comprising:

a magnetic detection element that senses a magnetic flux generated from a current path to perform electromagnetic conversion; and at least two magnetic shields that are arranged around the magnetic detection element and shield an external magnetic flux affecting the magnetic detection element, wherein:

the at least two magnetic shields include a first magnetic shield and a second magnetic shield facing each other across the magnetic detection element and the current path;

at least one of the first magnetic shield and the second magnetic shield includes at least two base portions and a coupling portion coupling the at least two base portions, and the at least one of the first magnetic shield and the second magnetic field has a recess recessed from a periphery in a surface facing the other of the first magnetic shield and the second magnetic shield;

an upper phase and a lower phase are stacked in a thickness direction of the magnetic shield, the upper phase including two or more current paths included in the current path and the lower phase including two or more current paths included in the current path;

the magnetic detection element includes two or more upper phase magnetic detection elements respectively facing the current paths in the upper phase, and two or more lower phase magnetic detection elements respectively facing the current paths in the lower phase; and the at least two magnetic shields include a first upper phase magnetic shield and a second upper phase magnetic shield facing across the current paths in the upper phase and the upper phase magnetic detection elements, and the at least two magnetic shields include a first lower phase magnetic shield and a second lower phase magnetic shield facing across the current paths in the lower phase and the lower phase magnetic detection elements.

19. The current sensor according to claim 18, wherein one of the first upper phase magnetic shield and the second upper phase magnetic shield adjacent to the lower phase and one of the first lower phase magnetic shield and the second lower phase magnetic shield adjacent to the upper phase are integrated to provide an intermediate magnetic shield.

20. The current sensor according to claim 19, wherein the intermediate magnetic shield has a nonmagnetic portion in a region where the current paths in the upper phase and the current paths in the lower phase face each other.

21. A current sensor comprising:

a magnetic detection element that senses a magnetic flux generated from a current path to perform electromagnetic conversion; and at least two magnetic shields that are arranged around the magnetic detection element and shield an external magnetic flux affecting the magnetic detection element, wherein:

the at least two magnetic shields include a first magnetic shield and a second magnetic shield facing each other across the magnetic detection element and the current path;

at least one of the first magnetic shield and the second magnetic shield includes at least two base portions and a coupling portion coupling the at least two base portions, and the at least one of the first magnetic shield and the second magnetic field has a recess recessed from a periphery in a surface facing the other of the first magnetic shield and the second magnetic shield;

the magnetic detection element includes two or more magnetic detection elements respectively facing two or more current paths included in the current path;

each of the first magnetic shield and the second magnetic shield includes a surface layer portion and a protrusion, the surface layer portion including the coupling portion and an end layer portion provided continuously with the coupling portion in each of the base portions, and the protrusion protruding from the end layer portion in each of the base portions;

the recess is formed between the protrusions of each of the first magnetic shield and the second magnetic field;

the protrusion of the first magnetic shield and the protrusion of the second magnetic shield face each other;

each of the magnetic detection elements is individually disposed in a facing region between the protrusion of the first magnetic shield and the protrusion of the second magnetic shield facing each other; and at least one of the first magnetic shield and the second magnetic shield has a shape adjusted such that a leakage magnetic field from the recess in the first magnetic shield and a leakage magnetic field from the recess in the second magnetic shield cancel out each other and the leakage magnetic fields do not reach the magnetic detection elements.

22. The current sensor according to claim 21, wherein in the at least one of the first magnetic shield and the second magnetic shield, a thickness of the surface layer portion with respect to a total thickness of the surface layer portion and the protrusion is adjusted as the shape.

23. The current sensor according to claim 21, wherein in the at least one of the first magnetic shield and the second magnetic shield, an interval between the protrusions adjacent to each other across the recess is adjusted as the shape.

24. The current sensor according to claim 21, wherein:

only a part of each facing section of the base portions adjacent to each other across the coupling portion is coupled via the coupling portion; and in the at least one of the first magnetic shield and the second magnetic shield, a length of the coupling portion in the facing section is adjusted as the shape.

25. The current sensor according to claim 21, comprising three magnetic detection elements included in the magnetic detection element and respectively facing three current paths included in the current path, wherein:

each of the first magnetic shield and the second magnetic shield includes three base portions included in the base portions and respectively facing the three magnetic detection elements; and at least one of the first magnetic shield and the second magnetic shield has a shape adjusted such that the leakage magnetic field from the recess in the first magnetic shield and the leakage magnetic field from the recess in the second magnetic shield cancel out each other and the leakage magnetic fields do not reach one of the magnetic detection elements between two of the three magnetic detection elements.

26. A current sensor for individually detecting a current flowing in each of at least three current paths, the current sensor comprising
a plurality of phases respectively corresponding to the at least three current paths, each of the phases including:
a magnetic detection element facing one of the current paths, sensing a magnetic field generated from the current path, and converting the magnetic field into an electric signal; and
a magnetic shield portion shielding an external magnetic field affecting the magnetic detection element and including a pair of first shield and a second shield facing each other across the current path and the magnetic detection element, wherein:
in each of the phases, the first shied, the current path, the magnetic detection element, and the second shield are stacked in this order in a stacking direction and the phases are arranged in an arrangement direction orthogonal to the stacking direction;
a phase at an end in the arrangement direction among the plurality of phases is defined as an end phase;
the first shield in the end phase is defined as a first end phase shield;
the second shield in the end phase is defined as a second end phase shield;
the magnetic detection element in the end phase is defined as an end phase detection element; and
at least one of the first end phase shield and the second end phase shield includes a magnetic field exchanger configured to perform magnetic field exchange between the first end phase shield and the second end phase shield such that a leakage magnetic field from an extreme end of one of the first end phase shield and the second end phase shield in the arrangement direction reaches the other of the first end phase shield and the second end phase shield more easily than the end phase detection element;
the first shield in a phase other than the end phase is defined as a first intervening shield;
the second shield in a phase other than the end phase is defined as a second intervening shield;
the magnetic detection element between the first intervening shield and the second intervening shield is defined as an intervening detection element; and
at least one of the first end phase shield and the second end phase shield includes as the magnetic field exchanger a section where a length from a portion facing the end phase detection element to the extreme end, in which the leakage magnetic field is generated, is larger than a length from a portion facing the intervening detection element to an end adjacent to the extreme end in the corresponding first intervening shield and second intervening shield in the arrangement direction.

27. The current sensor according to claim 26, wherein the first shield and the second shield are divided correspondingly to each of the plurality of phases.

28. A current sensor for individually detecting a current flowing in each of a plurality of current paths, the current sensor comprising
a plurality of phases respectively corresponding to the plurality of current paths, each of the phases including:
a magnetic detection element facing one of the current paths, sensing a magnetic field generated from the current path, and converting the magnetic field into an electric signal; and
a magnetic shield portion shielding an external magnetic field affecting the magnetic detection element and including a pair of first shield and a second shield facing each other across the current path and the magnetic detection element, wherein:
in each of the phases, the first shied, the current path, the magnetic detection element, and the second shield are stacked in this order in a stacking direction and the phases are arranged in an arrangement direction orthogonal to the stacking direction;
a phase at an end in the arrangement direction among the plurality of phases is defined as an end phase;
the first shield in the end phase is defined as a first end phase shield;
the second shield in the end phase is defined as a second end phase shield;
the magnetic detection element in the end phase is defined as an end phase detection element;
at least one of the first end phase shield and the second end phase shield includes a magnetic field exchanger configured to perform magnetic field exchange between the first end phase shield and the second end phase shield such that a leakage magnetic field from an extreme end of one of the first end phase shield and the second end phase shield in the arrangement direction reaches the other of the first end phase shield and the second end phase shield more easily than the end phase detection element; and
each of the first shield and the second shield is coupled to each other correspondingly to each of the plurality of phases by a thin portion having a thickness less than the first shield and the second shield in the stacking direction.

29. The current sensor according to claim 28 for individually detecting a current flowing in each of at least three current paths, wherein:
the first shield in a phase other than the end phase is defined as a first intervening shield;
the second shield in a phase other than the end phase is defined as a second intervening shield;
the magnetic detection element between the first intervening shield and the second intervening shield is defined as an intervening detection element; and
at least one of the first end phase shield and the second end phase shield includes as the magnetic field exchanger a section where a length from a portion facing the end phase detection element to the extreme end, in which the leakage magnetic field is generated, is larger than a length from a portion facing the intervening detection element to an end adjacent to the extreme end in the corresponding first intervening shield and second intervening shield in the arrangement direction.

30. The current sensor according to claim 28, wherein
the at least one of the first end phase shield and the second end phase shield includes as the magnetic field exchanger a section that is bent adjacent to the other of the corresponding first end phase shield and second end phase shield more than the portion facing the end phase detection element.

* * * * *